US006242951B1

(12) United States Patent
Nakata et al.

(10) Patent No.: US 6,242,951 B1
(45) Date of Patent: Jun. 5, 2001

(54) ADIABATIC CHARGING LOGIC CIRCUIT

(76) Inventors: Shunji Nakata; Takakuni Douseki; Mitsuru Harada; Ken Takeya, all c/o Nippon Telegraph and Telephone Corporation 20-2 Nishi-Shinjuku 3-chome, Shinjuku-ku, Tokyo, 163-1419 (JP)

( * ) Notice: Subject to any disclaimer, the term of this patent is extended or adjusted under 35 U.S.C. 154(b) by 0 days.

(21) Appl. No.: 09/146,079

(22) Filed: Sep. 2, 1998

(30) Foreign Application Priority Data

| Sep. 5, 1997 | (JP) | 9-256226 |
| Feb. 2, 1998 | (JP) | 10-033546 |
| Feb. 26, 1998 | (JP) | 10-060322 |
| Mar. 19, 1998 | (JP) | 10-089582 |
| Mar. 26, 1998 | (JP) | 10-096944 |
| Jun. 17, 1998 | (JP) | 10-169459 |

(51) Int. Cl.[7] ............................................. H03K 19/096
(52) U.S. Cl. ............................ 326/98; 326/55; 326/113
(58) Field of Search ........................... 326/51, 52, 54, 326/55, 113, 121, 112, 108, 98, 96

(56) References Cited

U.S. PATENT DOCUMENTS

| 5,493,240 | 2/1996 | Frank . | |
| 5,506,520 | * 4/1996 | Frank et al. | 326/96 |
| 5,521,538 | 5/1996 | Dickinson . | |
| 5,523,707 | * 6/1996 | Levy et al. | 326/55 |
| 5,602,497 | * 2/1997 | Thomas | 326/98 |
| 5,777,491 | * 7/1998 | Hwang et al. | 326/98 |
| 5,861,762 | * 1/1999 | Sutherland | 326/55 |
| 6,009,021 | * 12/1999 | Kioi | 326/121 |

FOREIGN PATENT DOCUMENTS 0685942   5/1995   (EP) .

OTHER PUBLICATIONS

"Low–Power Digital Systems Based on Adiabatic–Switching Principles" by W.C. Athas, et al., IEEE Transactions on Very Large Scale Integration (VLSI) Systems, vol. 2 No. 4 Dec. 1994, pp398–407.

"Energy–Recovery CMOS" by W.C. Athas, Low Power Design Methodologies, edited by J.M. Rabaey et al., Kluwer Academic Publishers, pp66–72, 1996.

"Overview of Low–Power ULSI Circuit Techniques" by T. Kuroda et al., IEICE Trans. Electron, vol. E78–C, No. 4 Apr. 1995, pp334–344.

"Adiabatic Dynamic Logic" by A.G. Dickinson et al., IEEE Journal of Solid State Circuits, vol. 30, No. 3, Mar. 1995, pp311–315.

"Adiabatic Computing with the 2N–2N2D Logic Family" by A. Kramer et al., 1994 Symposium on VLSI Circuits Digest of Technical Papers, 1994,pp25–26.

"An Efficient Charge Recovery Logic Circuit" by Y. Moon et al., IEEE Journal of Solid–State Circuits, vol. 31, No. 4, Apr. 1996, pp514–522.

"CMOS ULSI Design" supervised by S.Sugano, edited by T. Iizuka, publised by Baihuukan, 1996, pp87–88.

Integrated Power Clock Generators for Low Energy Logic; Maksimovic et al. 1995 IEEE, pp. 61–67, Jun. 12, 1995.

Adiabatic Computing With the 2N–2N2D Logic Family; Kramer et al. 1994 Symposium on VLSI Circuits Digest of Technical Papers, pp. 25–26, Jun. 9, 1994.

BDD–Based Spectral Approach for Reed–Muller Circuit Realisation; Thornton et al. IEEE pp. 145–150, Jan. 3, 1996.

Safe BDD Minimization Using Don't Cares: Hong et al. pp. 208–213, Jun. 9, 1997.

* cited by examiner

Primary Examiner—Michael Tokar
Assistant Examiner—Don Phu Le

(57) ABSTRACT

An adiabatic charging logic circuit includes a logic circuit and a power supply section. The logic circuit is constituted by a plurality of logic elements. The power supply section supplies power to the logic circuit to cause the logic circuit to perform logic processing after an input signal is supplied to the gate of each of the logic elements, and stops supply of the power before a new input signal is supplied to the gate of each of the logic elements after completion of the logic processing.

27 Claims, 71 Drawing Sheets

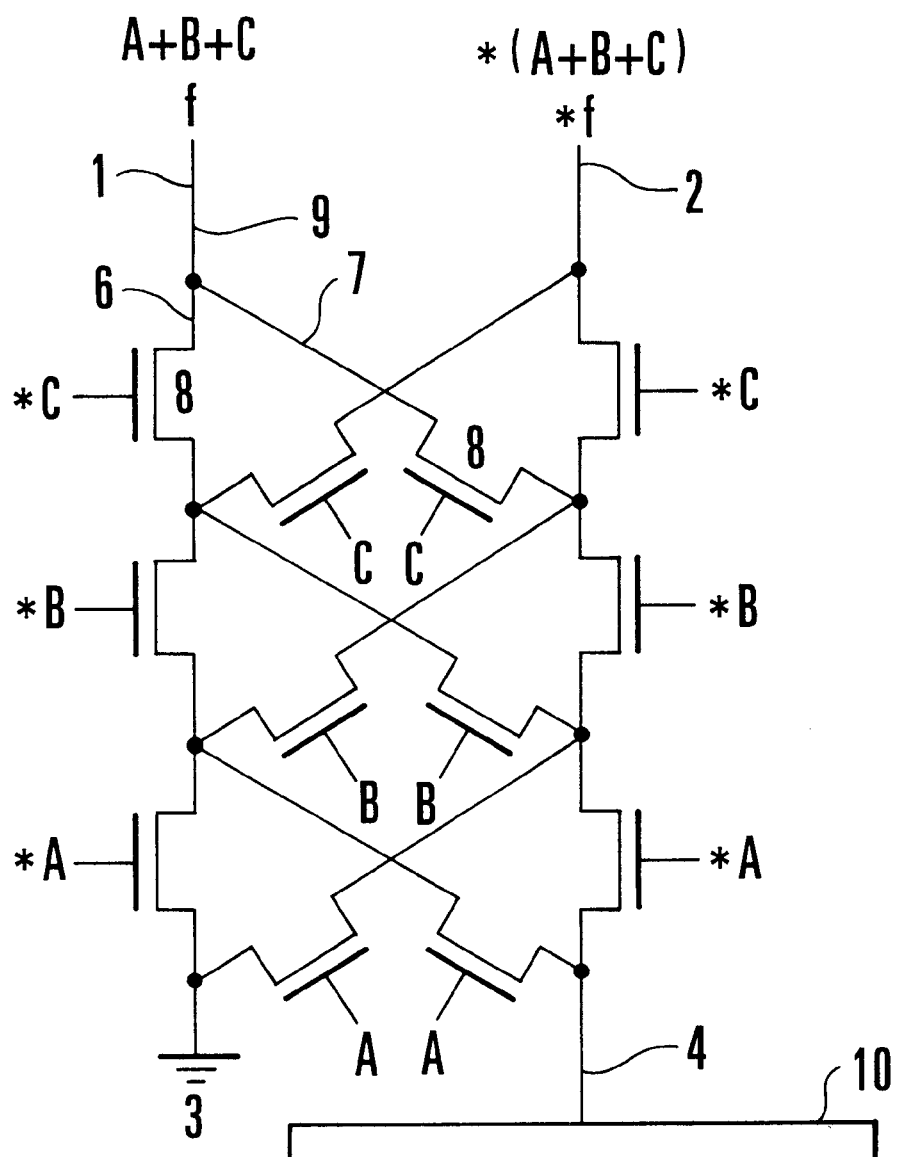
F I G. 1

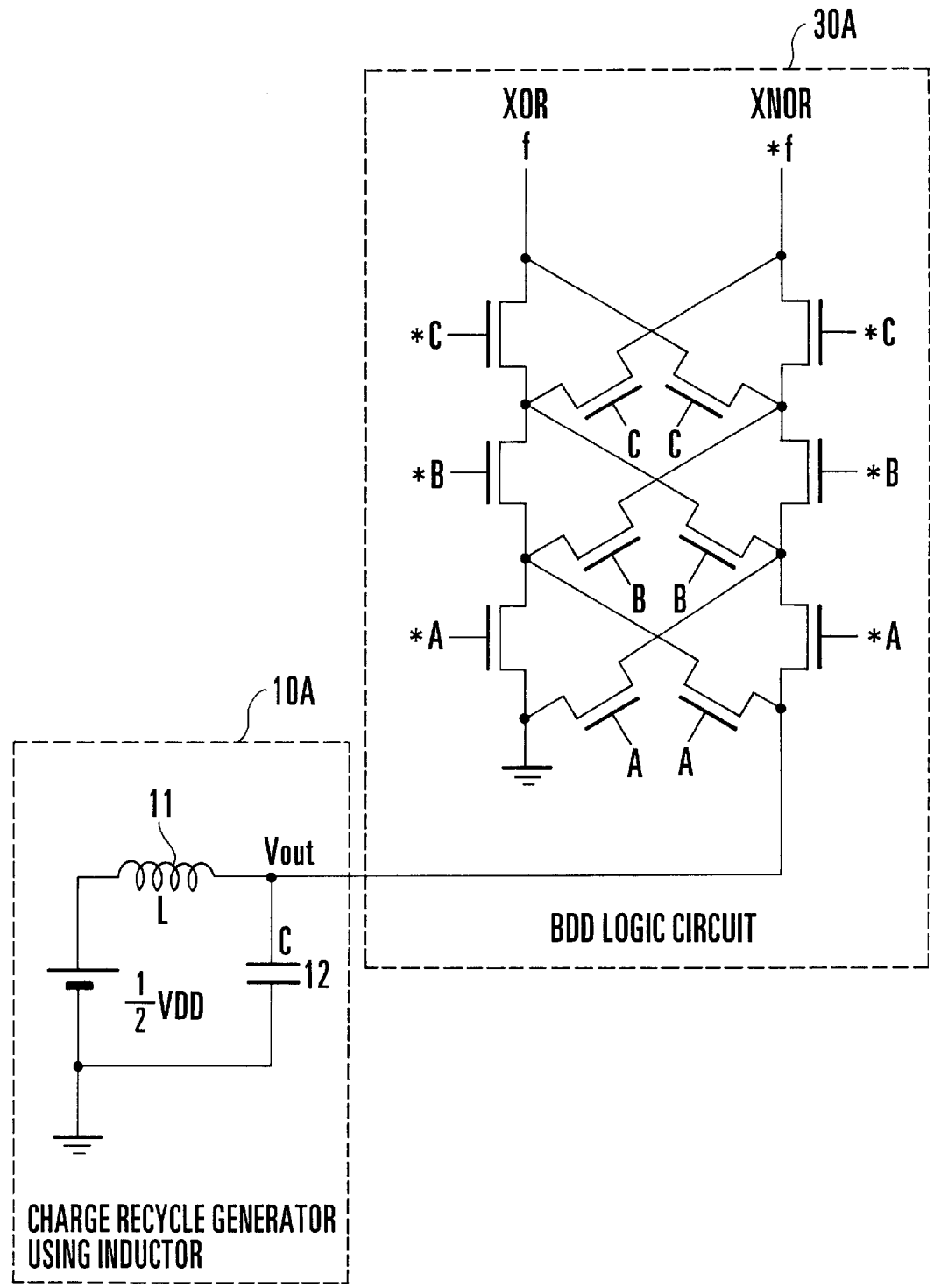
F I G. 2

FIG. 9A
Pre

FIG. 9B
Ai(t) ⟨ Ai(0) ⟩⟨ Ai(T) ⟩⟨ Ai(2T) ⟩

FIG. 9C
Vout

→ TIME

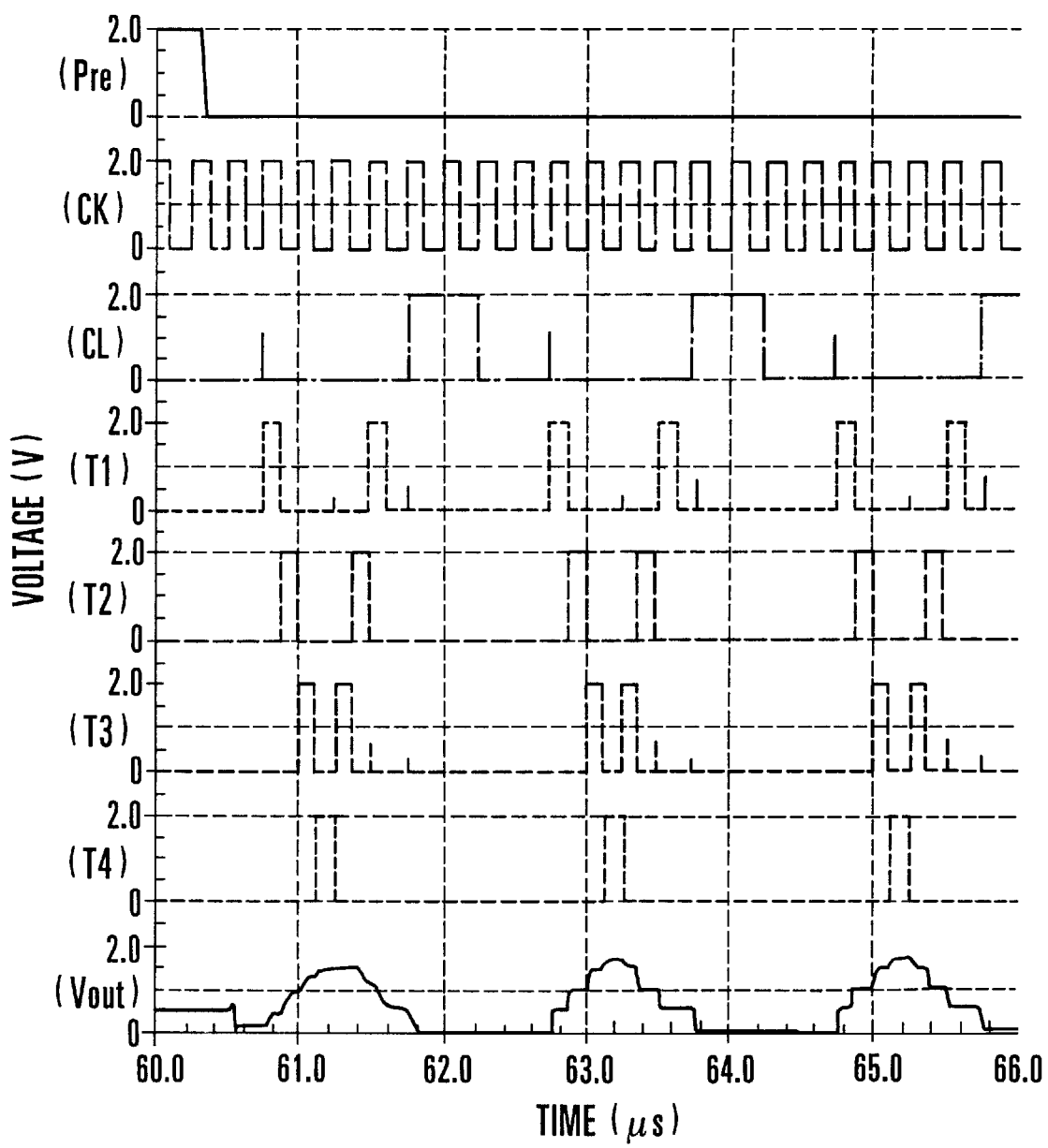
F I G. 11

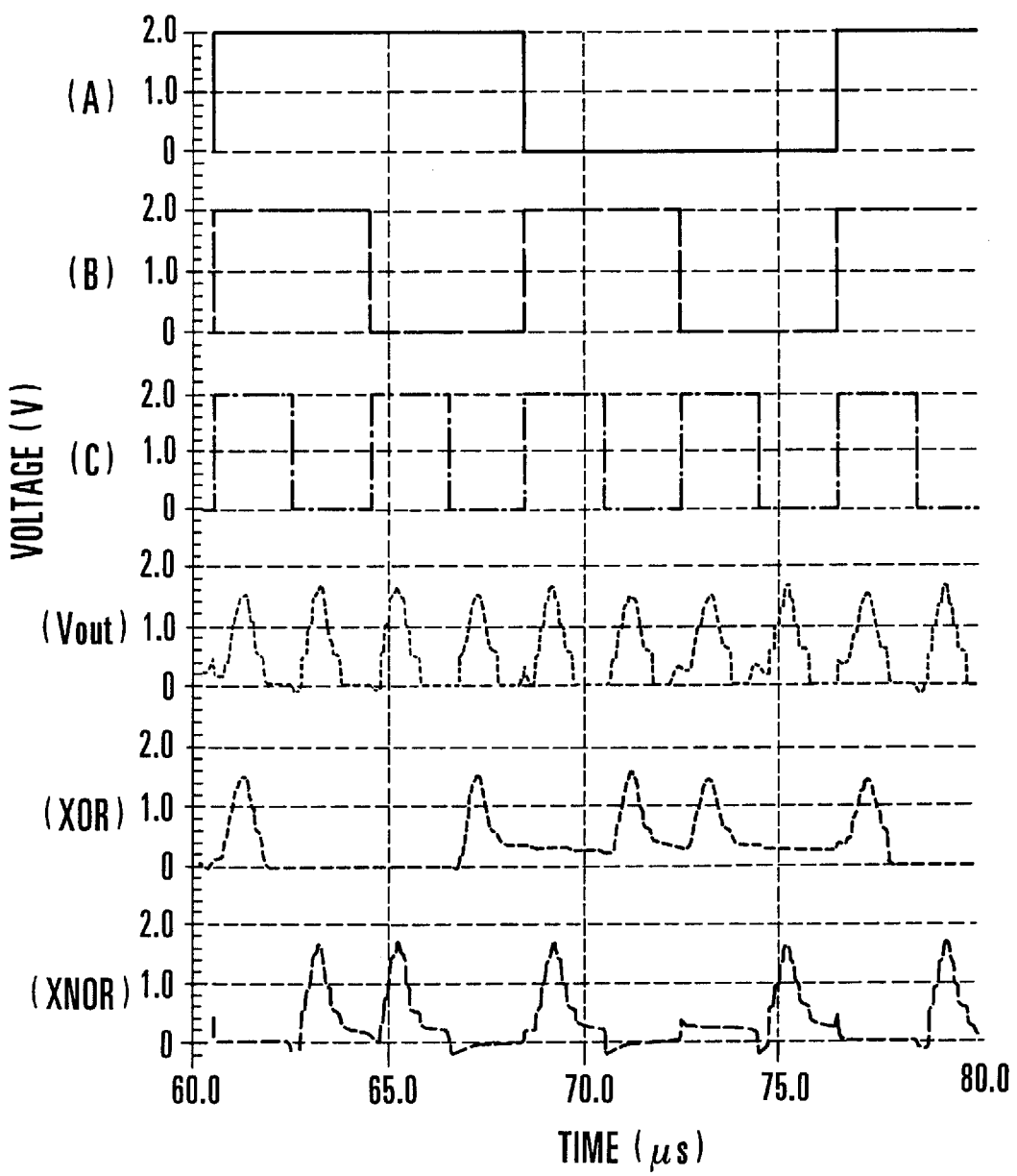
F I G. 12

AC POWER SUPPLY

AC POWER SUPPLY

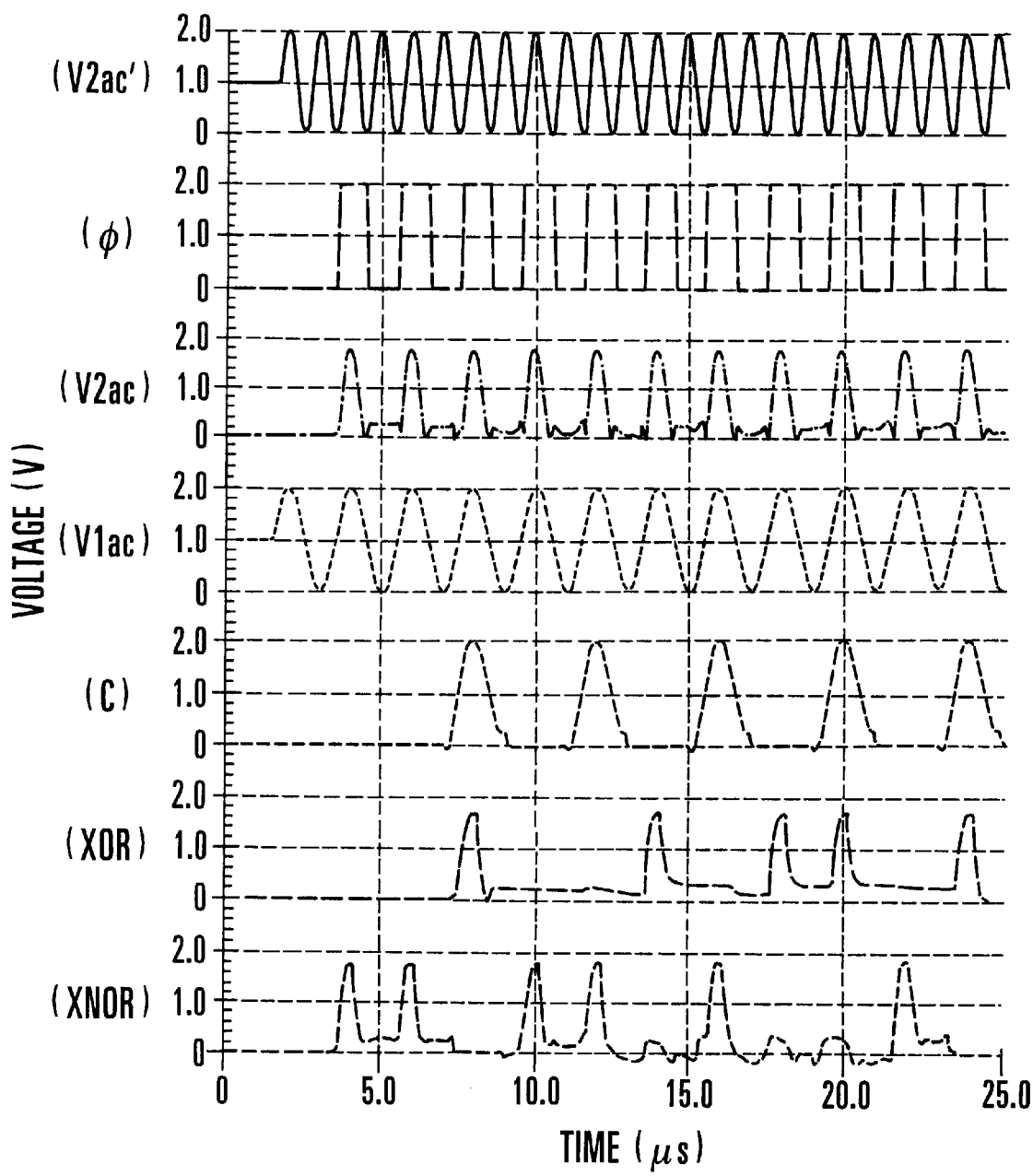
F I G. 19

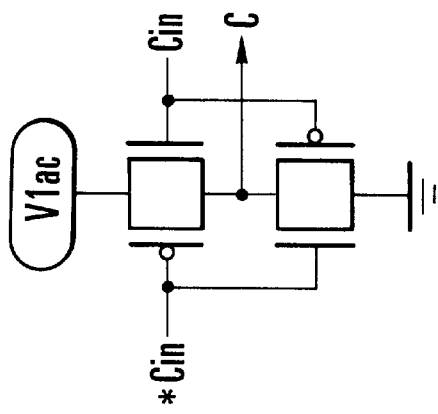
FIG. 20E
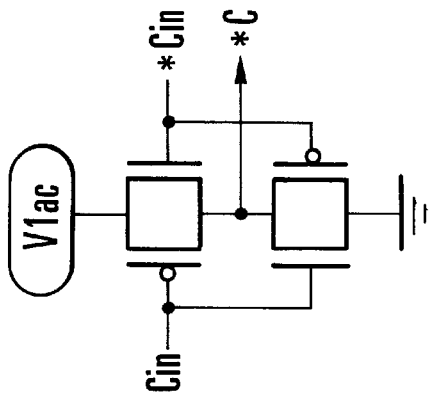
FIG. 20F
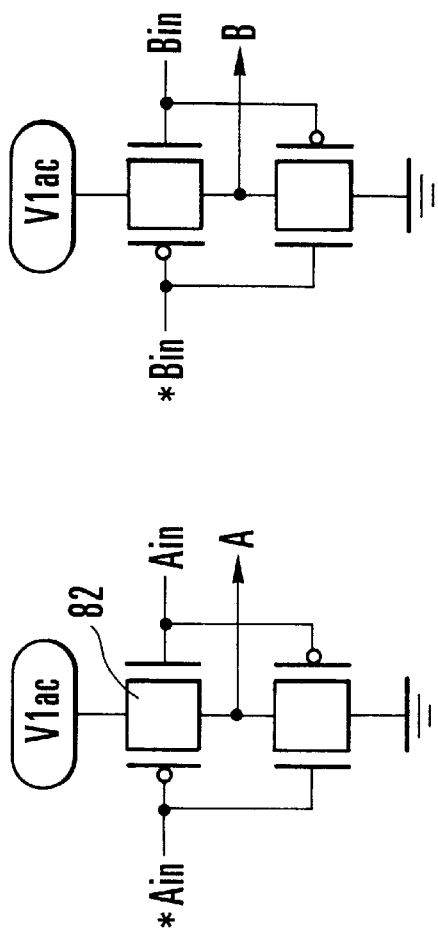
FIG. 20C
FIG. 20A
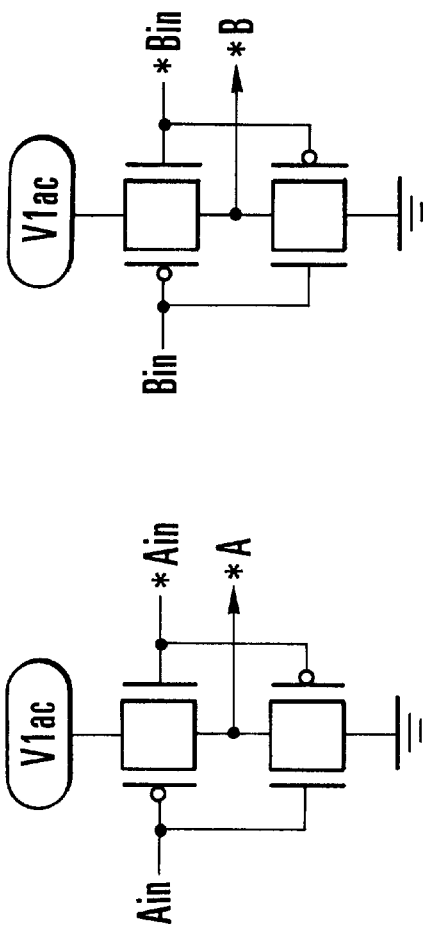
FIG. 20D
FIG. 20B FIG.21A BOTH V1ac AND V2ac ARE TRAPEZOIDAL WAVEFORMS
FIG.21B
FIG.21C V1ac IS TRAPEZOIDAL WAVEFORM; V2ac IS TRIANGULAR WAVEFORM
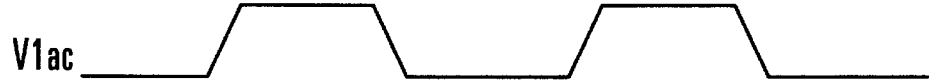
FIG.21D
FIG.21E BOTH V1ac AND V2ac ARE AC VOLTAGES BASED ON SINE WAVE
FIG.21F
FIG.21G BOTH V1ac AND V2ac ARE STAIRCASE WAVEFORMS FORMED BY POWER SUPPLY CIRCUIT 10B
FIG.21H

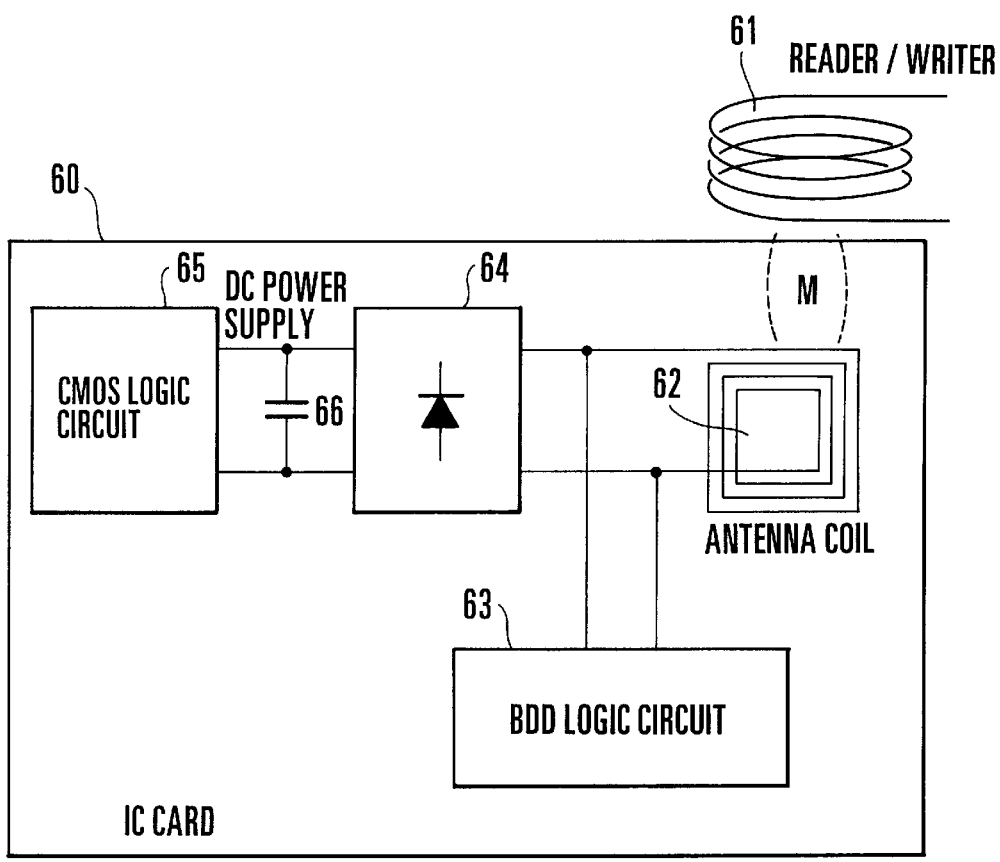
F I G. 24

STAIRCASE VOLTAGE 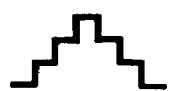
AC VOLTAGE 
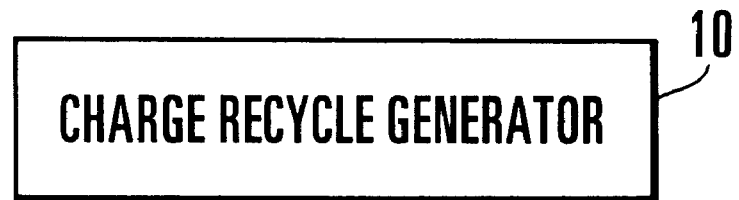
*(AB+BC+CA)     AB+BC+CA
F I G. 28

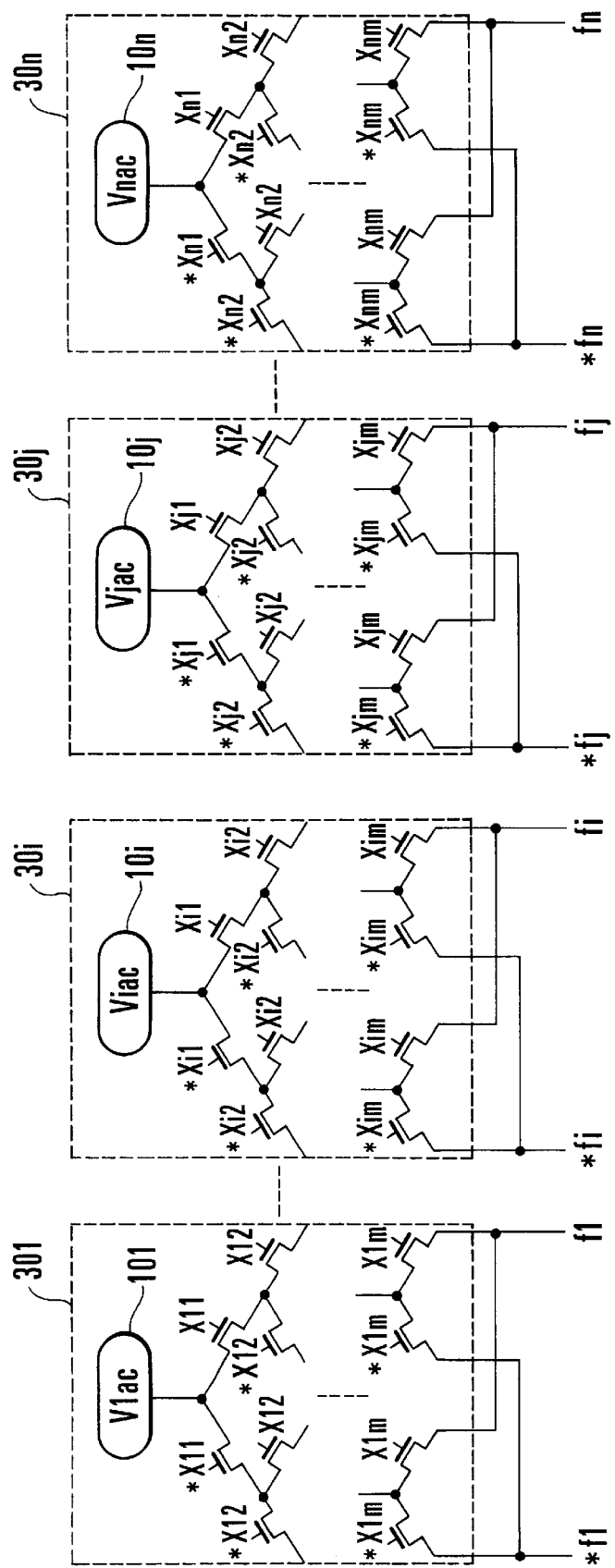
F I G. 33

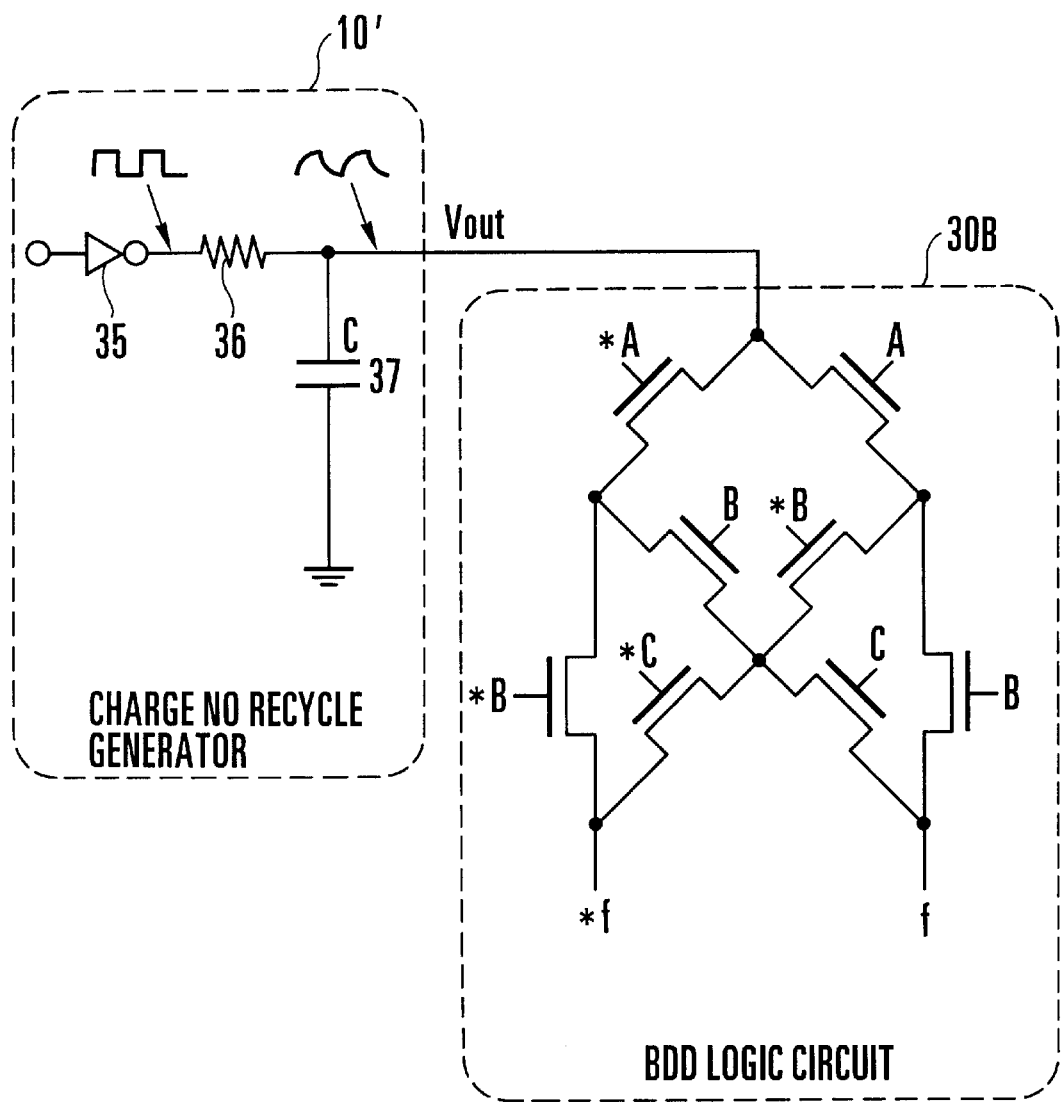
F I G. 43

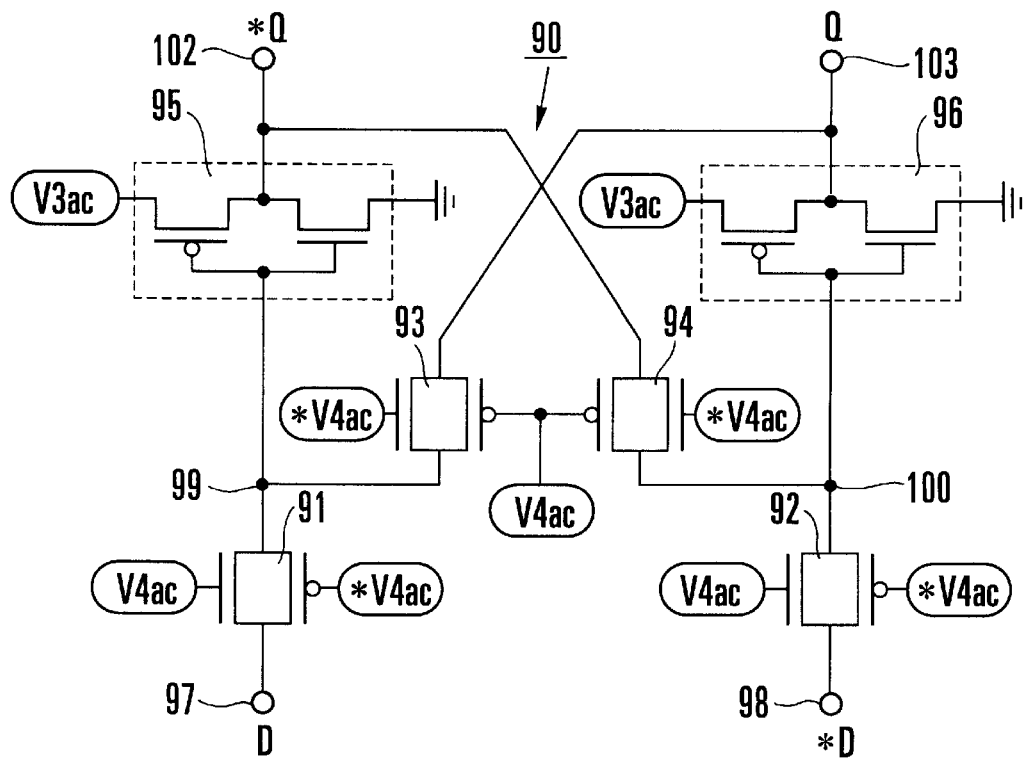
FIG. 44A
FIG. 44B
FIG. 44C

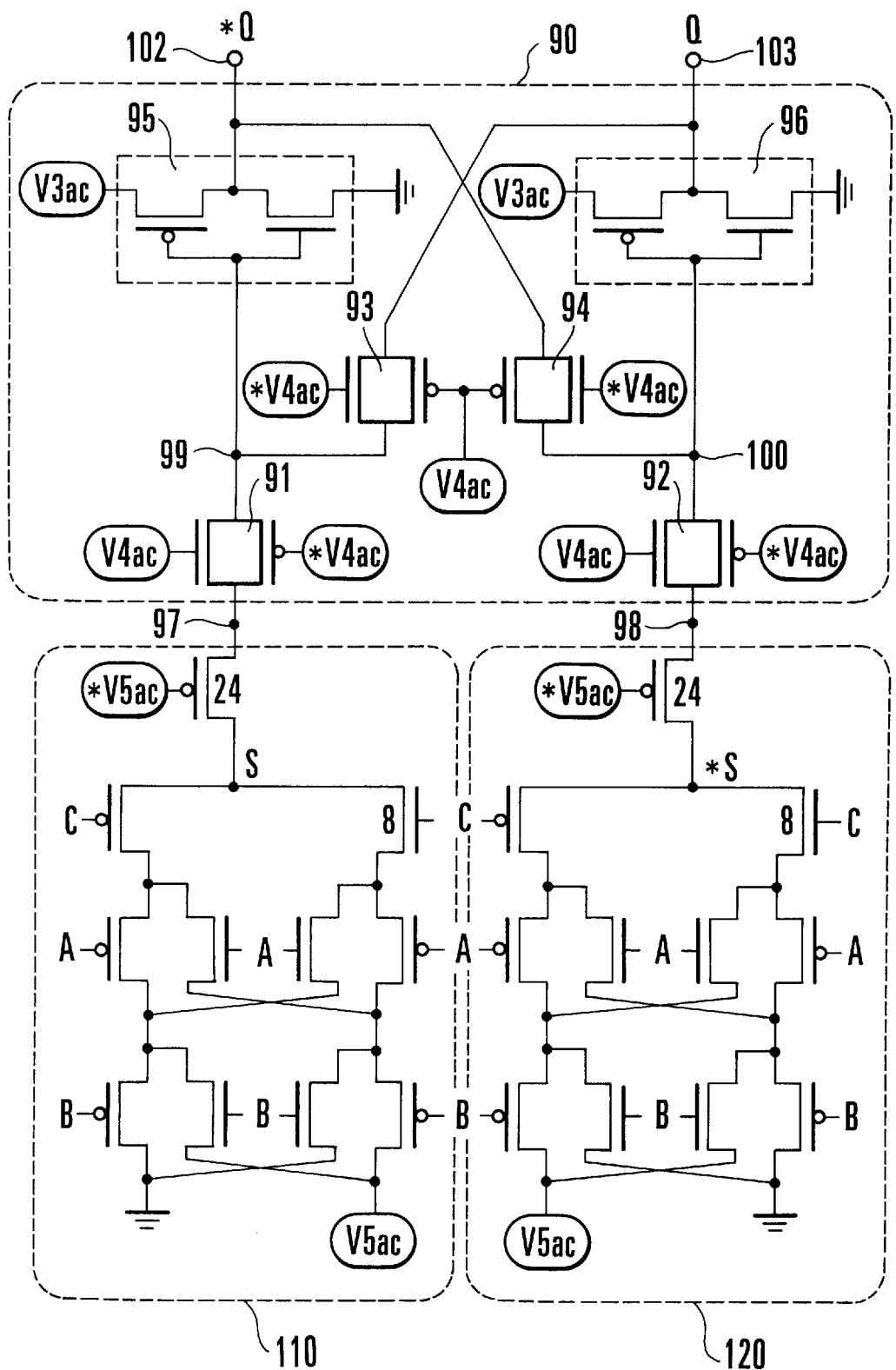
F I G. 46

FIG.48A V3ac
FIG.48B V5ac
FIG.48C V4ac
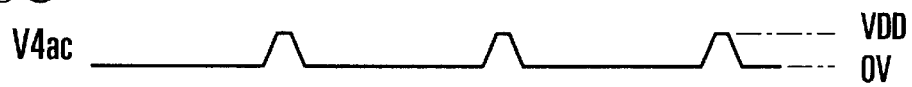
FIG.48D V3ac
FIG.48E A,B,C
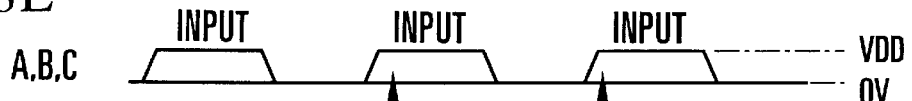
FIG.48F V5ac
FIG.48G V4ac
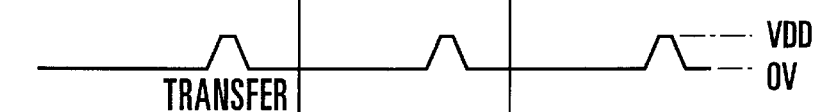
FIG.48H Q,*Q
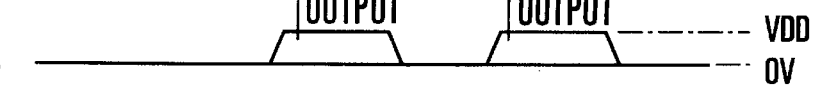

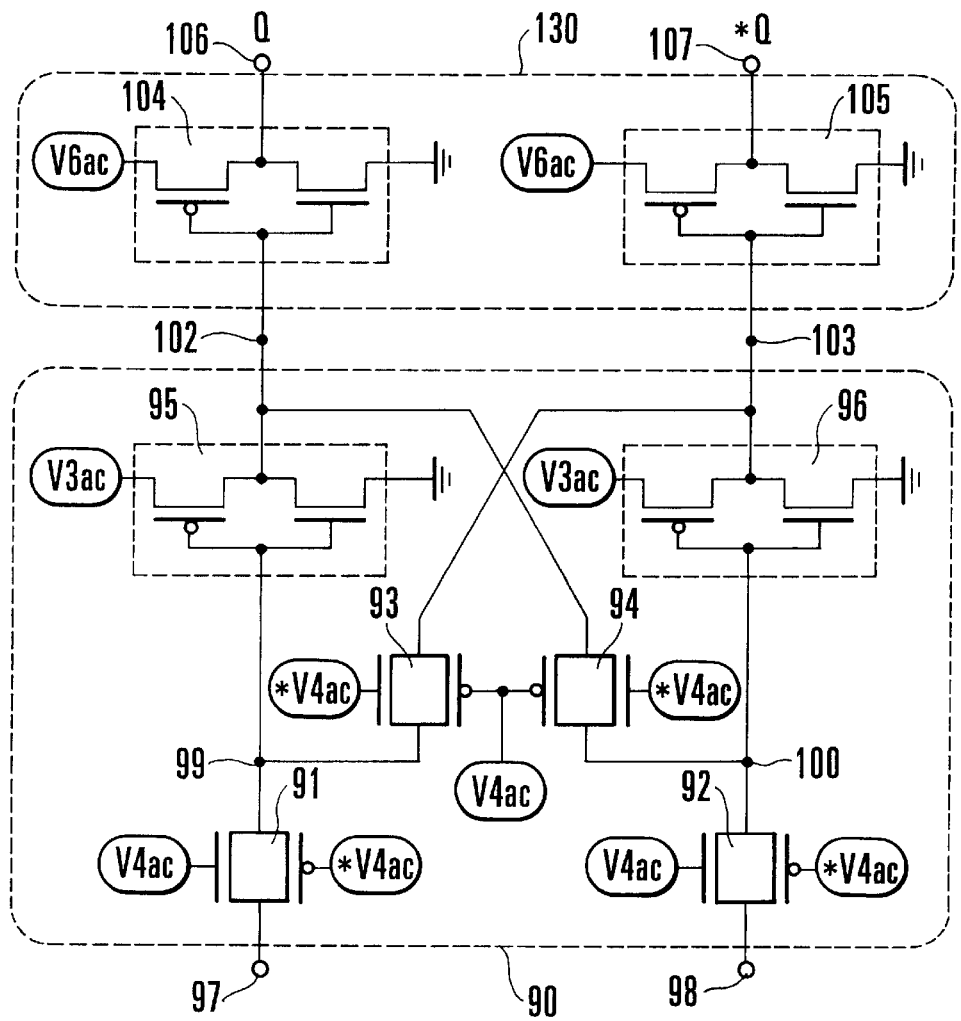
FIG. 49A
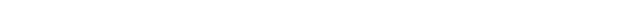
FIG. 49B V3ac      --- VDD / 0V
FIG. 49C V6ac      --- VDD / 0V
FIG. 49D V4ac      --- VDD / 0V

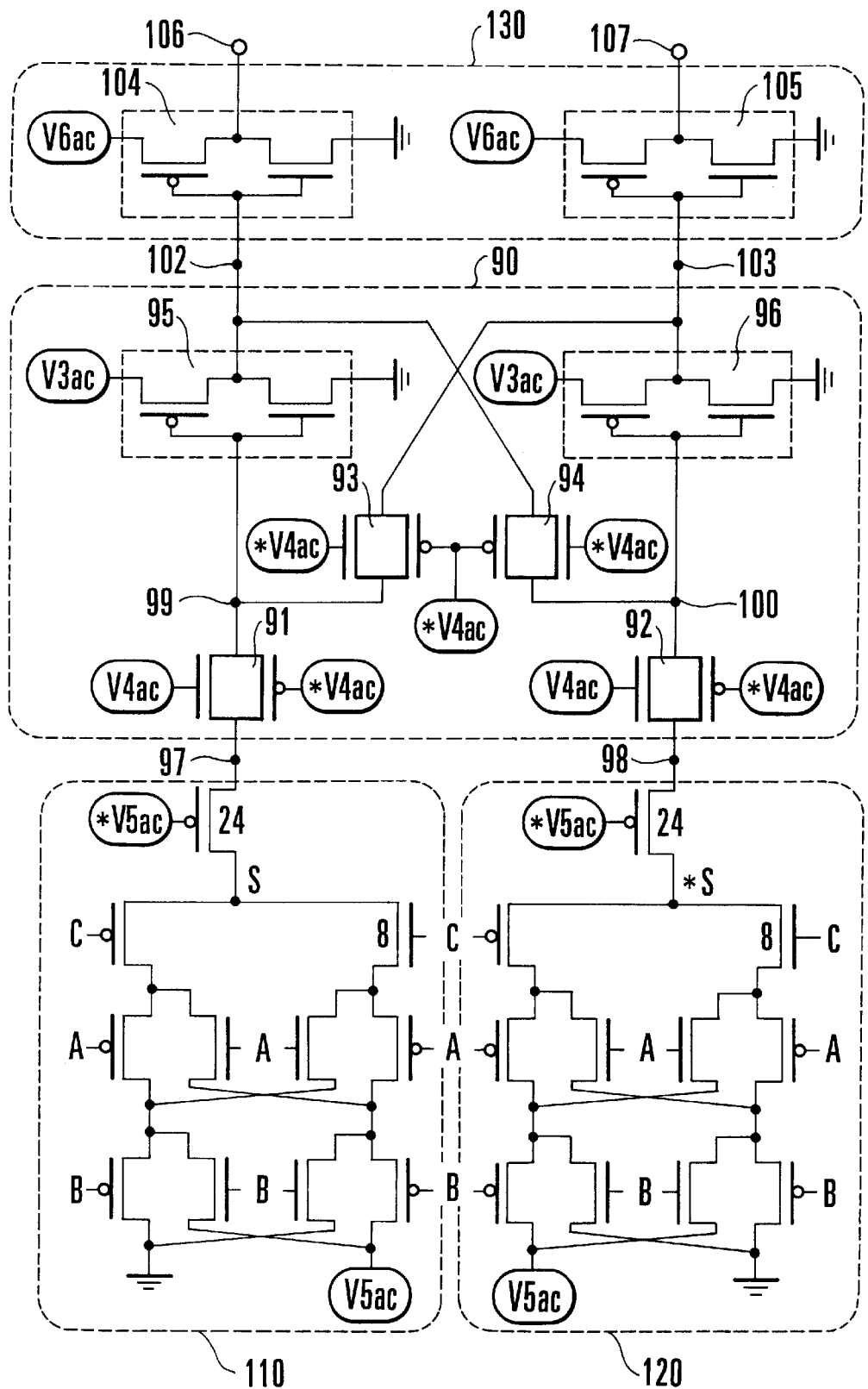
F I G. 50

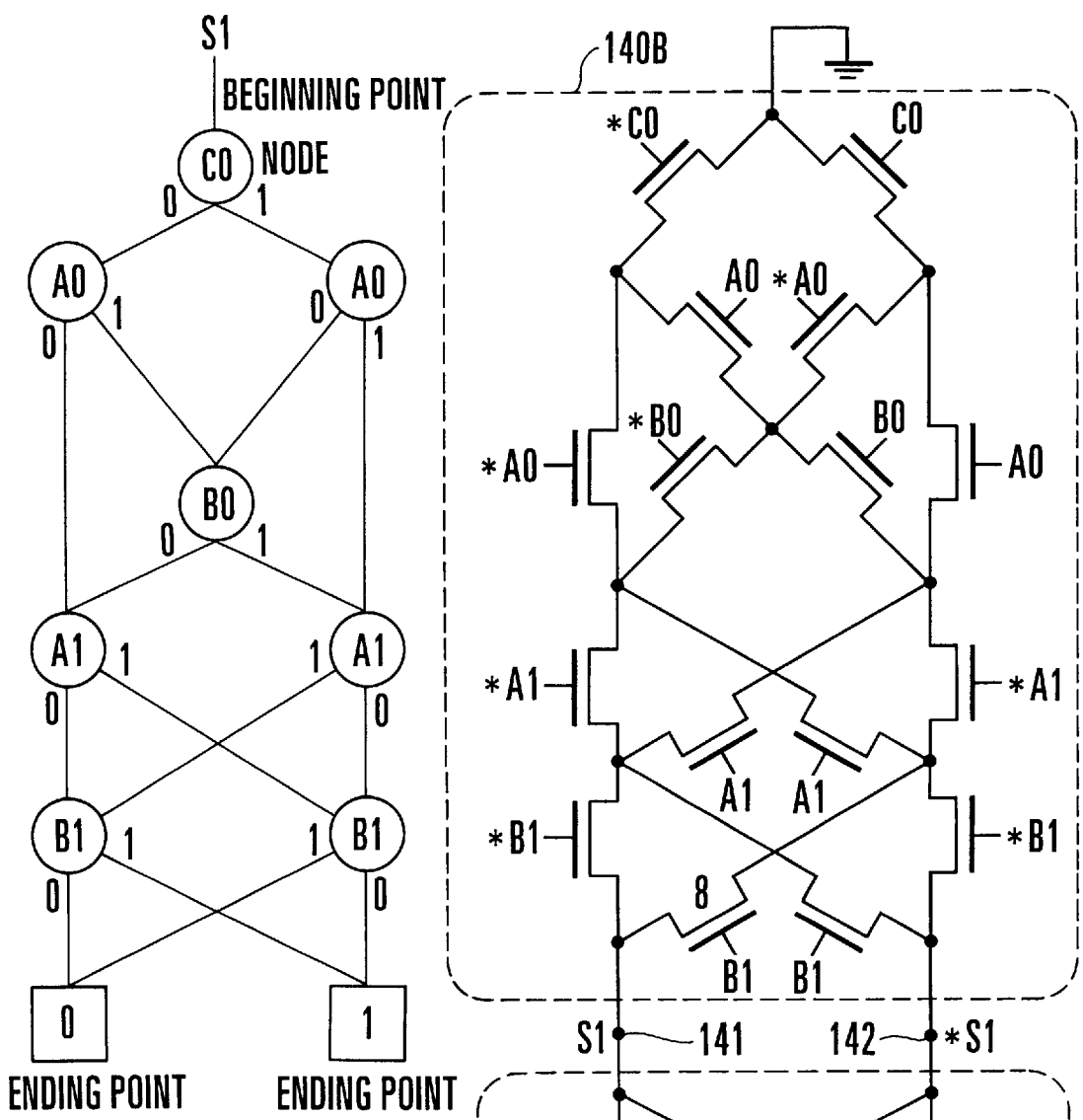
FIG. 53A
FIG. 53B
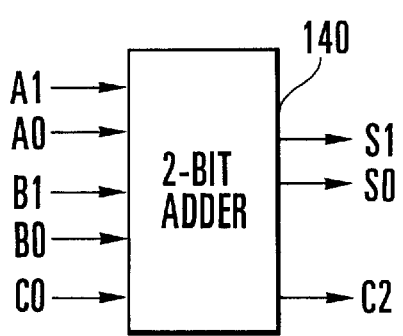
FIG. 53C

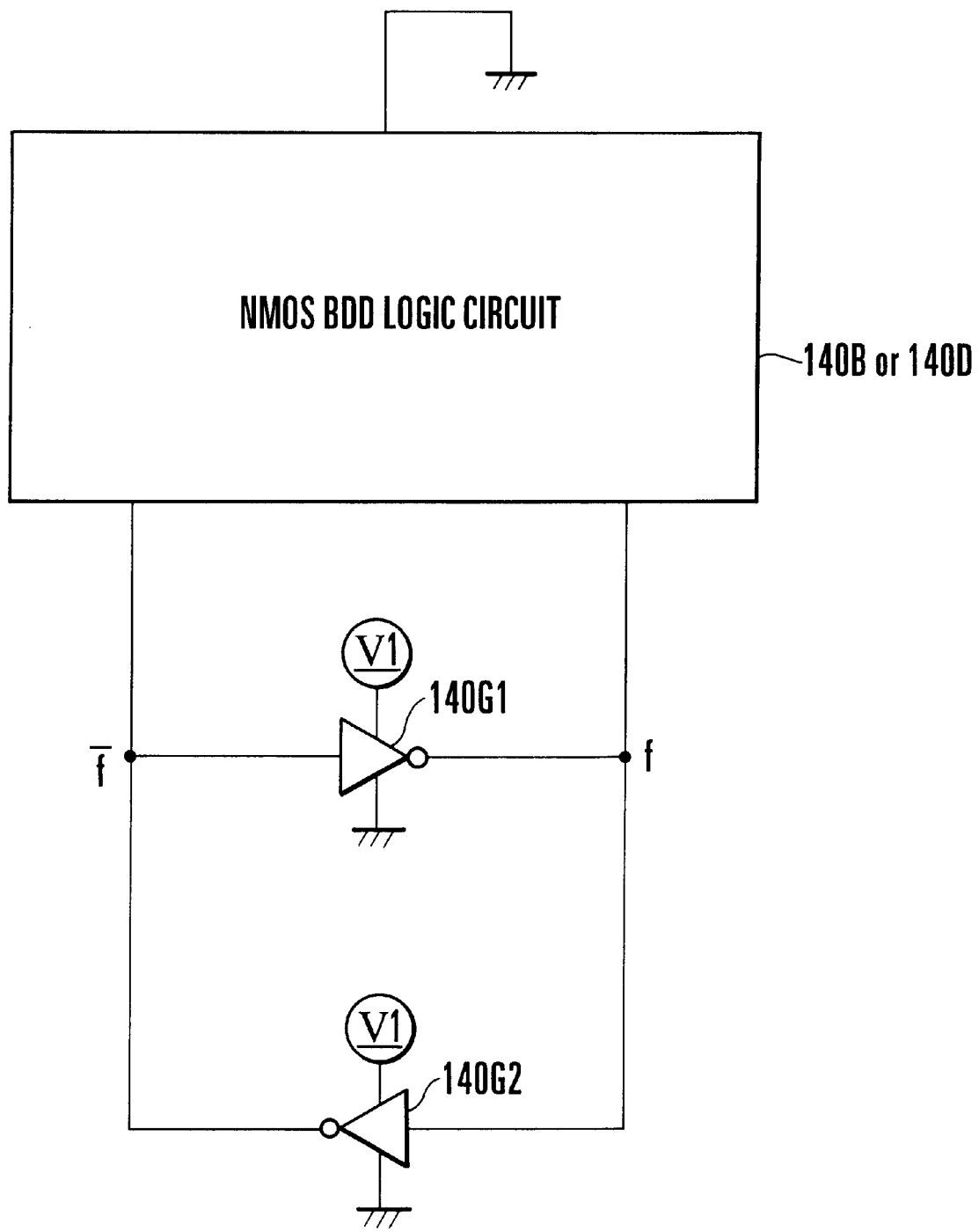
F I G. 55

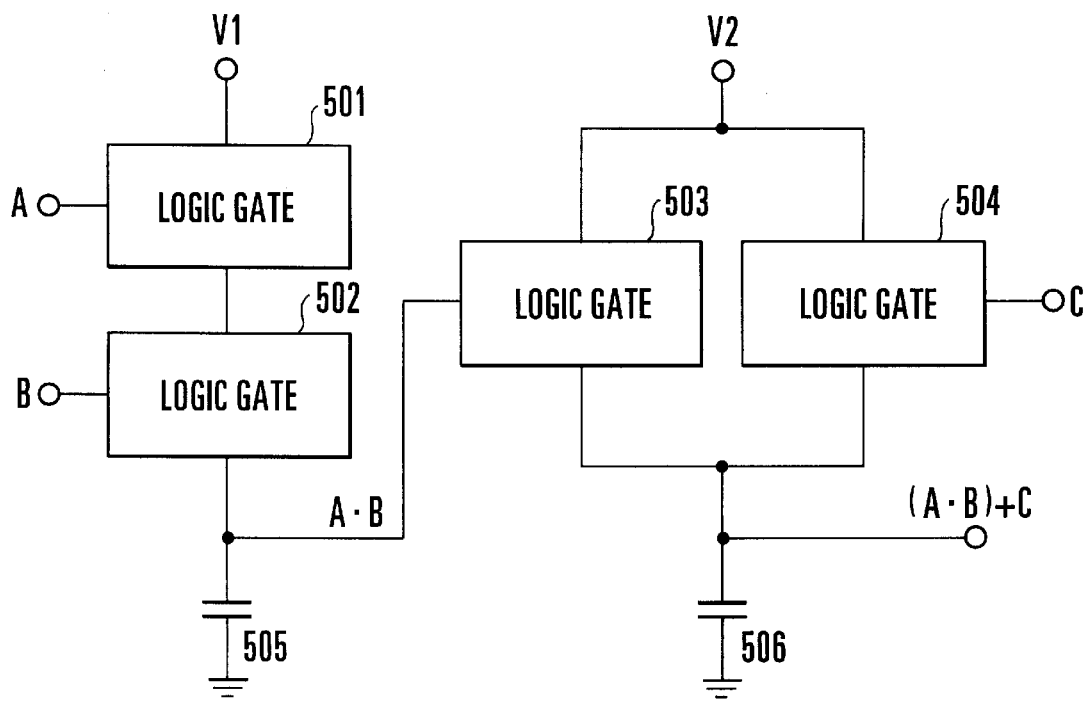
FIG.63A
FIG.63B
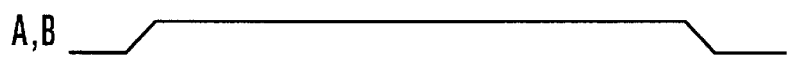
A,B
FIG.63C
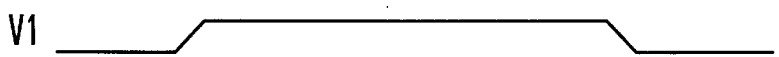
V1
FIG.63D
C
FIG.63E
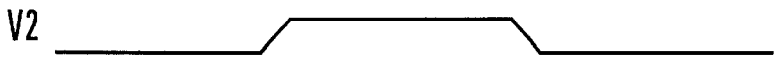
V2
FIG.63F
(A·B)+C

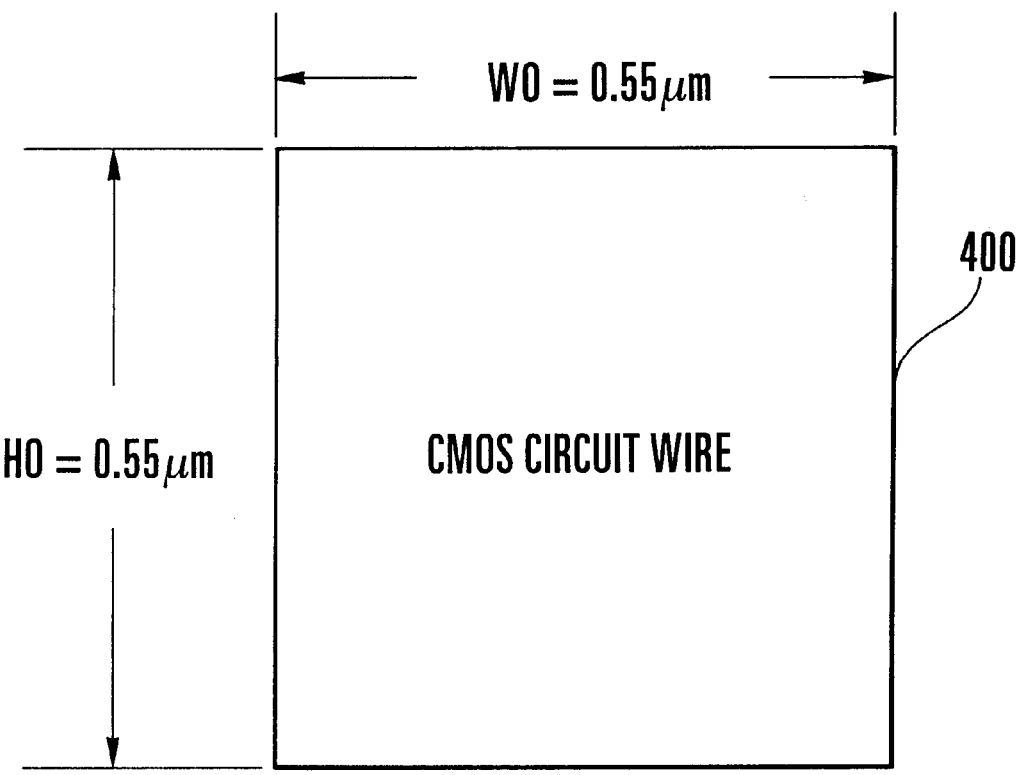
F I G. 67

ADIABATIC CHARGING LOGIC CIRCUIT

BACKGROUND OF THE INVENTION

The present invention relates to a logic circuit such as a BDD logic circuit or D latch logic circuit which greatly reduces the power consumption and the circuit size by performing adiabatic charging logic using a supply voltage whose waveform moderately rises and falls.

An adiabatic charging logic method has received attention as a method of performing logic processing with low power consumption. One of the characteristics of this adiabatic charging logic method is that the supply voltage moderately and periodically changes (moderately rises and falls).

Assume that the supply voltage rises from Low (low voltage level) to High (high voltage level) sufficiently slowly as compared with the RC time constant of an inverter serving as a logic circuit. In this case, it is known that the work done by the supply voltage is $\frac{1}{2} \cdot CV^2$, which coincides with the energy stored in a load capacitance. It is also known that when the supply voltage changes from High to Low, the energy stored in the load capacitance is not discharged to ground (GND) but returns to the power supply circuit (charger recycling), thereby ideally performing logic processing of "Low→High→Low" with almost no consumption of energy (reference 1: "Energy-Recovery CMOS" William C. Athas, LOW POWER DESIGN METHODOLOGIES, edited by J. M. Rabaey et al., KLUWER ACADEMIC PUBLISHERS, pp. 66–72, 1996).

As a power supply circuit for implementing this logic, an AC circuit using an inductor and a capacitor is available. The inductor and the capacitor constitute a resonance circuit to generate an AC voltage. By using this circuit as a charge recycle generator, adiabatic charging and charge recycling can be performed.

A circuit that uses N-1 capacitors to generate an N-step staircase voltage (a voltage that changes/rises in N steps and changes/falls in N steps) is also known (reference 1). With this circuit as well, adiabatic charging and charge recycling can be performed.

When, however, adiabatic charging or charge recycling is to be performed in a general CMOS circuit by using a charge recycle generator, even if the rise/fall timing of an output voltage from the charge recycle generator is properly adjusted for one logic gate, the rise/fall timing must be adjusted again for the logic gate on the next stage.

A transmission gate type retractile logic circuit, which differs from the above CMOS circuit but is known as a circuit capable of easily realizing adiabatic charging and charge recycling, will be described below as an example of how the timing is difficult to adjust.

FIG. 63A shows this retractile logic circuit. Reference numerals 501 to 504 denote logic gates; and 505 and 506, capacitors. This circuit receives input signals A and B, performs AND logic (=A·B) processing for the input signals, and obtains the OR logic (=A·B+C) of the AND logic processing result and an input signal C. As a logic gate of this retractile logic circuit, a two-wire logic element using transmission gates 507 has been proposed, as shown in FIGS. 64B and 64C. This element receives complementary input signals A and *A and complementary input signals B and *B and outputs output signals A·B and *(A·B). Note that the symbol "*" indicates that the corresponding signal is an inverted signal.

In this retractile logic circuit, the waveforms of supply voltage V1 and V2 are controlled in accordance with the number of gates, as shown in the timing charts of FIGS. 63B to 63F. More specifically, control must be performed to cause the supply voltage V1 to moderately (with a constant slope) rise later and fall earlier than the input signals A and B. The same applies to the relationship between the input signal C and the supply voltage V2.

FIGS. 65A and 65B show a conventional BDD logic circuit. As shown in FIG. 65A, the BDD graph (Binary Decision Diagram) used for this logic circuit is a graph having beginning points 1 and 2 and ending points 3 and 4. Input variables (A, B, and C in FIG. 65A) correspond to nodes 5. When the value of a logic output is to be obtained from supplied input variable values, the input enters from the beginning point 1 or 2 of the graph, goes down along the respective nodes 5, and reaches one of the two ending points 3 and 4. At each node 5, the input goes along one of two branches 6 and 7 in accordance with the input variable value. If, for example, the input variable C is "0", the input goes along 0 branch 6. If C="1", the input goes along 1 branch 7. That is, when an input is supplied, one path from a beginning point to an ending point is designated. If the ending point of the path is "0", the logic output becomes "0". If the ending point is "1", the logic output becomes "1".

In the BDD logic circuit, as shown in FIG. 65B, logic elements that satisfy the above conditions, e.g., N-channel MOSFETs 8 and wires 9, are made to correspond to the respective branches of the BDD on the basis of the BDD graph shown in FIG. 65A. In addition, logic outputs are made to correspond to the beginning points 1 and 2 of the BDD graph. Furthermore, ground (GND) is connected to the ending point 3 of "0" of the BDD graph, and a constant supply voltage VDD is connected to the ending point 4 of "1" of the BDD graph (reference 2: Kuroda and Sakurai, "Overview of Low-Power ULSI Circuit Techniques" IEICE TRANS. ELECTRON., Vol. E78-C, NO. 4 April 1995, pp. 334–344).

FIG. 66 shows the arrangement of a conventional D latch logic circuit. This logic circuit is made up of two transmission gates 601 and 602 constituting a data receiving circuit, and transmission gates 603 and 604 and inverters 605 and 606 which are cross-connected to constitute a storage circuit. A clock signal CK and an inverted signal *CK thereof are input to the transmission gates 601 to 604, and constant supply voltages VDD are applied to the inverters 605 and 606.

In this D latch logic circuit, when the clock signal CK is at High, the signals input to nodes 607 and 608 respectively reach nodes 609 and 610 through the transmission gates 601 and 602 and inverted by the inverters 605 and 606. The resultant signals are then output to nodes 611 and 612. When the clock signal CK changes to Low, the nodes 610 and 611 are connected to each other, and the nodes 609 and 612 are connected to each other. As a result, the output signals from the inverters 605 and 606 are supplied to the input sides of the inverters 605 and 606 on the opposite sides. The output signals are held until the clock signal CK is set at High again (storage mode).

A wire 400 in FIG. 67, which is used in a conventional CMOS logic circuit such as a combinational logic circuit or a D latch logic circuit, has a large cross-sectional area to drive the gate on the next stage at a high speed on the order of PS. As shown in FIG. 67, this wire cross-sectional area is 550 nm (0.55 $\mu$m: signal wire width $W_0$)×550 nm (0.55 $\mu$m: signal wire thickness $H_0$) in the 0.25 $\mu$m process of Nippon Telegraph and Telephone Corporation (NTT). In this case, the CR time constant is about 0.5 ns.

In the above retractile logic circuit, as the number of gates increase to several hundreds and several thousands, several hundred and several thousand supply voltage waveforms must be controlled. If, therefore, adiabatic charging and charge recycling are performed by using a charge recycle generator, the power consumption increases contrarily.

In the D latch logic circuit, at a transmission gate portion, charging/discharging must be performed with respect to the gate of a MOSFET as an element of the transmission gate or a clock signal line. In this charging/discharging operation, the energy corresponding to $C_{TG}VDD^2$ (where VDD is the supply voltage and $C_{TG}$ is the sum of the gate capacitance of the transmission gate and the capacitance of the clock signal line) is consumed. In the storage circuit as well, the energy corresponding to $C_{ME}VDD^2$ (where $C_{ME}$ is the capacitance of the storage circuit) is consumed.

In the conventional CMOS logic circuit, since the wire cross-sectional area is set to be large, it is difficult to reduce the circuit size. In addition, the self-capacitance of each wire and the mutual capacitance between the wires cannot be reduced.

SUMMARY OF THE INVENTION

The present invention has been made in consideration of the above situation, and has an object to provide a logic circuit which can efficiently implement adiabatic charging logic, and can decrease the cross-sectional area of each wire, thereby realizing reductions in power consumption of the circuit and circuit size.

In order to achieve the above object, according to the present invention, there is provided an adiabatic charging logic circuit comprising a logic circuit constituted by a plurality of logic elements, and a power supply section for supplying power to the logic circuit to cause the logic circuit to perform logic processing after an input signal is supplied to a gate of each of the logic elements, and stopping supply of the power before a new input signal is supplied to the gate of each of the logic elements after completion of the logic processing.

BRIEF DESCRIPTION OF THE DRAWINGS

FIG. 1 is a circuit diagram showing a BDD logic circuit according to the first embodiment;

FIG. 2 is a circuit diagram showing a case wherein an AC power supply circuit is used as a charge recycle generator for the BDD logic circuit in FIG. 1;

FIGS. 4A to 4F are charts showing different voltage waveforms each used as the waveform of a voltage from the charge recycle generator and the like;

FIGS. 9A to 9H are timing charts showing the operation of the power supply circuit in FIG. 8;

FIG. 11 is a timing chart showing the simulation result obtained by using the power supply circuit in FIG. 8;

FIG. 12 is a timing chart showing the simulation result obtained by using the BDD logic circuit in FIG. 8;

FIG. 19 is a timing chart showing the simulation result obtained by using the BDD logic circuit in FIGS. 18A to 18D;

FIGS. 20A to 20G are circuit diagrams showing a BDD logic circuit according to the seventh embodiment;

FIGS. 21A to 21H are timing charts for explaining other waveforms generated by an AC power supply;

FIG. 24 is a view for explaining an IC card according to the ninth embodiment;

FIG. 28 is a circuit diagram showing a BDD logic circuit according to the 12th embodiment;

FIG. 33 is a circuit diagram showing a case wherein charge recycle generators are respectively used as power supply circuits for a plurality of BDD logic circuits;

FIGS. 41A to 41G are circuit diagrams showing a BDD logic circuit according to the 18th embodiment;

FIG. 43 is a circuit diagram showing a charge no recycle generator for the BDD logic circuit in FIGS. 42A and 42B;

FIGS. 44A to 44C are views for explaining a D latch logic circuit according to the 20th embodiment and the waveforms of supply voltages;

FIG. 46 is a circuit diagram showing a D latch logic circuit according to the 21st embodiment;

FIGS. 48A to 48H are timing charts showing voltage waveforms in the circuit in FIG. 46;

FIGS. 49A to 49D are views for explaining a D latch logic circuit according to the 22nd embodiment and supply voltage waveforms;

FIG. 50 is a circuit diagram showing a D latch logic circuit according to the 23rd embodiment;

FIGS. 53A to 53C are circuit diagrams showing a PMOS latch logic circuit according to the 25th embodiment;

FIG. 55 is a block diagram showing a logic circuit according to the 27th embodiment;

FIGS. 63A to 63F are views for explaining a conventional retractile logic circuit and waveforms in operation;

FIG. 67 is a view showing the cross-sectional area of a wire in a conventional CMOS logic circuit.

DESCRIPTION OF THE PREFERRED EMBODIMENTS

The present invention will be described below with reference to the accompanying drawings.

[First Embodiment]

Figure 65A:
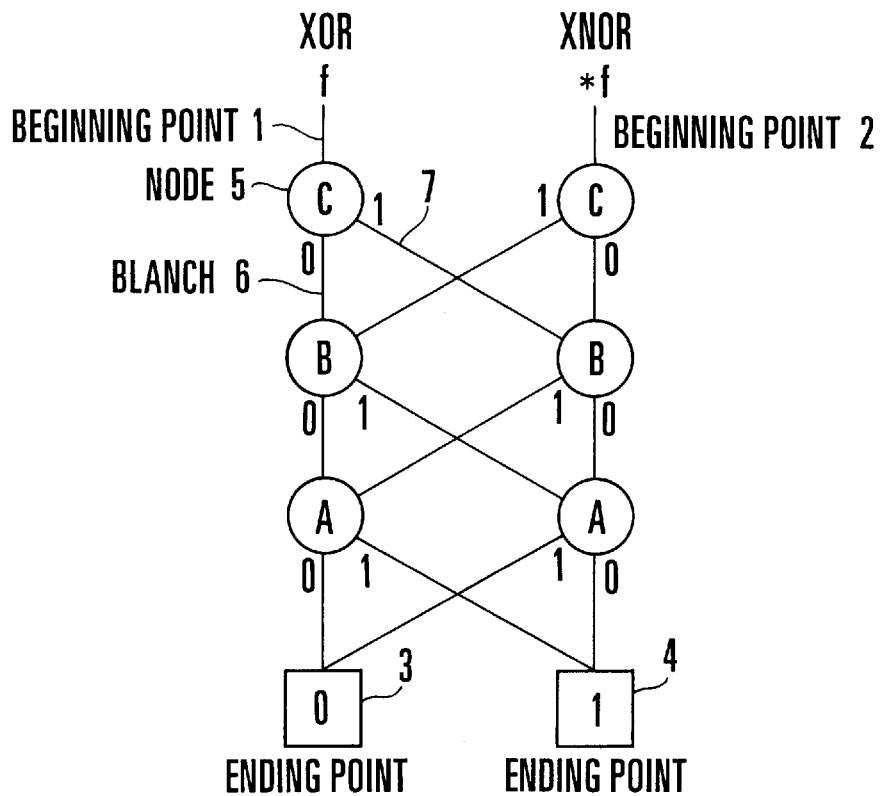
FIGS. 65A and 65B are circuit diagrams showing a conventional BDD logic circuit.
Figure 65B:
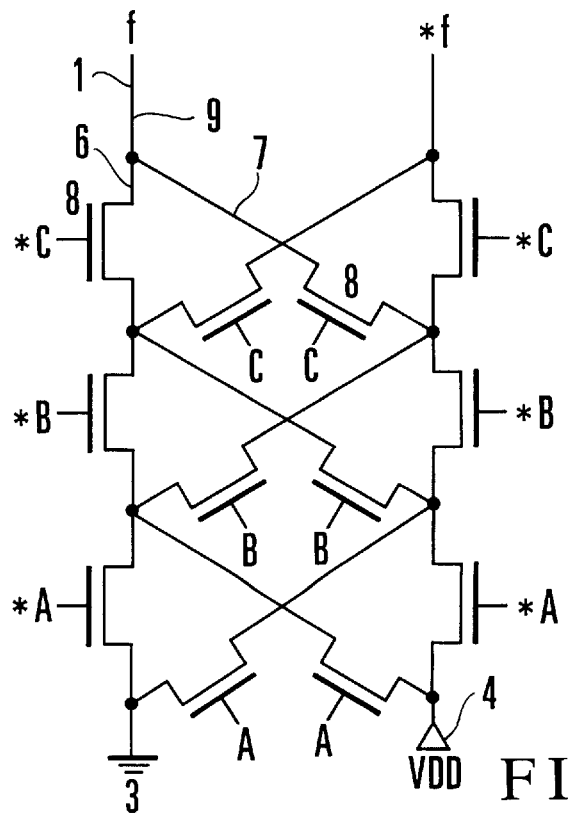

In the first embodiment, after the logic based on several hundred or several thousand gates is implemented by performing adiabatic charging once using a power recycle generator in place of the constant supply voltage for the BDD logic circuit in FIG. 65B described above, which is a circuit based on a BDD graph, the charge stored in a BDD logic circuit is returned to a power supply circuit.

The above BDD graph will be described again with reference to FIG. 65A. The BDD graph is a graph having the beginning points 1 and 2 and the ending points 3 and 4. Input variables (A, B, and C in FIG. 65A) correspond to the respective nodes 5. When a logic output value is to be obtained from input variable values, each input variable comes into the beginning point 1 or 2, goes down through the respective nodes 5, and reaches the ending point 3 or 4. At each node 5, each input variable follows one of the two branches 6 and 7 in accordance with the input variable value. If, for example, the input variable C="0", the variable follows 0 branch 6. If C="1", the variable follows 1 branch 7. That is, once an input is supplied, one path from the beginning point to the ending point is designated. If "0" is set at the ending point of the path, the logic output is "0". If "1" is set at the ending point, the logic output is "1".

In the BDD logic circuit according to the first embodiment of the present invention in FIG. 1, a logic element that satisfies the above condition, e.g., an n-channel MOSFET 8, and a wire 9 are caused to correspond to each branch of the BDD graph. Logic outputs are made to correspond to beginning points 1 and 2 of the BDD graph. In addition, ground (GND) is connected to a beginning point 3 of "0" of the BDD graph, and a charge recycle generator 10 is connected to a beginning point 4 of "1" of the BDD graph. As this charge recycle generator 10, as will be described later, for example, an AC power supply circuit using an inductor and a capacitor or a power supply circuit using N-1 capacitors and serving to generate an N-step staircase voltage is used.

Figure 62:
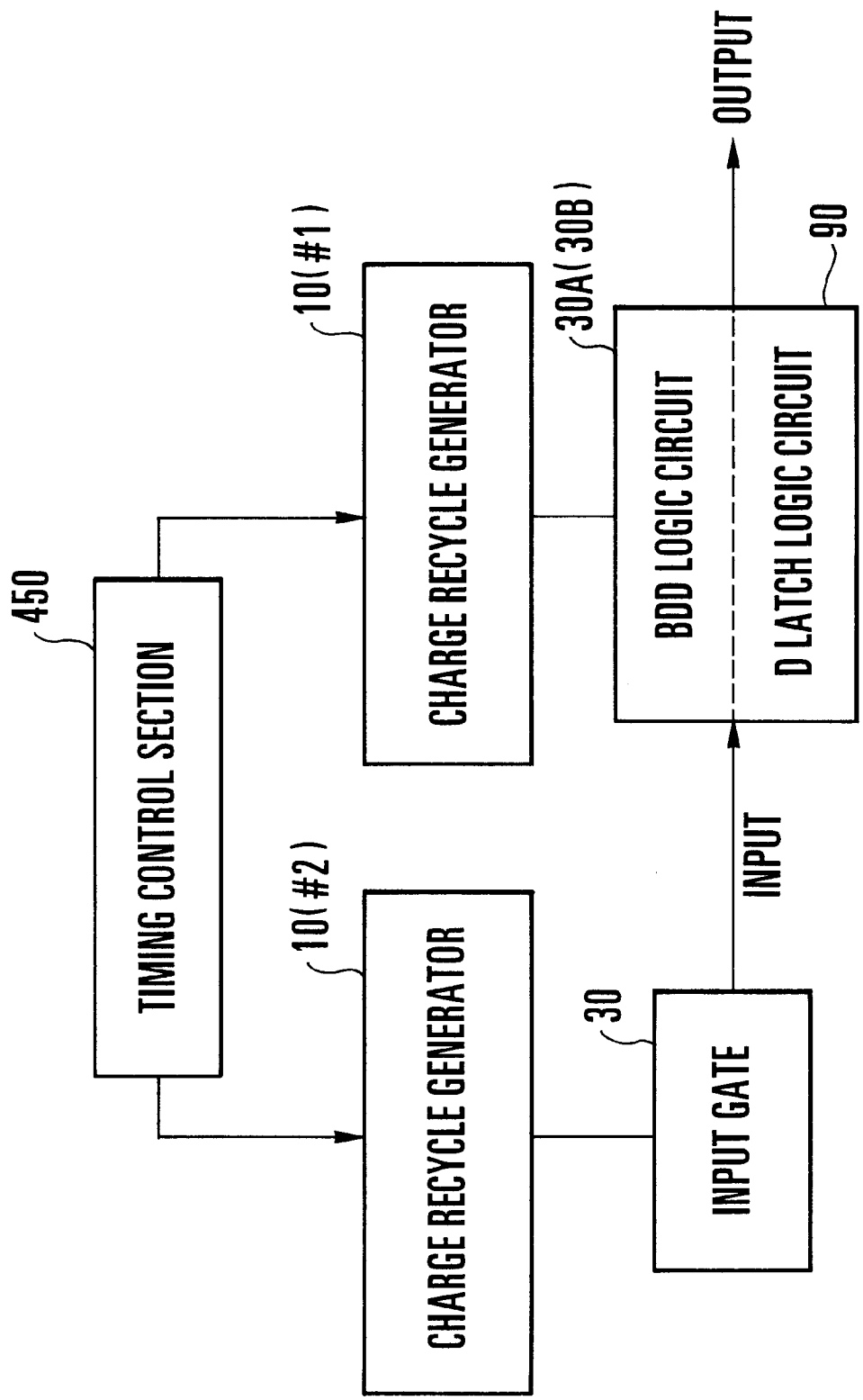
FIG. 62 is a block diagram showing how power supply control is performed on a BDD logic circuit and D latch logic circuit.
Figure 64A:
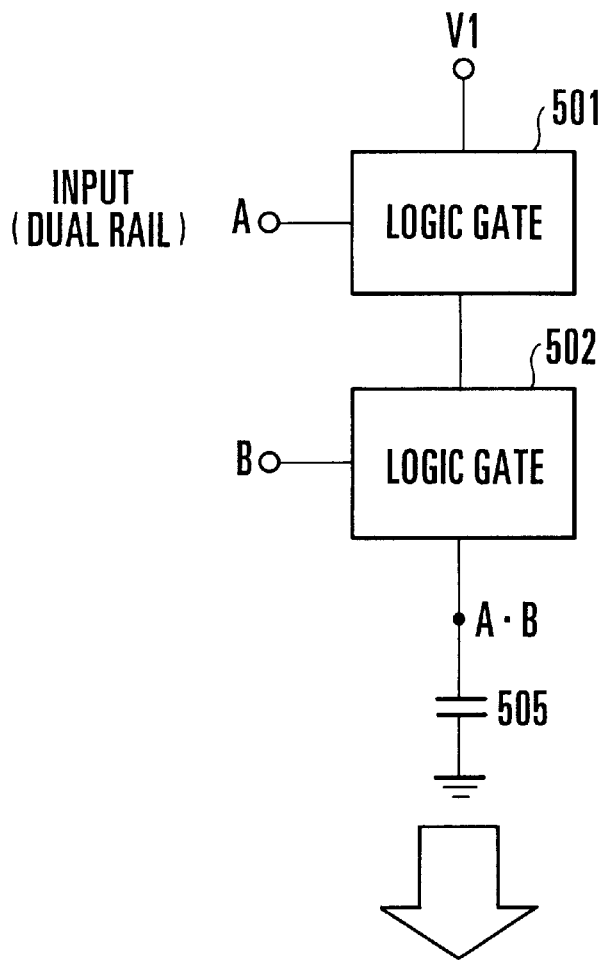
FIGS. 64A to 64C are views for explaining how a retractile logic circuit is implemented.
Figure 64B:
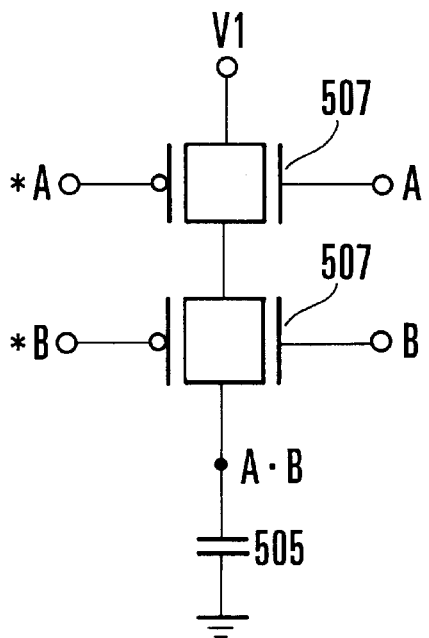
Figure 64C:
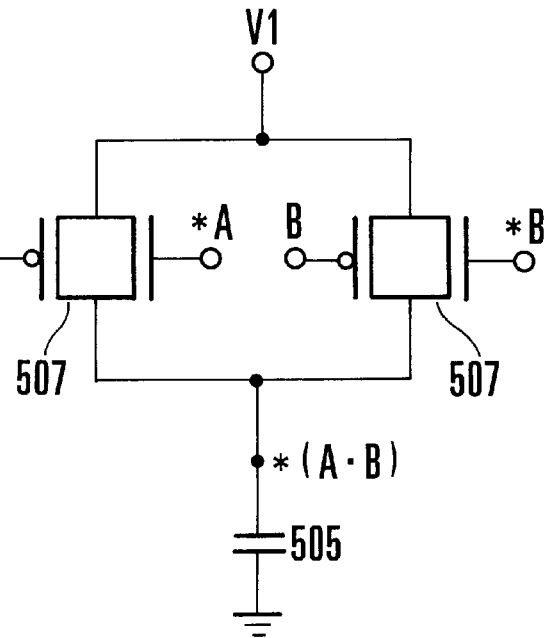

The timing of power supply from this charge recycle generator 10 to a BDD logic circuit and a D latch logic circuit (to be described later) is controlled by a timing control section 450, as shown in FIG. 62. Note that a BDD logic circuit 30A in FIG. 62 corresponds to the BDD logic circuit shown in FIG. 1 or 2 or the like, and a BDD logic circuit 30B in FIG. 62 corresponds to the BDD logic circuit shown in FIG. 28 and the subsequent drawings to be described later. Recycling operation using the charge recycle generator 10 (#2) at the gate portion of the BDD logic circuit will be described later in the fourth, fifth, sixth, and seventh embodiments.

Figure 3:
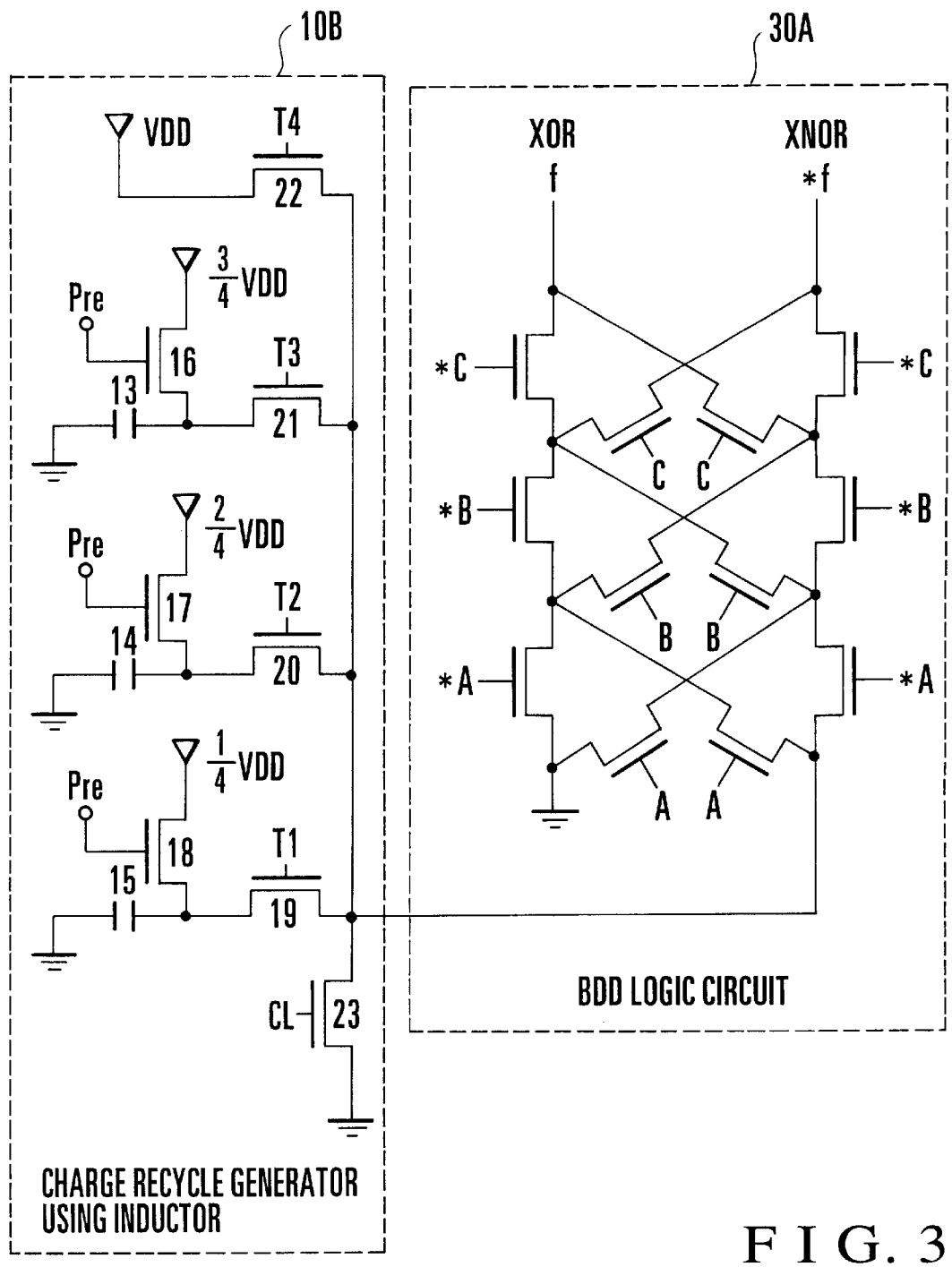
FIG. 3 is a circuit diagram showing a case wherein a power supply circuit for generating a staircase voltage is used as a charge recycle generator for the BDD logic circuit in FIG. 1.

FIG. 2 shows an AC power supply circuit 10A using an inductor 11 and a capacitor 12. FIG. 3 shows a power supply circuit 10B for generating a 4-step staircase voltage by using three capacitors 13 to 15.

Figure 4A:
Figure 4B:
Figure 4C:
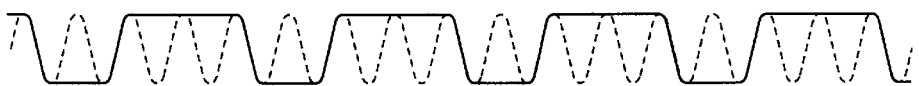
Figure 4D:
Figure 4E:

Referring to FIG. 3, reference numerals 16 to 23 denote n-channel MOSFETs. These power supply circuits 10A and 10B can generate output voltages having AC waveforms (repetitive waveforms) that moderately rise and fall. Note that as other types of AC voltages generated by the charge recycle generator, the triangular wave shown in FIG. 4A and the trapezoidal wave shown in FIG. 4B can be used. In addition, the voltage waveforms generated from the sine waves respectively shown in FIGS. 4C, 4D, and 4E can be used. Note that generation of a triangular wave can be approximately performed by causing, for example, a voltage having a staircase waveform to pass through an integrating circuit.

The operation of a BDD logic circuit 30A shown in FIG. 1 will be described next. First of all, at time t=0, input voltages *A, *B, *C, A, B, and C are respectively input to the gates of the n-channel MOSFETs 8. The output voltage from the charge recycle generator 10 is then moderately raised. With this operation, the BDD logic circuit can be adiabatically charged. With this charging, logic operation is performed to obtain an output signal. After this adiabatic charging operation, the output voltage from the charge recycle generator 10 is moderately lowered. At this time, the charge stored in the BDD logic circuit is returned to the charge recycle generator 10 again. At time t=T after the output potential of the BDD logic circuit is set at Low, the next input signals are input to the gates. By repeating this operation at periods T, adiabatic charging and charge recycling can be executed.

As described above, even if the number of gates increases to several hundreds or several thousands, since the common charge recycle generator 10 is used, the power consumption does not increase, and low power consumption can be realized even in a logic circuit having a complicated logic structure, unlike a conventional retractile logic circuit.

Figure 4F:
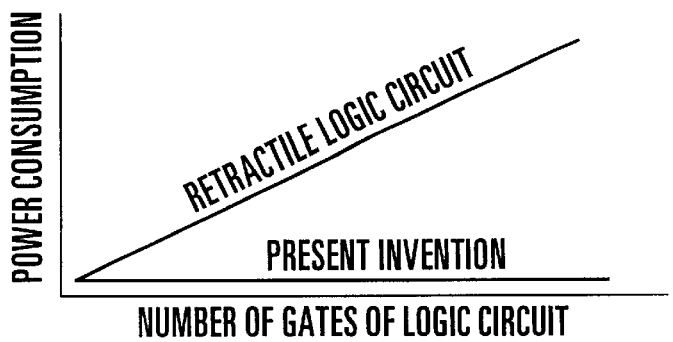

FIG. 4F is a graph showing a comparison between the power consumption in the power supply section of the BDD logic circuit of the present invention and that of the conventional retractile logic circuit. As is obvious from this graph, in the conventional retractile logic circuit, as the number of gates of the logic circuit increases, the power consumption increases. In contrast to this, in the BDD logic circuit of the present invention, the power consumption is constantly kept low.

Figure 5:
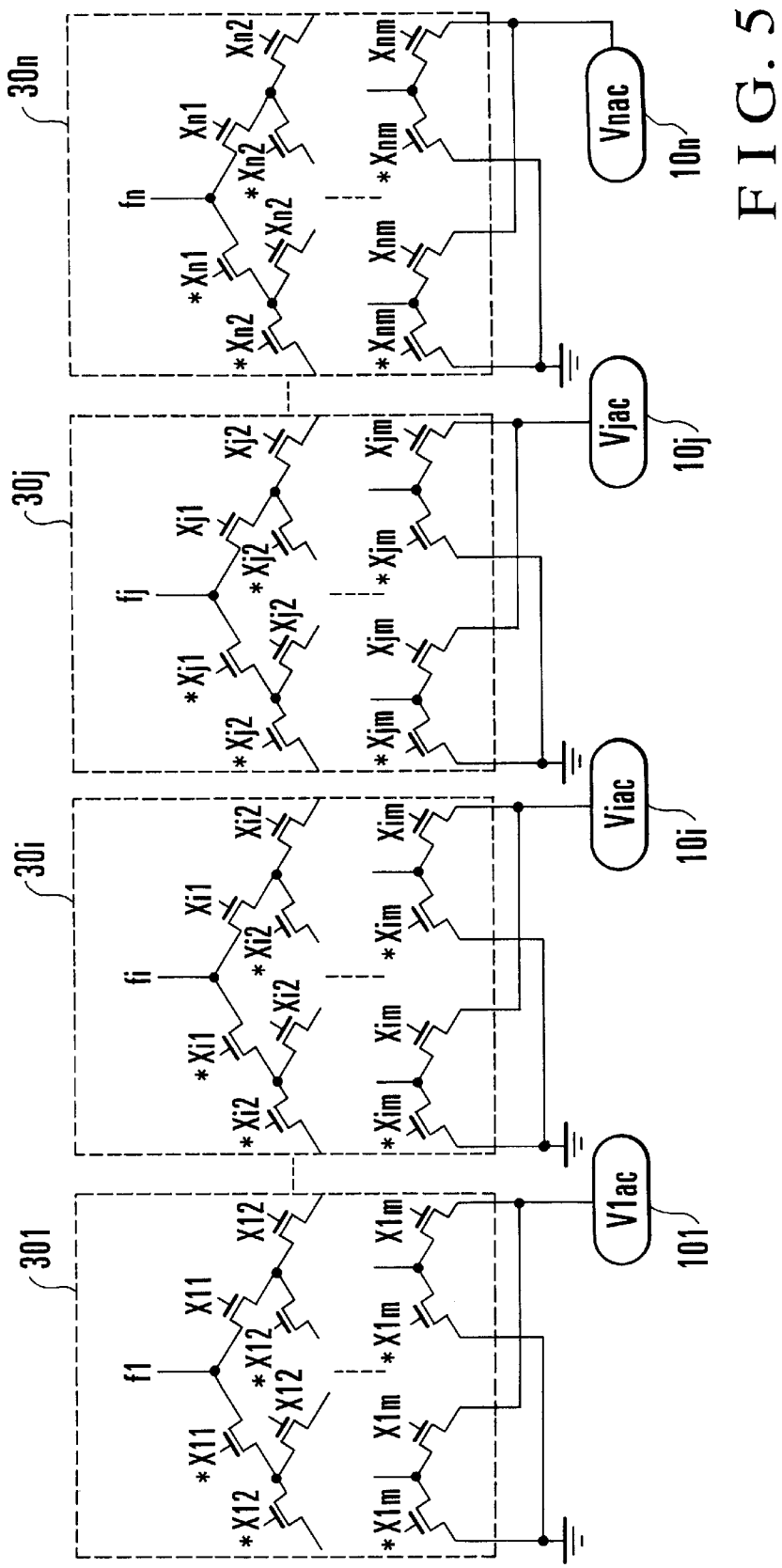
FIG. 5 is a circuit diagram showing a case wherein charge recycle generators are respectively used as power supply circuits for a plurality of BDD logic circuits.

FIG. 5 shows an arrangement including a plurality of BDD logic circuits. Assume that this arrangement includes n BDD logic circuits $30_1$ to $30_n$ (n>4), and the ith and jth BDD logic circuits are adjacent to each other (j=i+1). In this case, the respective BDD logic circuits are independently operated by optimal charge recycle generators $10_1$ to $10_n$. For example, as the power supply for the kth BDD logic circuit, a charge recycle generator with a frequency $f_k$ and a phase $\phi_k$ is used. Each BDD logic circuit requiring fast logic operation uses a charge recycle generator having an increased frequency $f_k$, whereas each BDD logic circuit that does not require fast logic operation uses a charge recycle generator having a decreased frequency $f_k$. This allows the respective BDD logic circuits to efficiently perform concurrent processing.

In addition, BDD logic circuits that can use supply voltages having the same frequency and the same phase share a charge recycle generator through power lines to decrease the number of power supply circuits, thereby realizing low power consumption.

Figure 6:
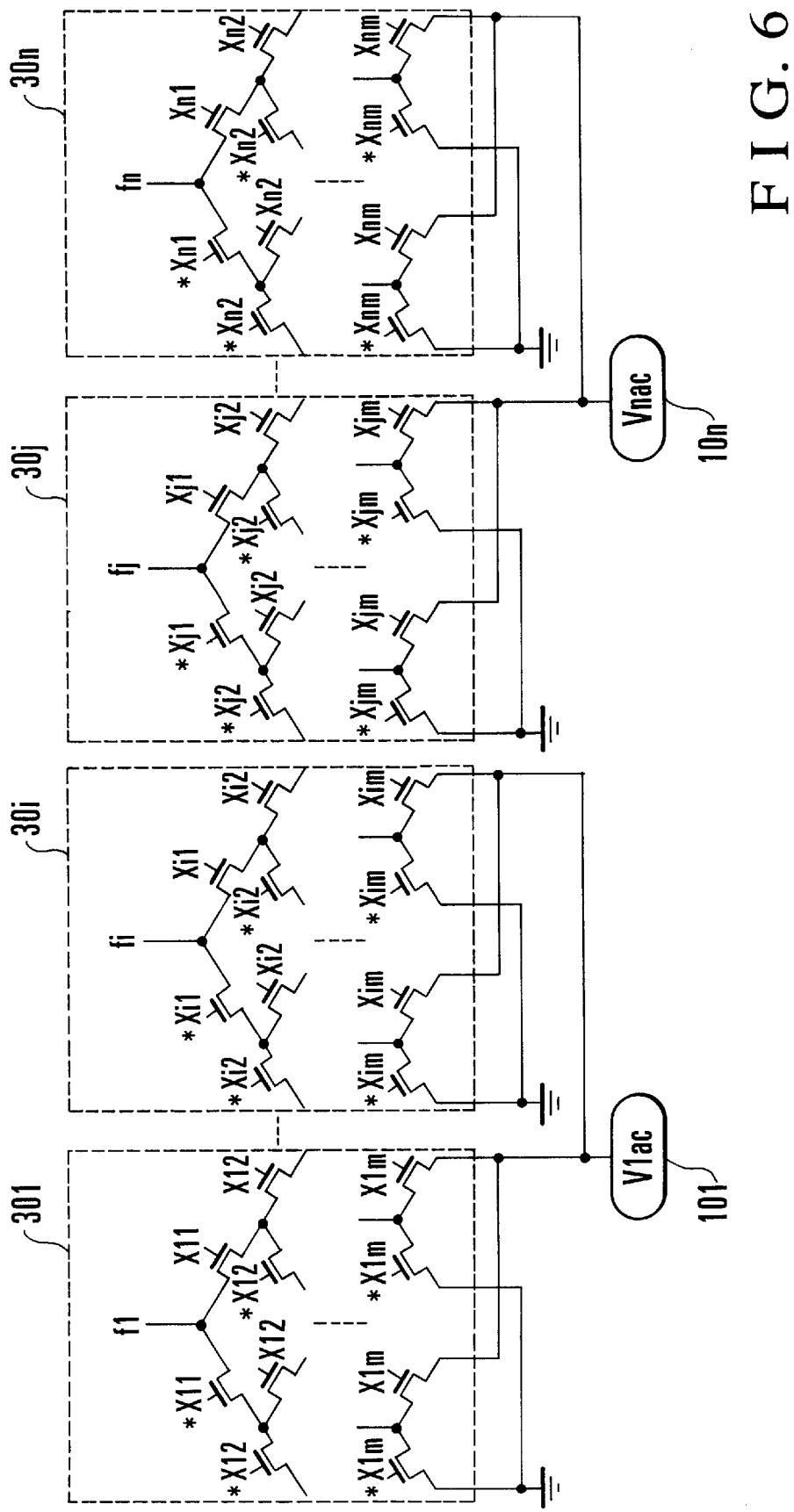
FIG. 6 is a circuit diagram showing a case wherein a plurality of BDD logic circuits are formed into two groups, and a common charge recycle generator is used for each group.

FIG. 6 shows an arrangement using common charge recycle generators. In this circuit arrangement, the 1st to ith supply voltages are applied from a common charge recycle generator $10_1$, and the jth to nth supply voltages are applied from a common charge recycle generator $10_n$.

[Second Embodiment]

Figure 7:
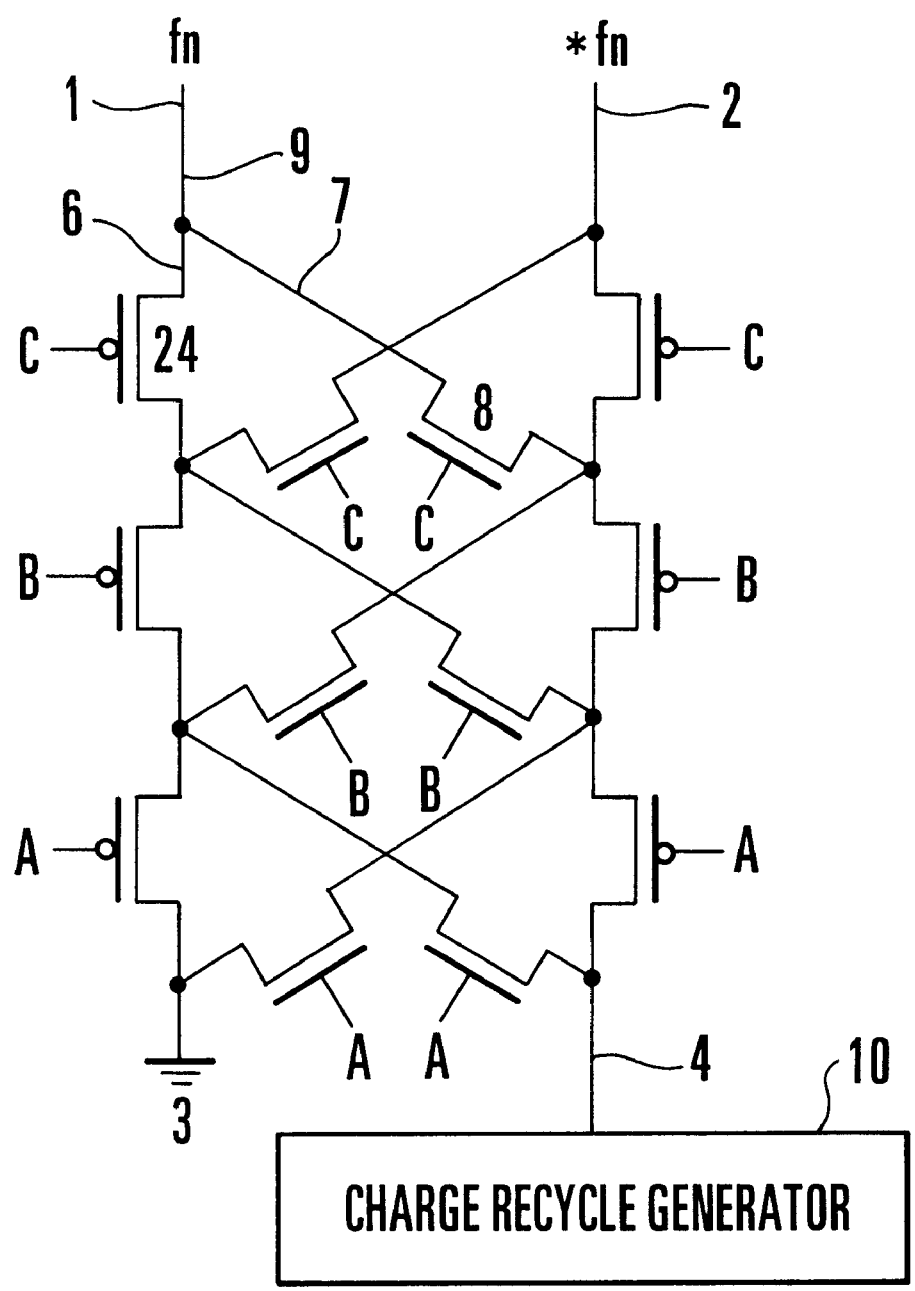
FIG. 7 is a circuit diagram showing a BDD logic circuit according to the second embodiment.

FIG. 7 shows a BDD logic circuit according to the second embodiment of the present invention.

In the arrangement shown in FIG. 7, of the n-channel MOSFETs 8 serving as logic elements in the BDD logic circuit shown in FIG. 1, the elements whose gates receive the inverted signals *A, *B, and *C as input signals are replaced with logic elements that are complementary to those in FIG. 1. More specifically, the logic elements in FIG. 1 are replaced with p-channel MOSFETs 24, and noninverted signals A, B, and C are used as input signals to the gates of the p-channel MOSFETs 24. With this arrangement, since only the noninverted signals A, B, and C can be used as input signals, one inverter for inverting a noninverted signal can be omitted from each logic element. This circuit can therefore achieve lower power consumption than the BDD logic circuit shown in FIG. 1. Note that the same applies to each of the BDD logic circuits in FIGS. 2, 3, 5, and 6.

An example of the operation of the BDD logic circuit in FIG. 7, which uses n-channel MOSFETs 8 and the p-channel MOSFETs 24 together, will be described in detail below by using simulation results. In this case, as a charge recycle generator, a power supply 10B (identical to the one shown in FIG. 3) designed to generate a 4-step staircase voltage by using three capacitors 13 to 15.

Figure 10A:
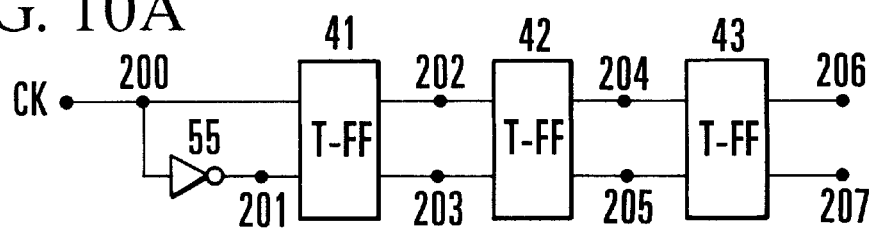
FIGS. 10A to 10F are circuit diagrams showing arrangements for generating timing signals for the power supply circuit in FIG. 8.
Figure 10B:
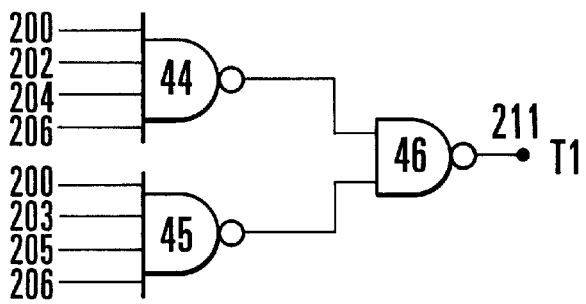
Figure 10C:
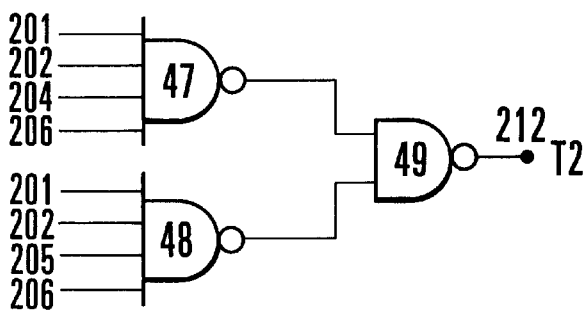
Figure 10D:
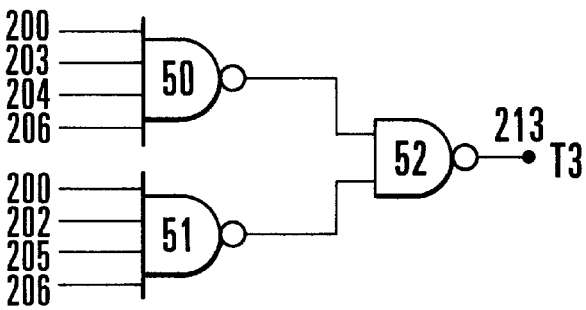
Figure 10E:
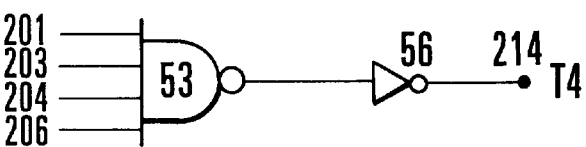
Figure 10F:

This charge recycle generator 10B is constituted by four constant supply voltages VDD, 3/4VDD, 2/4VDD, and 1/4VDD, three capacitors 13 to 15, and eight n-channel MOSFETs 16 to 23. The three capacitors 13 to 15 are respectively charged by the voltages 3/4VDD, 2/4VDD, and 1/4VDD. Input signals Pre are applied to the gates of the three n-channel MOSFETs 16 to 18. Input signals T1 to T4 are respectively applied to the gates of the four n-channel MOSFETs 19 to 22. An input signal CL is applied to the gate of the one n-channel MOSFET 23. Although the capacitors 13, 14, and 15 are naturally charged to 3/4VDD, 2/4VDD, and 1/4VDD without the voltages 3/4VDD, 2/4VDD, and 1/4VDD, respectively, to become stable, a circuit arrangement like the one shown in FIG. 10B is employed in consideration of the need for fast charging operation.

FIGS. 9A to 9H show the operation of the charge recycle generator 10B in detail. First of all, the input signal Pre in FIG. 9A is kept High for a predetermined period of time to turn on the n-channel MOSFETs 16 to 18, thereby charging the capacitors 13 to 15 to the voltages 3/4VDD, 2/4VDD, and 1/4VDD, respectively. Then, each of the input signals T1 to T4 in FIGS. 9E to 9H is kept High for a predetermined period of time in the order of T1→T2→T3→T4→T3→T2→T1 to turn on the n-channel MOSFETs 19 to 22 so as to time-divisionally output the voltages 3/4VDD, 2/4VDD, and 1/4VDD charged in the capacitors 13 to 15 as an output voltage Vout. Finally, when the input signal T1 is set at Low, the input signal CL is set at High, and the n-channel MOSFET 23 is kept on for a predetermined period of time, thereby setting the output voltage Vout to the ground potential. With this timing control, the waveform of the output voltage Vout from the charge recycle generator 10B has four steps at leading and trailing edges, as shown in FIG. 9C.

The above input signals (pulses) CL, T1, T2, T3, and T4 can be generated by, for example, a circuit using three T-type flip-flop circuits 41 to 43, 11 NAND circuits 44 to 54, and three inverters 55 to 57, as shown in FIGS. 10A to 10F.

Referring to FIGS. 10A to 10F, reference numeral 200 denotes an input terminal for a predetermined clock CK; 211, an output terminal for the signal T1; 212, an output terminal for the signal T2; 213, an output terminal for the signal T3; 214, an output terminal for the signal T4; and 215, an output terminal for the signal CL. Other reference numerals denote nodes, and the nodes denoted by the same reference numeral are commonly connected.

Figure 8:
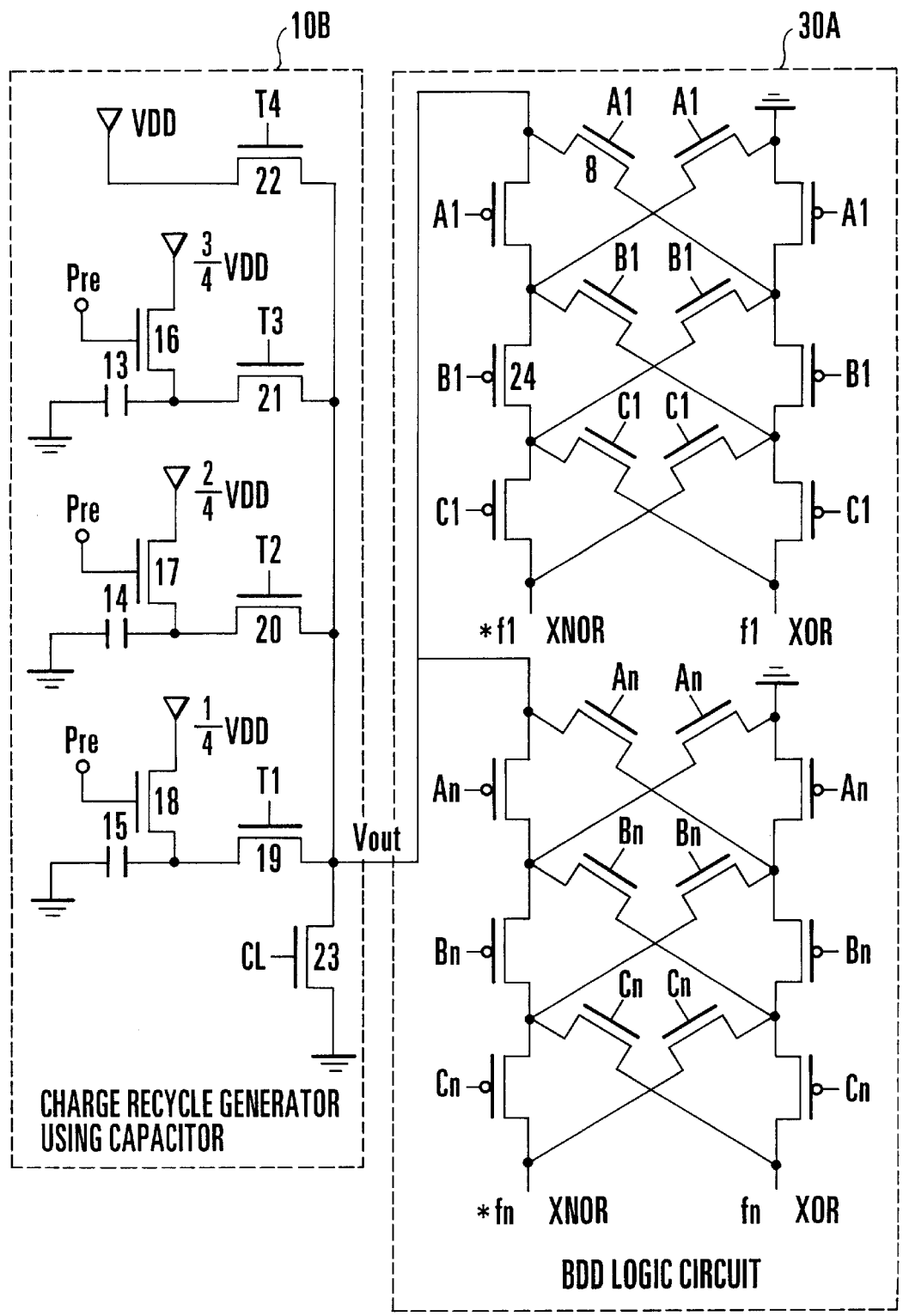
FIG. 8 is a circuit diagram showing a case wherein a power supply circuit for generating a staircase voltage is used as a charge recycle generator for the BDD logic circuit in FIG. 7.

In performing a simulation, the capacitance of each of the capacitors 13 to 15 of the charge recycle generator 10B was set to 5,000 pF, and a transistor width W of each of the eight n-channel MOSFETs 16 to 23 was set to 36 $\mu$m. In addition, in each 3-input XOR BDD logic circuit in FIG. 8, the transistor width W was set to 6 $\mu$m, and the load capacitance of the output on the XOR side was set to 0.5 pF. In this case, the simulation was performed for a parallel circuit of 1,000 3-input XOR BDD logic circuits. The frequency of the input clock CK was set to 4 MHz. FIGS. 11 and 12 show the simulation results.

FIG. 11 shows the waveforms of the signals Pre, CK, CL, T1 to T4, and Vout in the charge recycle generator 10B. Obviously, desired waveforms like those shown in FIGS. 9A to 9H are obtained. Since the sum total of the output loads is 1,000 times 0.5 pF (=500 pF), the resultant waveform is slightly smoother than the staircase waveform.

FIG. 12 shows the waveforms of the input signals A, B, and C, the supply voltage Vout, and output signals XOR and XNOR. As described above, input voltages are switched when the supply voltage Vout is at Low level. If each of the input signals A, B, and C is "1", the XOR and the XNOR becomes "1" and "0", respectively. If A=B="1" and C="0", the XOR and the XNOR become "0" and "1", respectively. That is, logic processing is properly performed. The pulse width (bit width) of the signal C is 2 $\mu$s, and the frequency of the output voltage is set 500 kHz.

In addition, the power consumption becomes $4.76\times10^{-4}$ W at a frequency of 500 kHz. On the other hand, the power consumption per unit logic processing in one XOR circuit of a general CMOS is $1.06\times10^{-6}$ W, and hence the power consumption per unit logic processing in 1,000 XOR circuits is $1.06\times10^{-3}$ W. As is obvious, with the use of the circuit of the present invention, the power consumption can be reduced to ½ that of the general CMOS logic circuit. It can be confirmed from the above argument that the BDD logic circuit using the charge recycle generator according to the present invention can realize lower power consumption.

[Third Embodiment]

Figure 13:
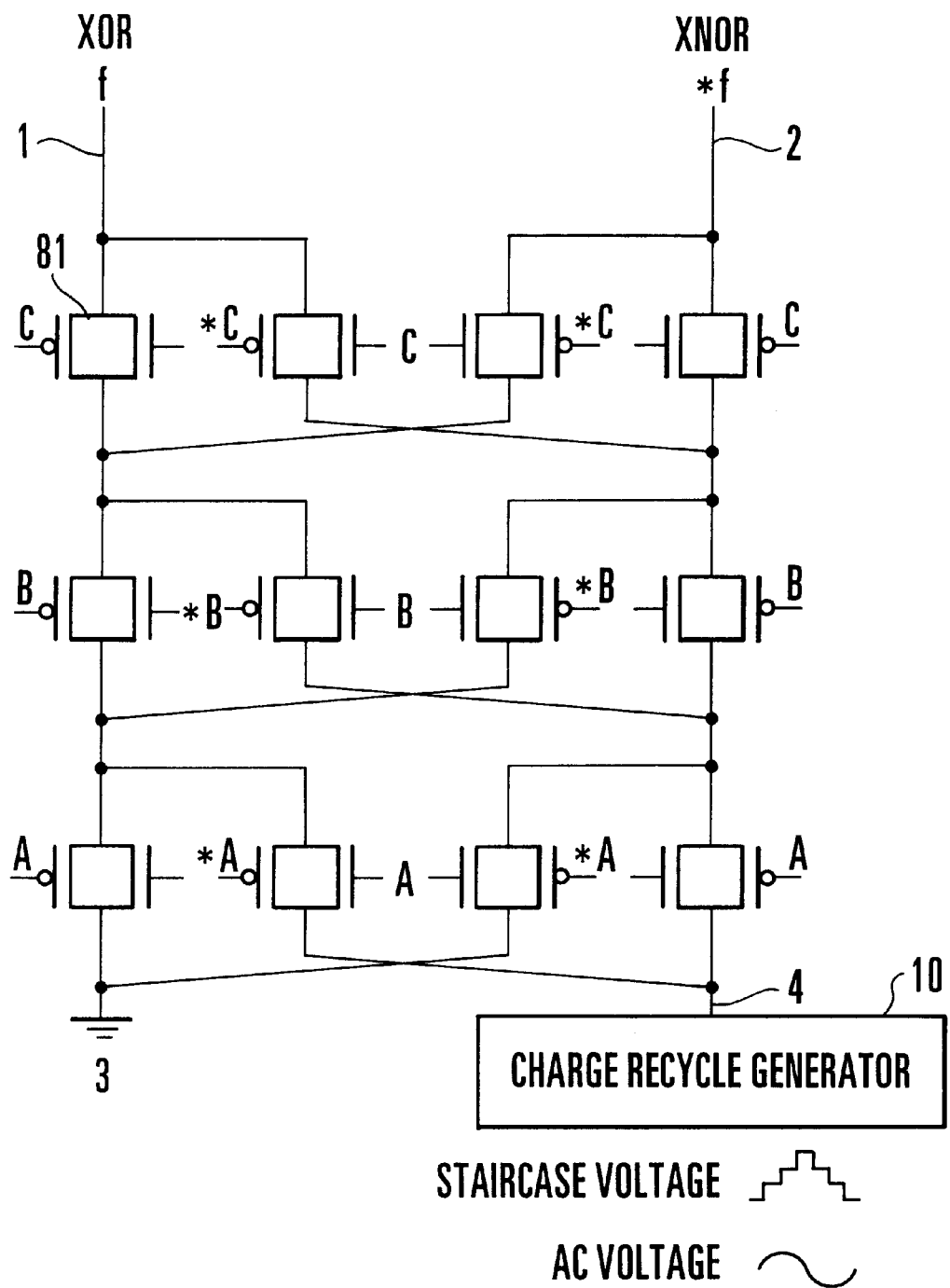
FIG. 13 is a circuit diagram showing a BDD logic circuit according to the third embodiment.

FIG. 13 shows a BDD logic circuit using a charge recycle generator according to the third embodiment of the present invention. In this case, the n-channel MOSFETs 8 serving as logic elements in the BDD logic circuit shown in FIG. 1 are replaced with transmission gates 81 each formed by connecting an n-channel MOSFET and p-channel MOSFET in parallel with each other. An input signal to each p-channel MOSFET is the inverted signal of an input signal to a corresponding n-channel MOSFET. With this arrangement, since a High-level signal obtained as an output signal rises from VDD-Vth (Vth is the threshold voltage of an n-channel MOSFET) to a supply voltage VDD, the voltage amplitude of the logic signal can be set to be large as compared with the circuit shown in FIG. 1. In an n-channel MOSFET, the propagation characteristic of a Low-level signal is good, but a High-level signal undergoes a voltage drop corresponding to the threshold voltage during propagation. This arrangement can prevent this. In a p-channel MOSFET, the propagation characteristic of a High-level signal is good, but that of a Low-level signal is poor. The transmission gates can solve these problems.

[Fourth Embodiment]

Figure 14:
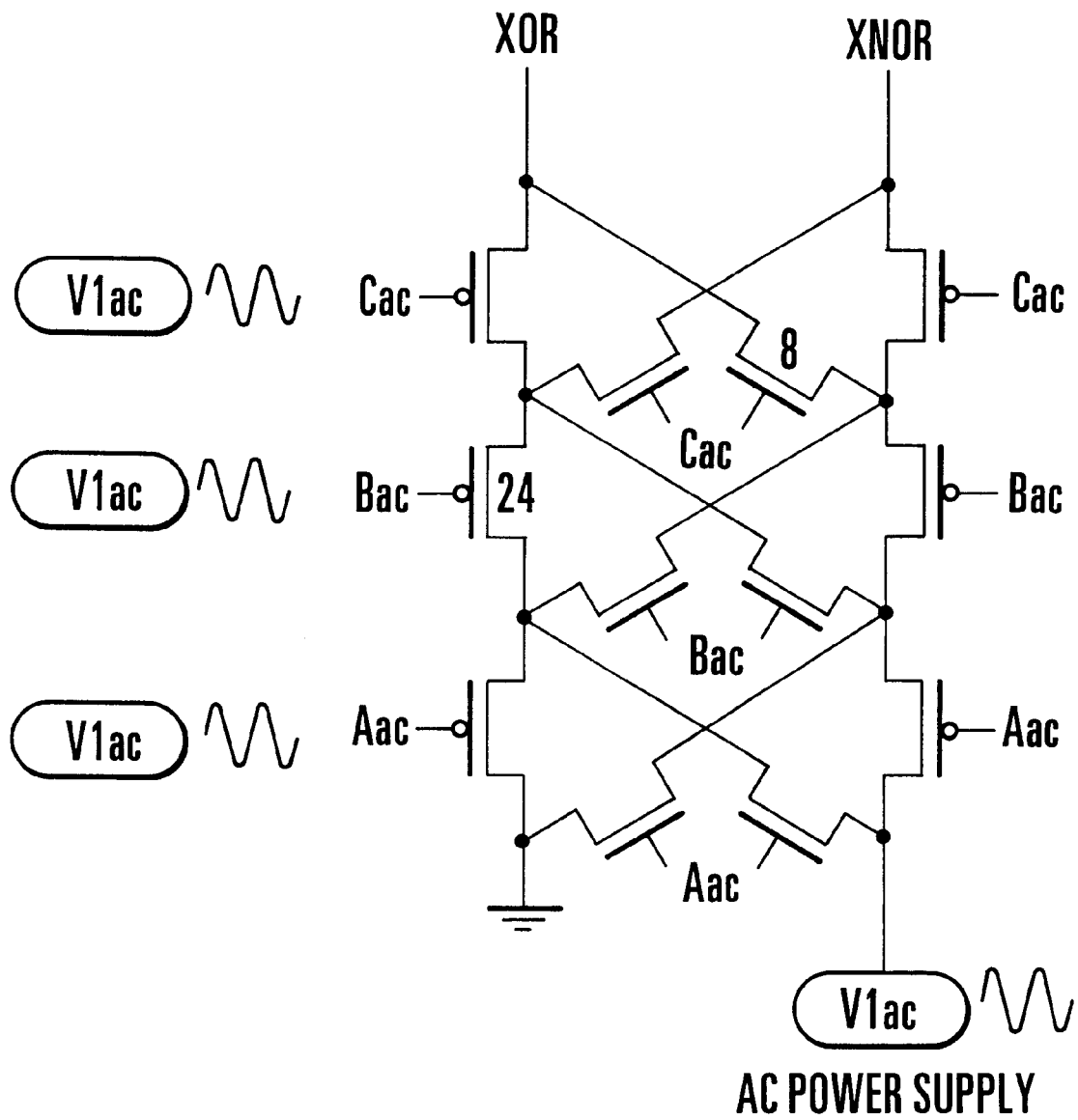
FIG. 14 is a circuit diagram showing a BDD logic circuit according to the fourth embodiment.
Figure 15A:
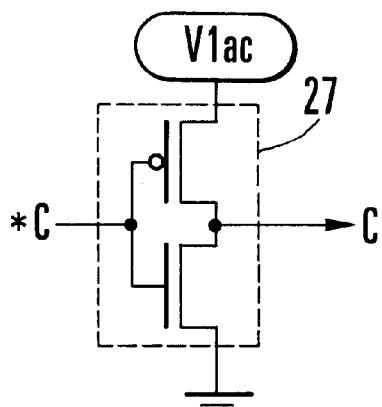
FIGS. 15A to 15D are circuit diagrams showing the circuit in FIG. 14 in more detail.
Figure 15B:
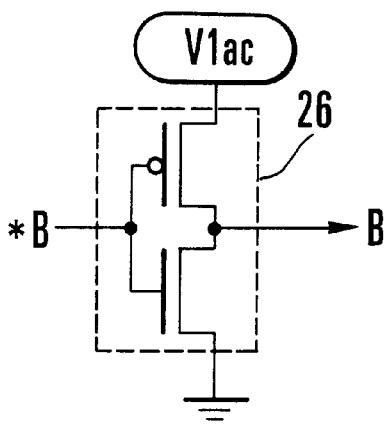
Figure 15C:
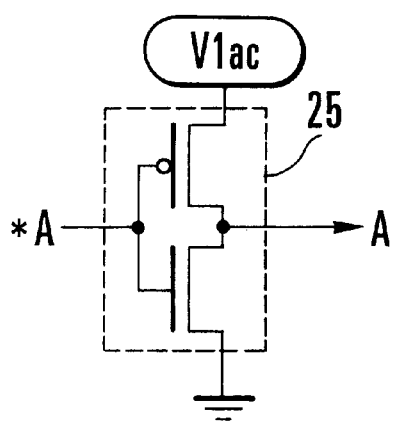
Figure 15D:
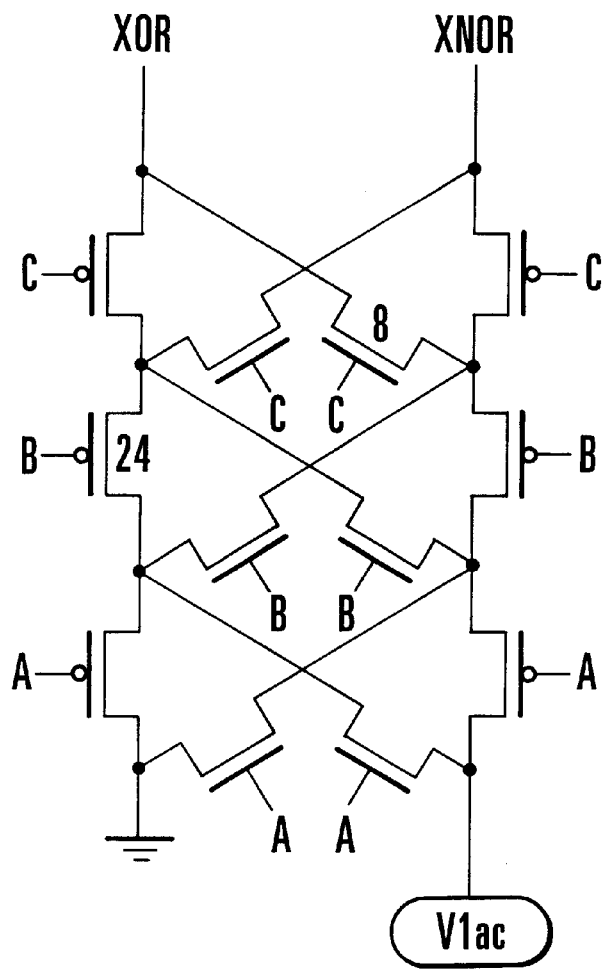

FIG. 14 shows a BDD logic circuit using a charge recycle generator according to the fourth embodiment. As this charge recycle generator, an AC power supply is used. To recycle the charge stored in the input gates, AC voltages Aac, Bac, and Cac, each having the same frequency and phase as those of an AC supply voltage V1ac, are applied to the input gates of the logic elements.

FIGS. 15A to 15D show a detailed circuit arrangement obtained by combining the circuit in FIG. 14 with inverters 25 to 27. In this case, the AC supply voltage V1ac is used as a supply voltage applied to the BDD logic circuit. The supply voltage applied to the inverter 25 for receiving an inverted signal *A and outputting a noninverted signal A is also the AC supply voltage V1ac, so is the supply voltage applied to each of the remaining inverters 26 and 27. In this case, as V1ac, a sine-wave voltage having an offset of 1 V (center voltage of 1 V) and an amplitude of 1 V is used. In addition, as each of inverted signals *A, *B, and *C, a signal whose Low and High levels are respectively set to 0 V and 2 V is used.

Figure 16:
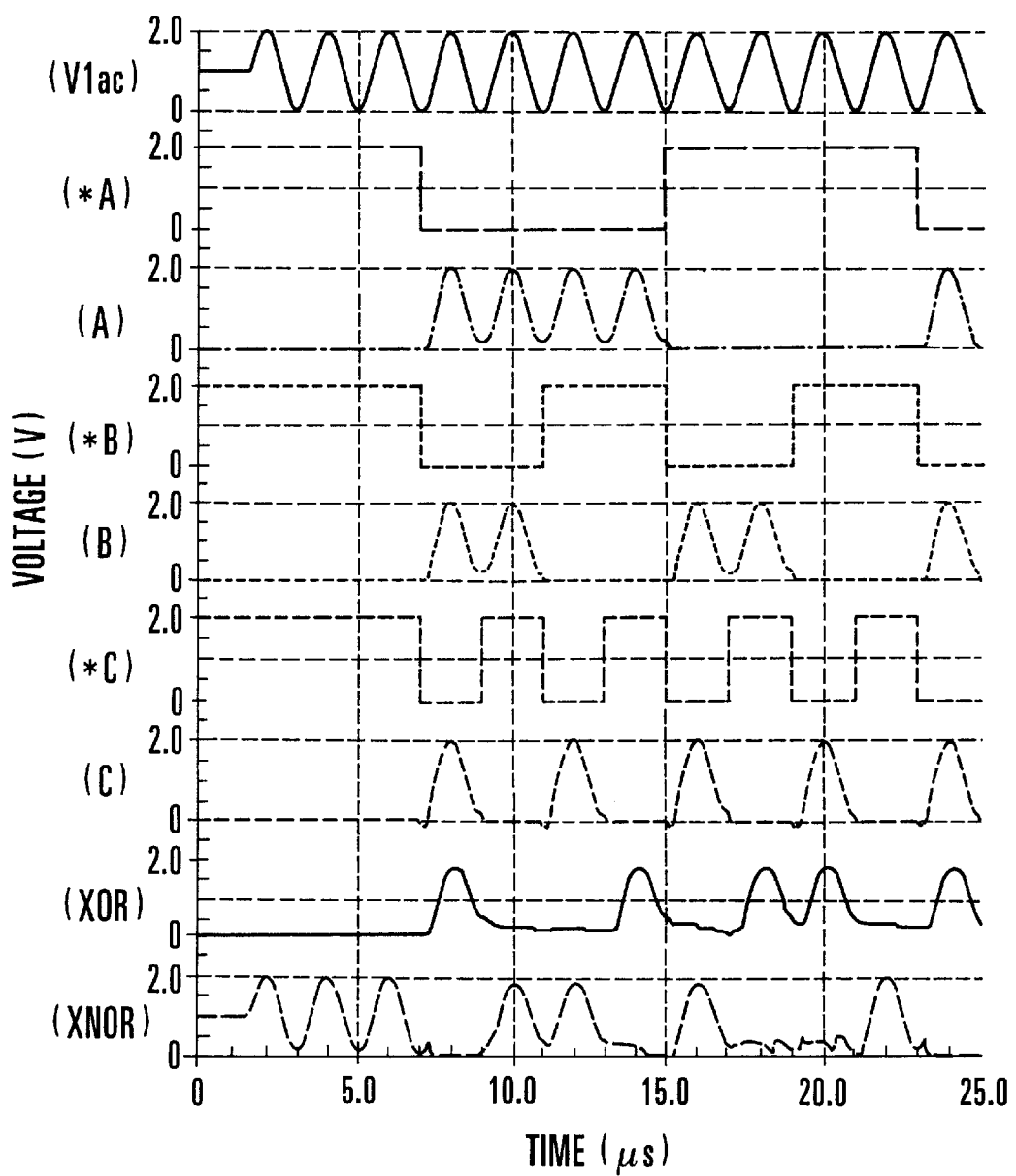
FIG. 16 is a timing chart showing the simulation result obtained by using the BDD logic circuit in FIGS. 15A to 15D.

FIG. 16 shows the simulation result obtained when the operating speed was set to 500 kHz. FIG. 16 shows the waveforms of the AC voltage V1ac, the input signals *A, A, *B, B, *C, and C, and output signals XOR and XNOR.

2 V (peak) and 0 V of the AC voltage respectively correspond to High level ("1") and Low level ("0") of the input signal A. Obviously, the signals A, B, and C respectively represent "111100001", "110011001", and "101010101" in the time interval between 7 $\mu$s and 25 $\mu$s. In addition, when A=B=C="1", XOR is "1". When A=B="1" and C="0", XOR is "0". The power consumption of the BDD logic circuit is $2.71\times10^{-7}$ W. The power consumption of this AC BDD logic circuit is about ¼ that of a CMOS.

Although the sine-wave voltage is used as an AC voltage, the AC voltage is not limited to this. For example, as the voltage V1ac, a voltage having a triangular wave, a trapezoidal wave, or one of the voltage waveforms generated from a sine wave, which are shown in FIGS. 4A to 4E, can be used. As is obvious, a staircase voltage waveform (Vout in FIG. 9C) obtained by the power supply circuit 10B shown in FIG. 8 can also be used.

[Fifth Embodiment]

Figure 17A:
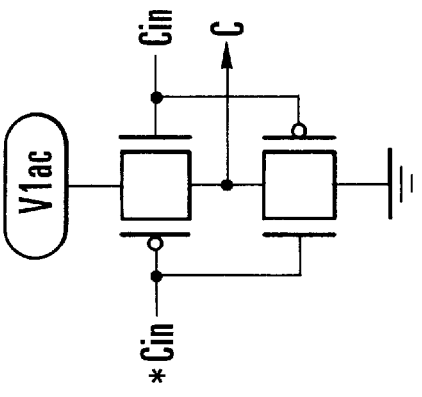
FIGS. 17A to 17G are circuit diagrams showing a BDD logic circuit according to the fifth embodiment.
Figure 17C:
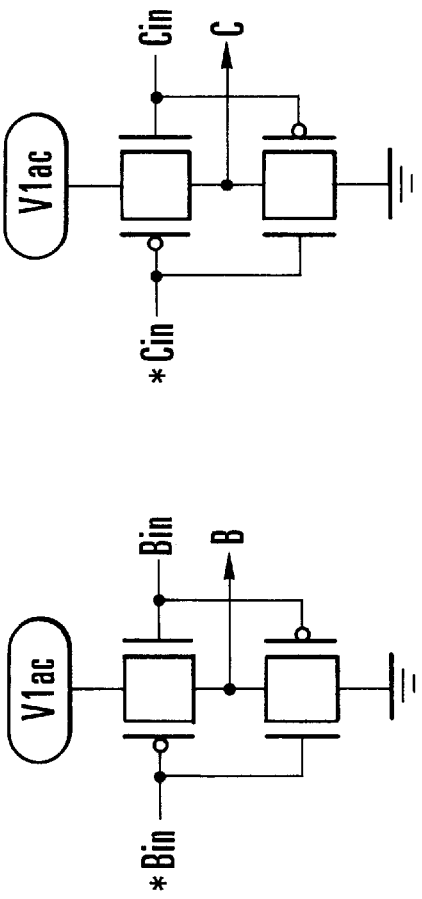
Figure 17E:
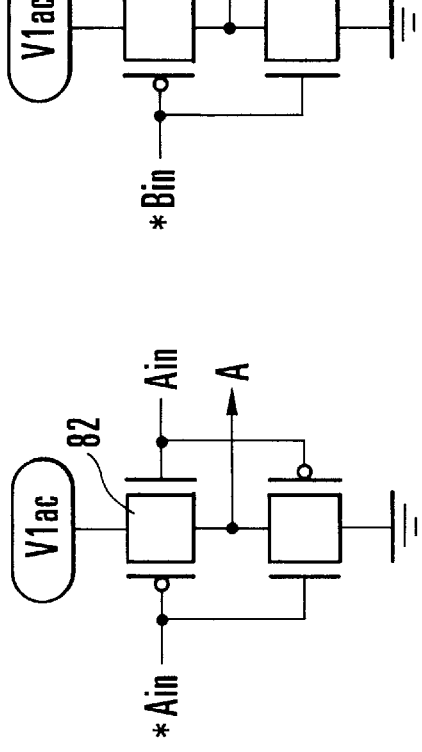
Figure 17B:
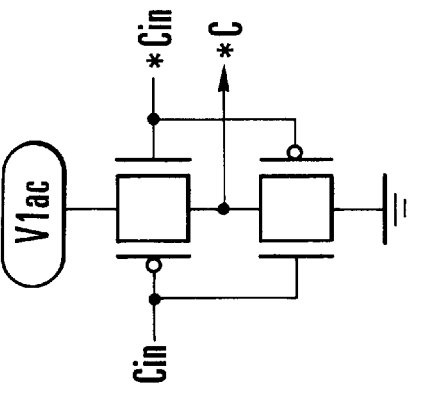
Figure 17D:
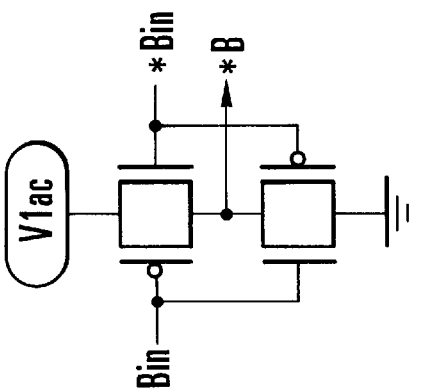
Figure 17F:
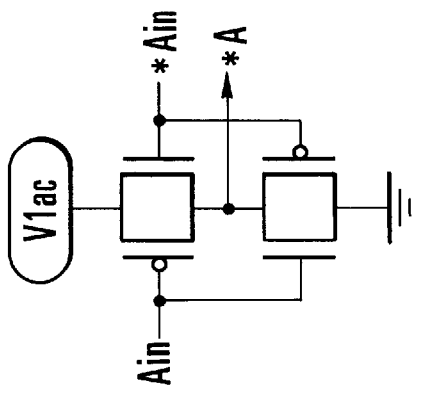

FIGS. 17A to 17G show a BDD logic circuit using a charge recycle generator according to the fifth embodiment. In this case, when an AC power supply V1ac is used as a charge recycle generator for the BDD logic circuit shown in FIG. 13, a circuit obtained by connecting transmission gates 81 in series with each other is used instead of each of the inverters 25 to 27 in FIGS. 15A to 15C. As shown in FIGS. 17A and 17B, the circuit receives logic signals Ain and *Ain and generates AC voltage signals A and *A. As shown in FIGS. 17C and 17D, the circuit receives logic signal Bin and *Bin and generates AC voltage signals B and *B. In addition, as shown in FIGS. 17E and 17F, the circuit receives logic signals Cin and *Cin and generates AC voltage signals C and *C. These AC voltages A, *A, B, *B, C, and *C are input to the BDD logic circuit to perform logic processing.

[Sixth Embodiment]

Figure 18A:
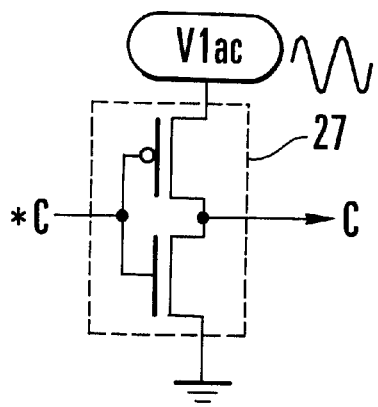
FIGS. 18A to 18D are circuit diagrams showing a BDD logic circuit according to the sixth embodiment.
Figure 18B:
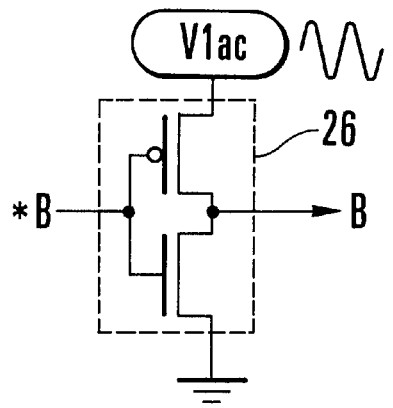
Figure 18C:
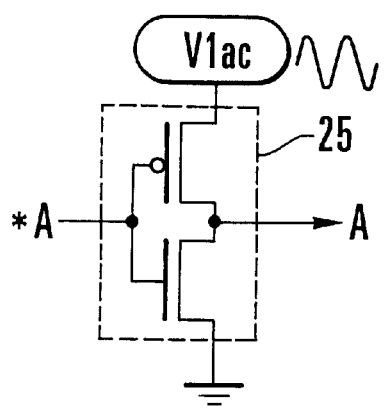
Figure 18D:
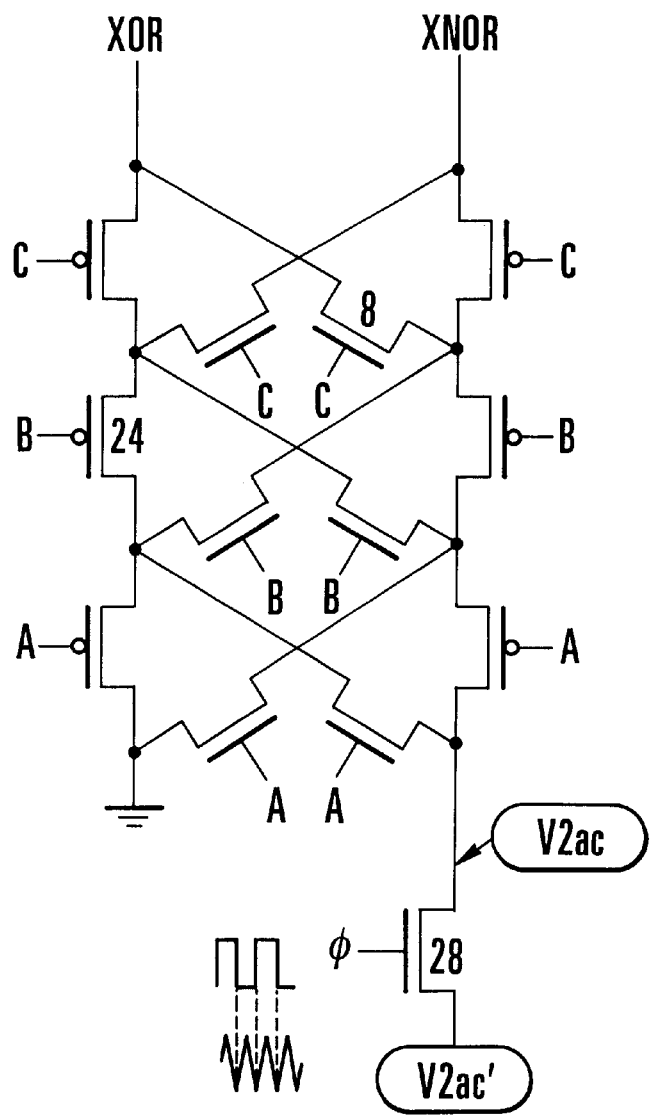

FIGS. 18A to 18D show a BDD logic circuit using a charge recycle generator according to the sixth embodiment, in which an AC voltage V1ac is used as an input voltage, and an AC voltage V2ac' is used for a charge recycle generator. This AC voltage V2ac' has a frequency twice that of the AC voltage V1ac. In addition, an n-channel MOSFET 28 having a switching function is connected between the BDD logic circuit and the AC voltage V2ac'. By supplying a clock signal φ (having the same frequency as that of the AC signal V1ac) to the gate of this n-channel MOSFET 28, as shown in FIG. 18D, the peaks of the AC voltage V2ac' are alternately extracted, thereby obtaining an AC voltage V2ac as a supply voltage.

FIG. 19 shows a simulation result.

FIG. 19 shows the waveforms of the AC voltage V2ac', the clock signal φ, the AC voltage V2ac having passed through the n-channel MOSFET 28, the AC voltage V1ac, an input signal C, and output signals XOR and XNOR. Although input signals A and B are not shown, they have the same waveforms as those in FIG. 16. Obviously, the signals XOR and XNOR are properly output as in the simulation result shown in FIG. 16.

In this circuit, the power consumption is $3.6 \times 10^{-8}$ W, which is about 1/30 that of a CMOS. The reason for such low power consumption may be that since the waveform of the AC voltage V2ac from the power supply is fitted in the waveform of the input AC voltage V1ac, almost no leakage occurs from the power supply to ground.

[Seventh Embodiment]

Figure 17G:
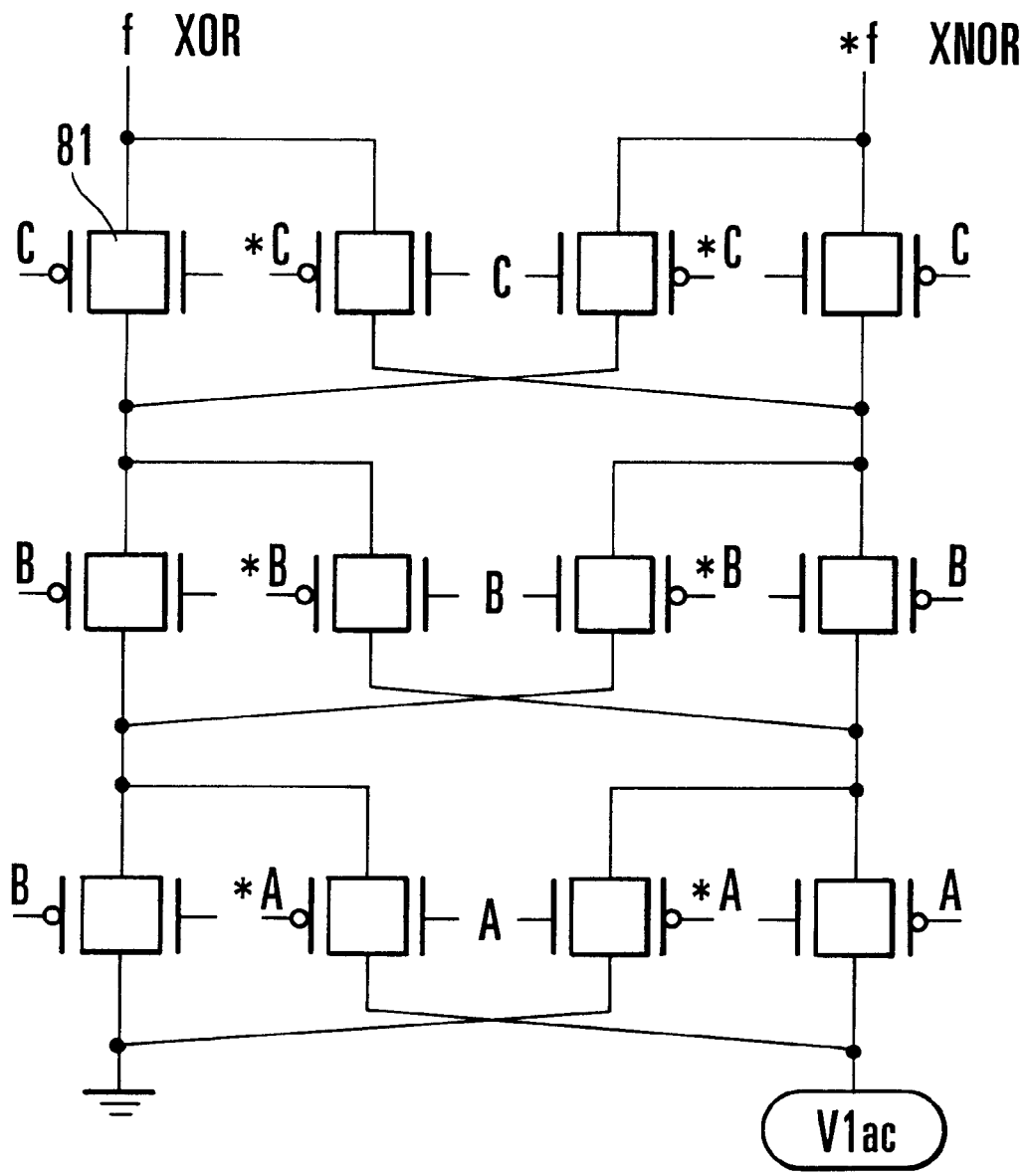
Figure 20G:
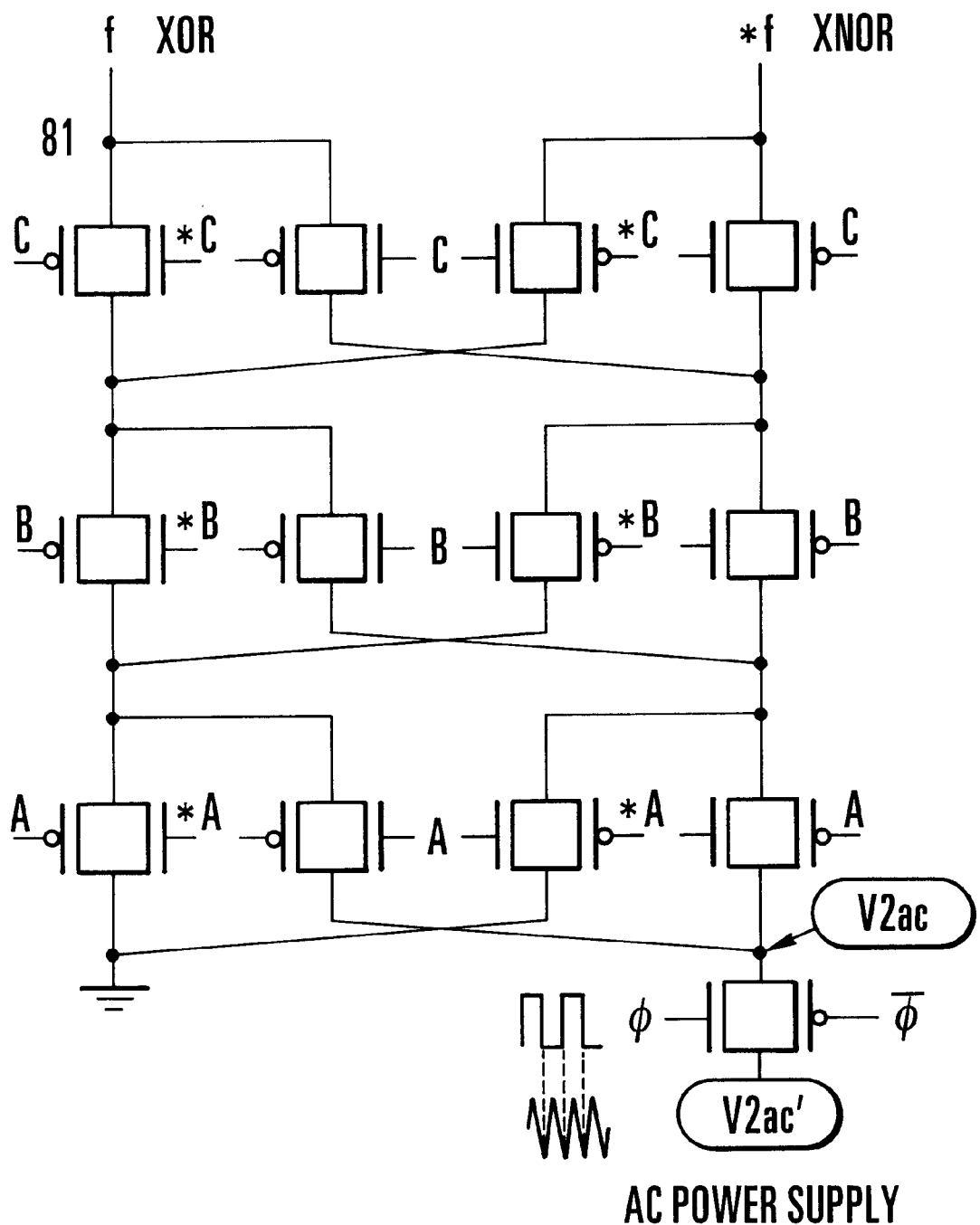

FIGS. 20A to 20G show a BDD logic circuit using a charge recycle generator according to the seventh embodiment, in which the above AC voltage V1ac is used as an input voltage, and an AC voltage V2ac' is used as a charge recycle generator for the BDD logic circuit shown in FIG. 17G. This AC voltage V2ac' has a frequency twice that of the AC voltage V1ac. A transmission gate is connected between the BDD logic circuit and the AC voltage V2ac'. By supplying a clock signal φ (having the same frequency as that of the AC signal V1ac) and a signal $\bar{\phi}$ to the transmission gate, as shown in FIG. 20G, the peaks of the AC voltage V2ac' are alternately extracted, thereby obtaining an AC voltage V2ac as a supply voltage.

In the seventh embodiment and the fifth and sixth embodiments, as described above, the AC voltage need not be a sine-wave voltage. For example, a voltage having a trapezoidal waveform or a staircase waveform obtained by a power supply circuit 10B may be used. In addition, the relationship in timing between the AC voltages V1ac and V2ac can be arbitrarily set as long as the voltage V1ac rises earlier and falls later than the voltage V2ac. FIGS. 21A to 21H show several examples of this relationship.

[Eighth Embodiment]

Figure 22A:
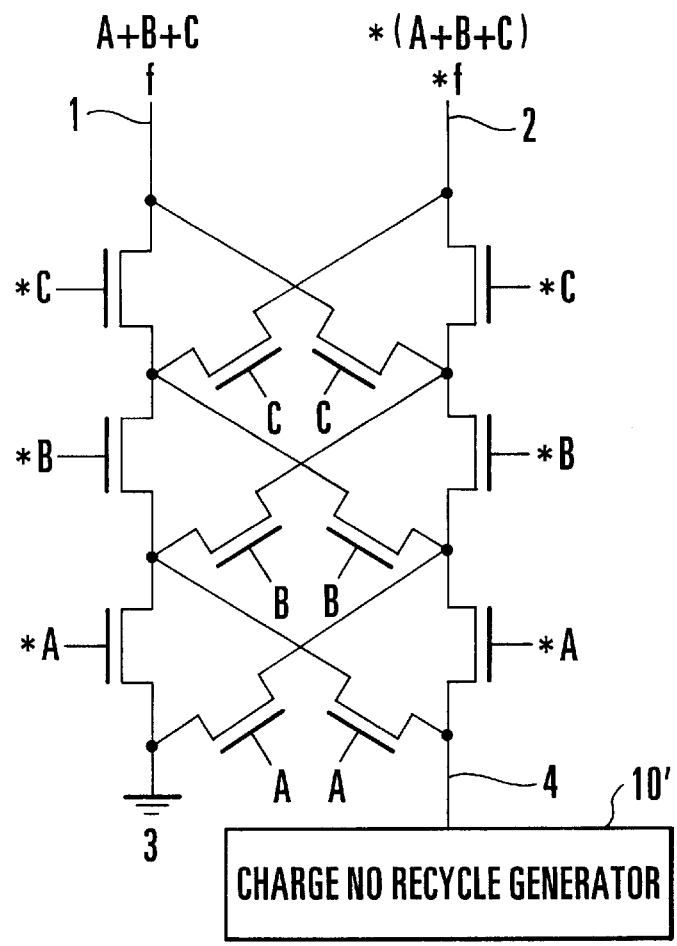
FIGS. 22A and 22B are views showing a BDD logic circuit according to the eighth embodiment.
Figure 22B:
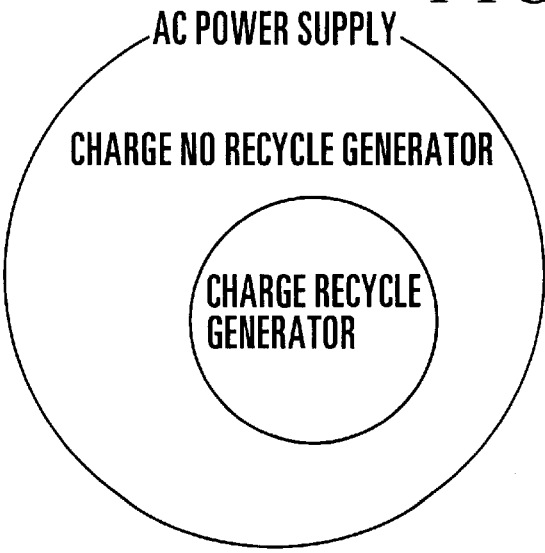

FIG. 22A shows a BDD logic circuit according to the eighth embodiment. In this case, the charge recycle generator 10 of the BDD logic circuit shown in FIG. 1 is replaced with a charge no recycle generator 10'. The charge no recycle generator 10' is an AC power supply (for generating a voltage that generally rises and falls and periodically changes) that does not recycle power. FIG. 22B shows the relationship between an AC power supply, the charge recycle generator 10, and the charge no recycle generator 10'.

Figure 23:
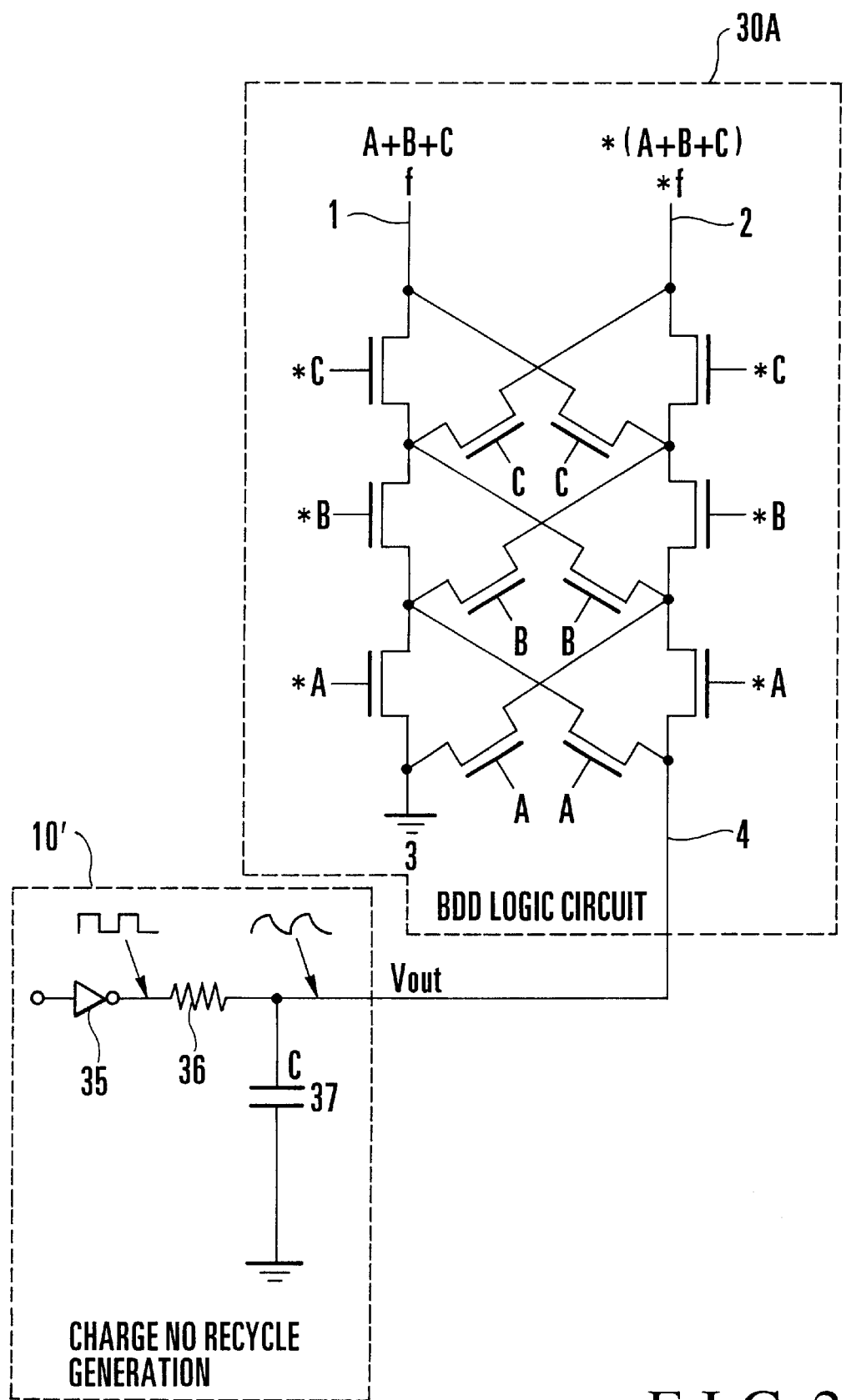
FIG. 23 is a circuit diagram showing the detailed arrangement of the BDD logic circuit to which a charge no recycle generator is connected.

FIG. 23 shows a circuit including the charge no recycle generator 10'. In this case, the rectangular wave output from an inverter 35 is integrated by a resistor 36 and a capacitor 37 to generate a repetitive voltage that moderately rises and falls. Such an AC power supply that does not recycle power cannot recycle charge. However, since adiabatic charging can be performed, unlike a power supply using a rectangular wave, the power consumption can be reduced to ½.

[Ninth Embodiment]

FIG. 24 shows an IC card 60 according to the ninth embodiment. In this case, when there is an AC voltage induced from a radio electromagnetic wave from a reader/writer 61 or the like used for communication (or power transmission) through an inductor (antenna) 62, this AC voltage itself is used as a charge recycle generator voltage for the IC card 60. Reference numeral 63 denotes a BDD logic circuit; 64, a rectifier power supply circuit for generating a DC supply voltage for a CMOS logic circuit 65; and 66, a capacitor. Reference symbol M denotes a transconductance.

[10th Embodiment]

Figure 25:
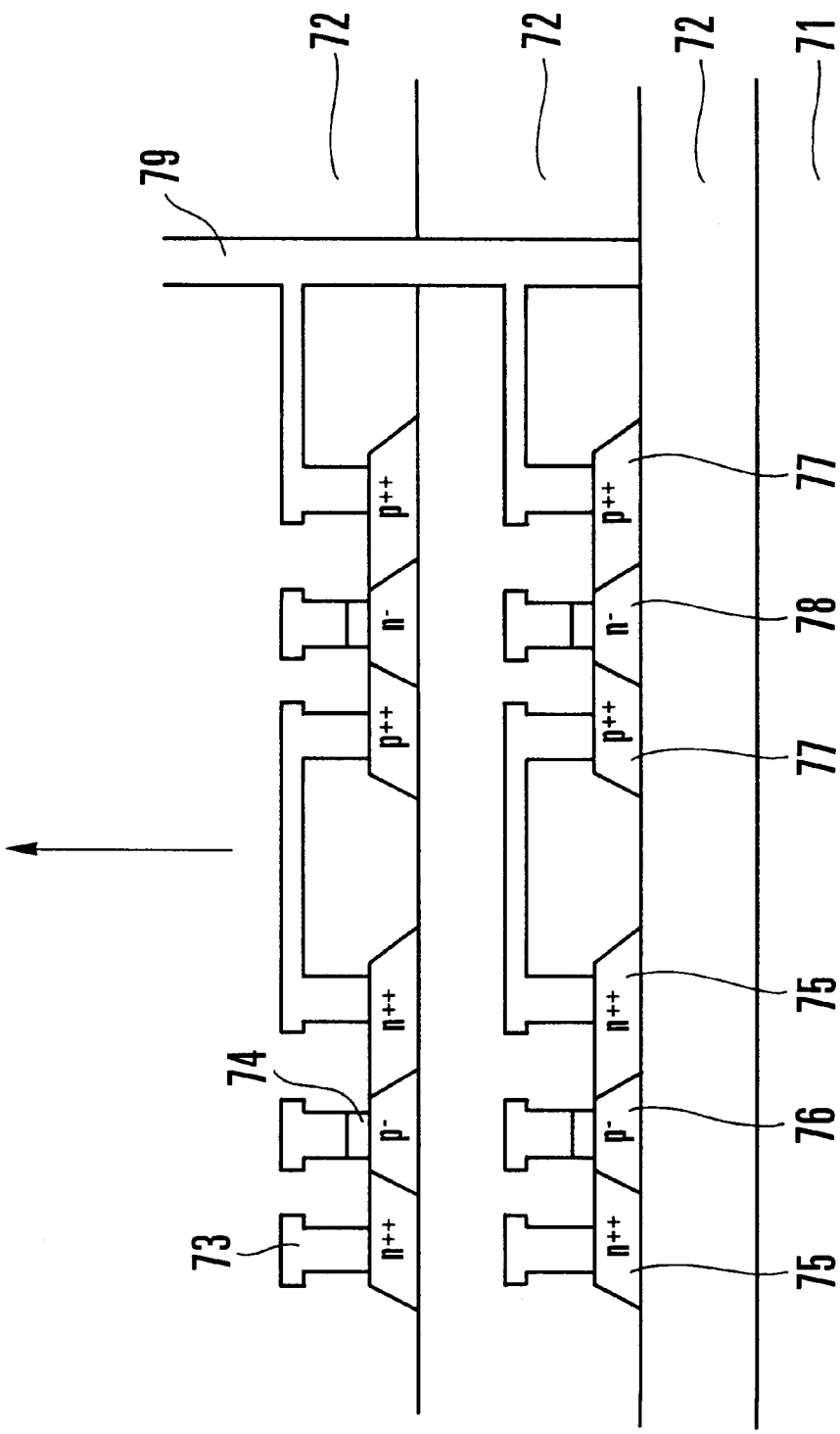
FIG. 25 is a sectional view showing part of a BDD logic circuit according to the 10th embodiment.

FIG. 25 shows part of a BDD logic circuit according to the 10th embodiment, in which complementary TFTs (Thin Film Transistors) are used as logic elements in place of complementary MOSFETs. FIG. 25 shows a circuit arrangement using such TFTs. This circuit can perform adiabatic charging and charge recycling. Each TFT operates slower than each MOSFET, and hence is regarded as a device suitable for adiabatic charging.

A three-dimensional, high-integration circuit can be formed by using these TFTs. This circuit arrangement allows elements to be connected in parallel with each other in the direction of thickness, and hence can attain a high logic processing speed. Referring to FIG. 25, reference numeral 71 denotes a substrate; 72, an insulating film; 73, a metal or polysilicon wire or gate; 74, a gate insulating film; 75, an n-type region serving as a source or drain; 76, a p-type region serving as a channel; 77, a p-type region serving as a source or drain; 78, an n-type region serving as channel; and 79, a global through hole.

In this case, the complementary TFTs are used to implement the BDD logic circuits (FIG. 7, 8, 13, 14, 15D, 17G, 18D, 20G) used in the second to seventh embodiments. As is obvious, however, this arrangement can also be applied to the BDD logic circuit of the first embodiment, which is not complementary, in FIGS. 1 to 3, 5, and 6.

[11th Embodiment]

Figure 26D:
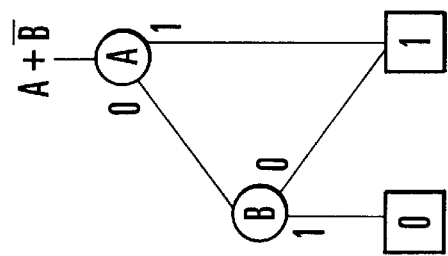
FIGS. 26A to 26E are views for explaining a combined BDD graph applied to a BDD logic circuit according to the 11th embodiment.
Figure 26C:
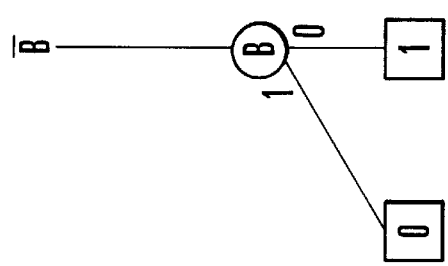
Figure 26B:
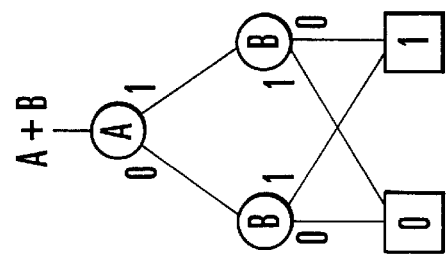
Figure 26A:
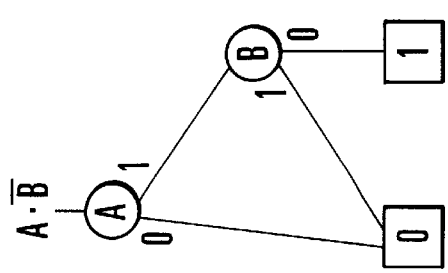
Figure 26E:
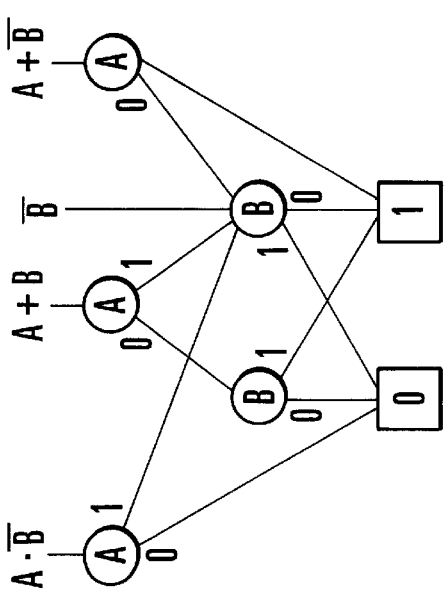

FIG. 26E explains a BDD graph used for a BDD logic circuit according to the 11th embodiment of the present invention. The BDD graph shown in FIG. 26E is obtained by combining the BDD graphs shown in FIGS. 26A to 26D.

Figure 27B:
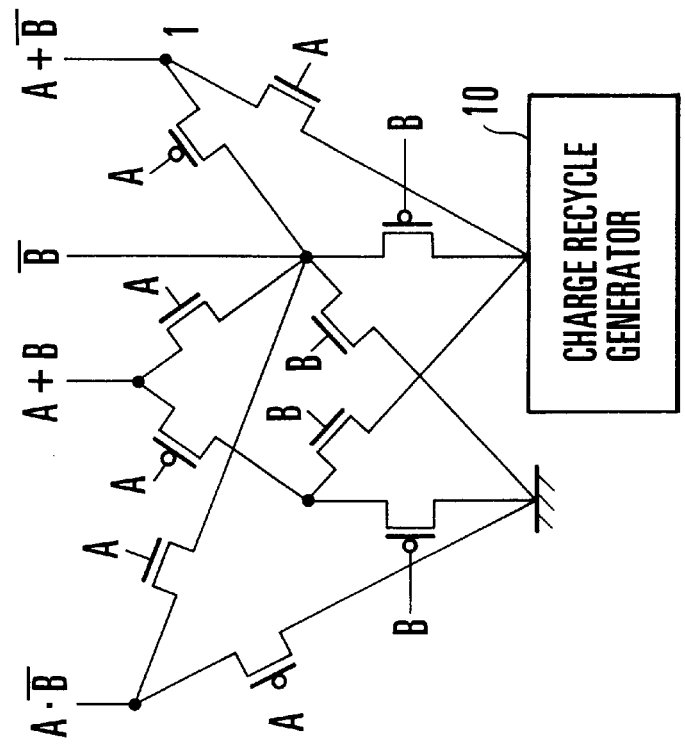
FIGS. 27A and 27B are circuit diagrams showing a BDD logic circuit according to the 11th embodiment.
Figure 27A:
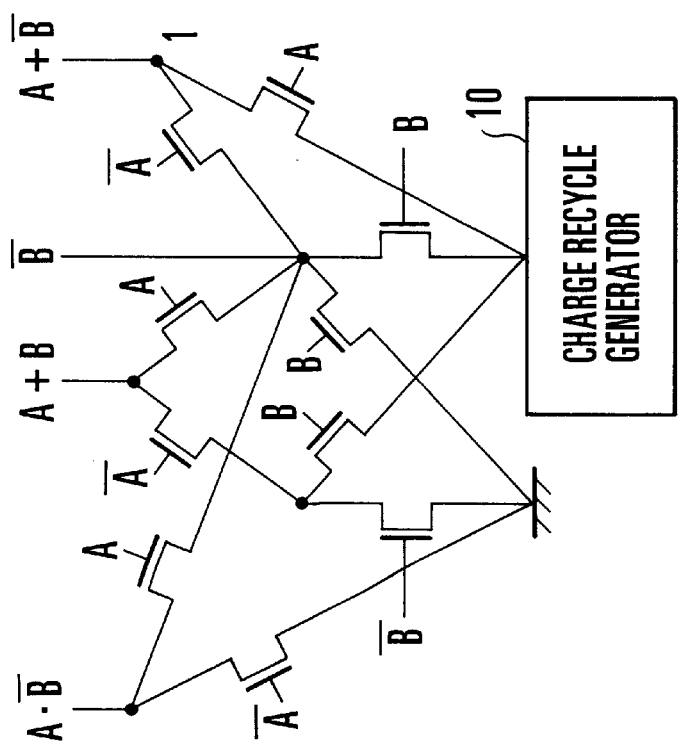

FIGS. 27A and 27B show BDD logic circuits using the combined BDD graph in FIG. 26E. By combining the respective BDD graphs in this manner, the number of transistors used for a BDD logic circuit can be decreased.

[12th Embodiment]

FIG. 28 shows the arrangement of a BDD logic circuit 30B according to the 12th embodiment of the present invention. This BDD logic circuit receives input signals A, *A, B, *B, C, and *C to extract carry outputs f=(AB+BC+CA) and *f=*(AB+BC+CA). In the BDD logic circuits 30B of the 12th embodiment and the subsequent embodiments, a charge recycle generator 10 is connected to a beginning point 1 to apply a supply voltage to it so as to respectively extract the output signals f and *f from "1" of an ending point 4 and "0" of an ending point 3. Note that the waveform of the voltage output from this charge recycle generator 10 includes, for example, a staircase waveform and an AC-like waveform (whose level smoothly changes without changing in polarity) like those shown in FIGS. 4A to 4E and 9C.

Figure 29A:
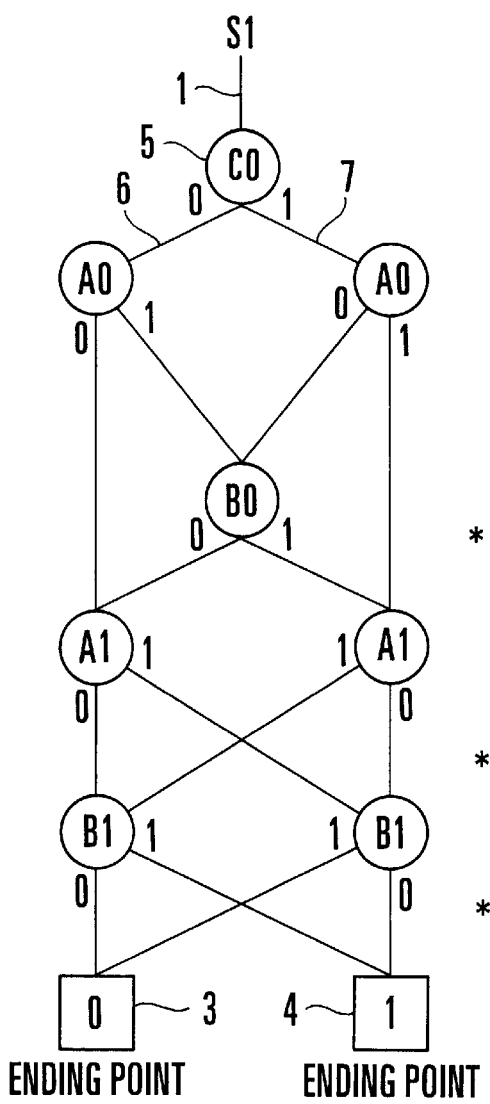
FIGS. 29A to 29C are circuit diagrams showing a BDD graph for a case wherein the BDD logic circuit in FIG. 28 is applied for computation of sums by a 2-bit adder, and a BDD logic circuit.
Figure 29B:
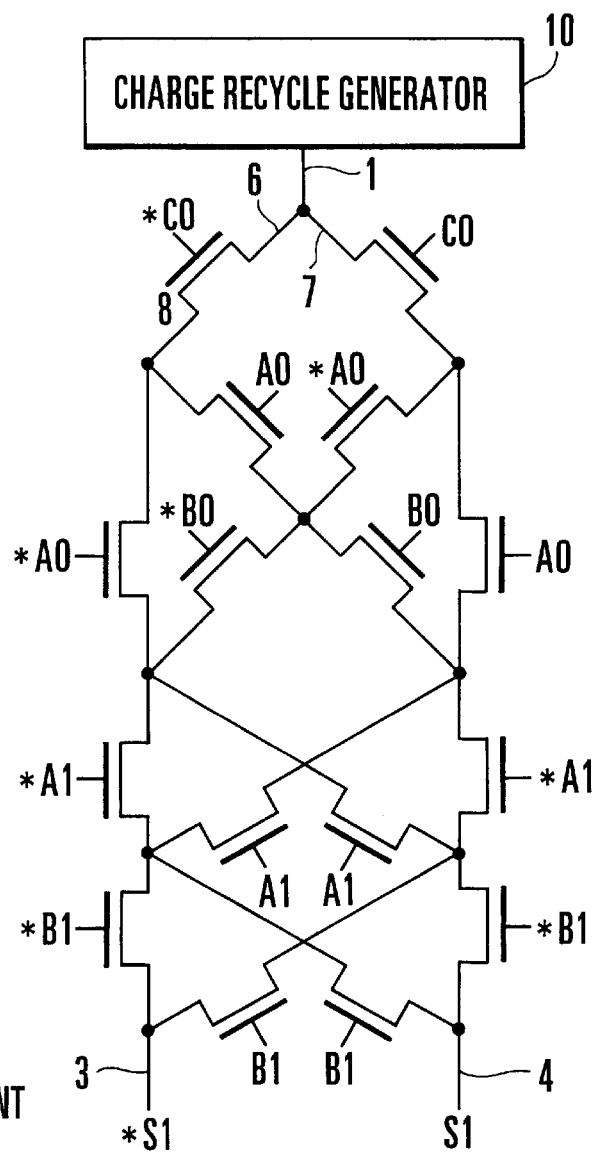
Figure 29C:
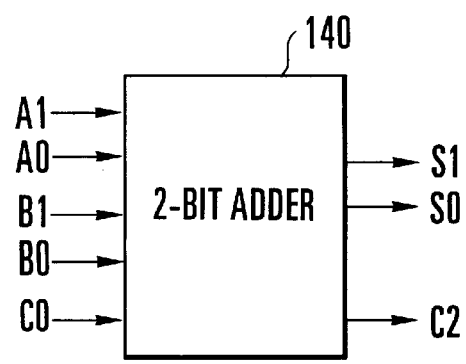

FIGS. 29A and 29B explain a case wherein two input signal bits A0 and A1, two input signal bits B0 and B1, and one carry bit C0 are input to a 2-bit adder 140 in FIG. 29C to output sum output signals S1 and *S1. In this case, FIG. 29A shows the BDD graph for this arrangement. FIG. 29B shows the logic circuit of the arrangement. FIG. 29C shows the relationship between the inputs and outputs of the adder 140.

Figure 30A:
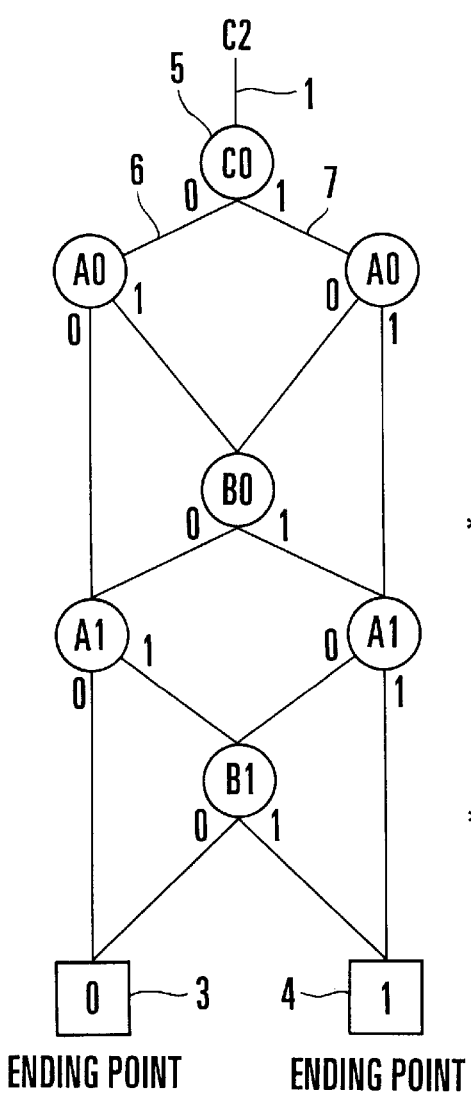
FIGS. 30A to 30C are circuit diagrams showing a BDD graph for a case wherein the BDD logic circuit in FIG. 28 is applied for computation of carries by a 2-bit adder, and a BDD logic circuit.
Figure 30B:
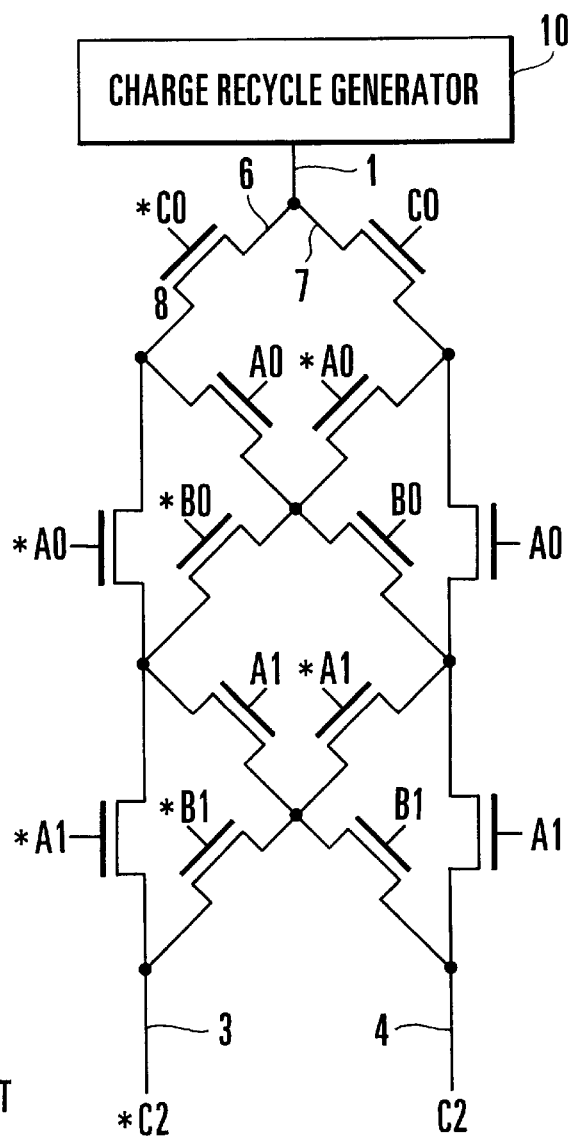
Figure 30C:
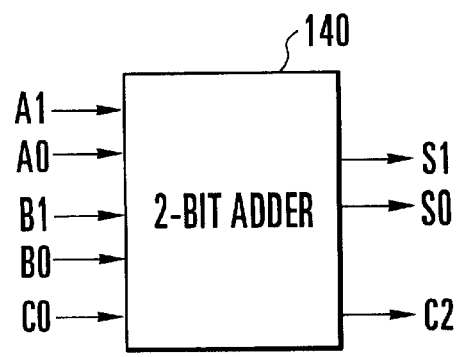

FIGS. 30A and 30B explain a case wherein two input signal bits A0 and A1, two input signal bits B0 and B1, and one carry bit C0 are input to a 2-bit adder 140 in FIG. 30C to output carry output signals C2 and *C2. In this case, FIG. 30A shows the BDD graph for this arrangement. FIG. 30B shows the logic circuit of the arrangement. FIG. 30C shows the relationship between the inputs and outputs of the adder 140.

In this case, as the charge recycle generator 10, an AC-like power supply circuit using an inductor and a capacitor or a power supply circuit that uses N-1 capacitors to generate an N-step staircase voltage can be used.

Figure 31:
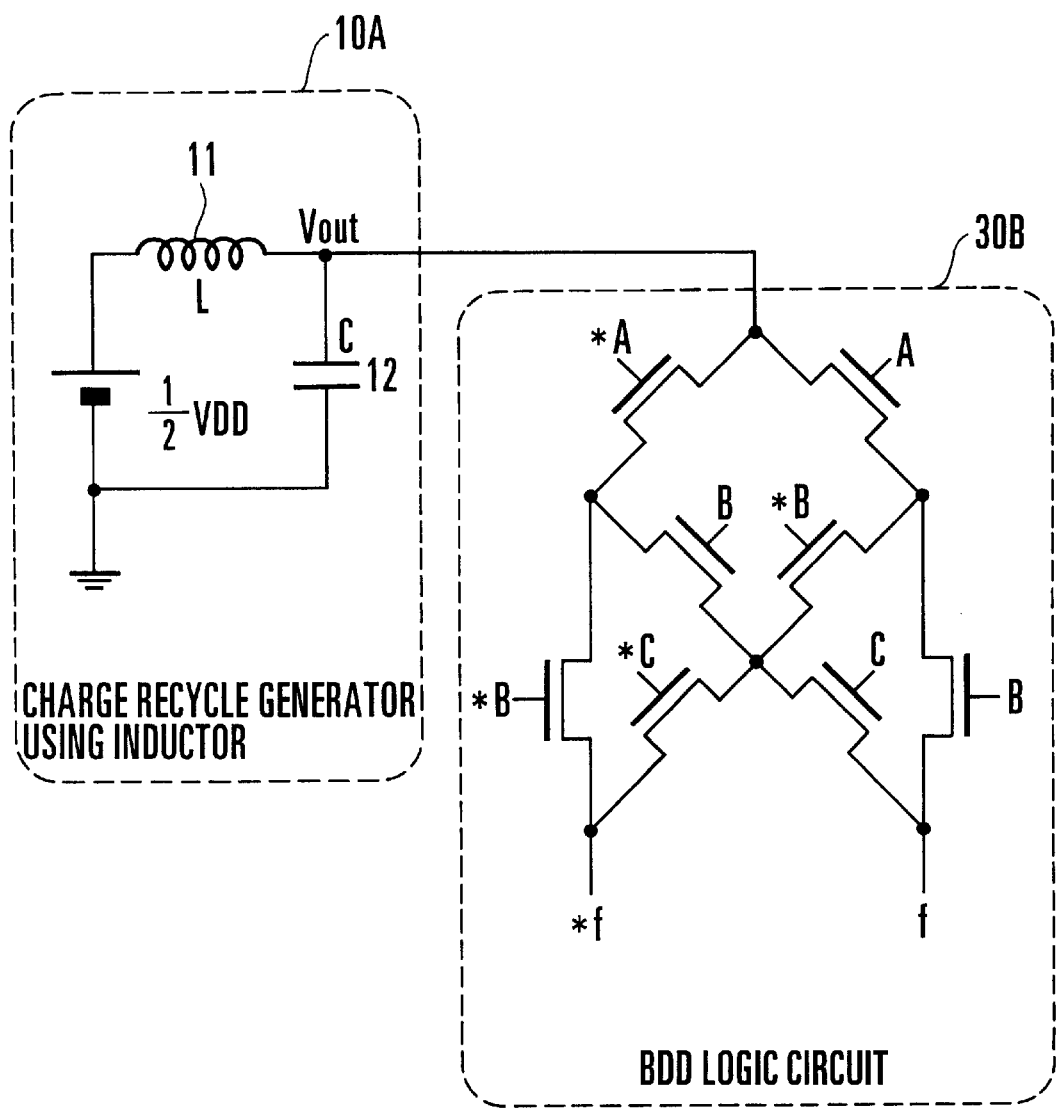
FIG. 31 is a circuit diagram showing a case wherein a power supply circuit using an inductor is used as a charge recycle generator for the BDD logic circuit in FIG. 28.

FIG. 31 shows an AC-like power supply circuit 10A using an inductor 11 and a capacitor 12.

Figure 32:
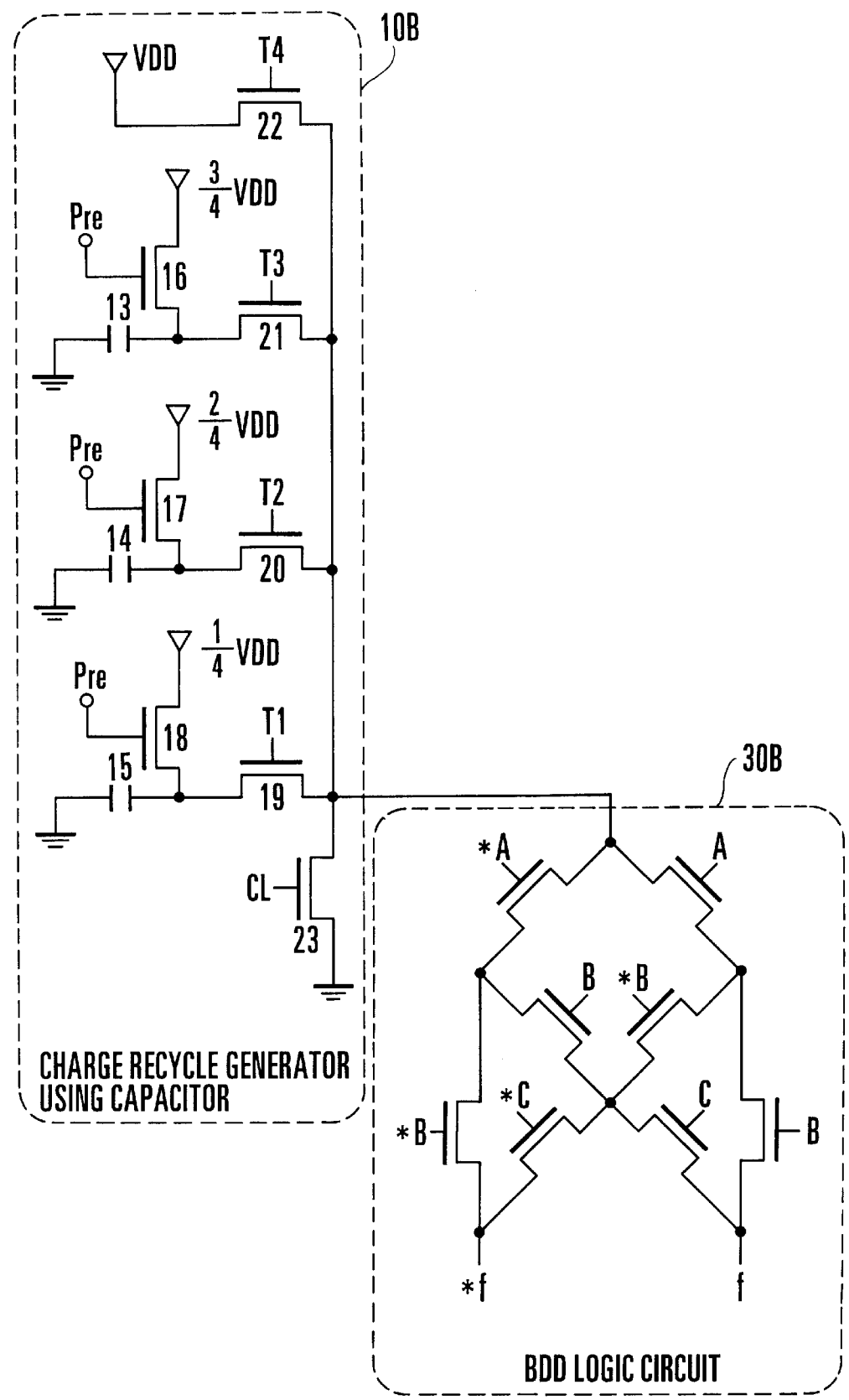
FIG. 32 is a circuit diagram showing a case wherein a power supply circuit for generating a staircase voltage is used as a charge recycle generator for the BDD logic circuit in FIG. 28.

FIG. 32 shows a power supply circuit 10B that uses three capacitors 13 to 15 to generate a 4-step staircase voltage. Referring to FIG. 32, reference numerals 16 to 23 denote n-channel MOSFETs. These power supply circuits 10A and 10B can make their output voltages moderately rise and fall.

The operation of the BDD logic circuit shown in FIG. 32 will be described next.

At time t=0, the input signals *A, *B, *C, A, B, and C are input to the gates of the respective n-channel MOSFETs of the BDD logic circuit. The output voltage from the charge recycle generator 10B is then made to moderately rise. With this operation, the BDD logic circuit can be adiabatically charged. With this charging operation, logic operation is performed to obtain output signals. After the charging operation, the output voltage from the charge recycle generator 10B is made to moderately fall. At this time, the charge stored in the BDD logic circuit is returned to the charge recycle generator 10B. At time t=T after the potential of the BDD logic circuit is set at Low, the next input signals are input to the gates. Subsequently, this operation is repeated at periods T to allow execution of adiabatic charging and charge recycling.

As described above, even if the number of gates increases to several hundreds or several thousands, since a common charge recycle generator is used, low power consumption can be realized even in a logic circuit having a complicated logic structure.

Since the detailed operation of the charge recycle generator 10B shown in FIG. 32 is the same as that described with reference to the timing charts of FIGS. 9A to 9H, a description thereof will be omitted.

In addition, since circuits for generating the respective input signals to be supplied to the charge recycle generator 10B are identical to those generated by the circuits shown in FIGS. 10A to 10F, a description thereof will be omitted.

Furthermore, this charge recycle generator 10B generates a voltage waveform identical to Vout in FIG. 9C described above, and applies it to the BDD logic circuit.

FIG. 33 shows an arrangement including a plurality of BDD logic circuits. Assume that this arrangement includes n BDD logic circuits $30_1$ to $30_n$ (n≧4), and the ith and jth BDD logic circuits are adjacent to each other (j=i+1). In this case, the respective BDD logic circuits are independently operated by optimal charge recycle generators $10_1$ to $10_n$. For example, as the power supply for the kth BDD logic circuit, a charge recycle generator with a frequency $f_k$ and a phase $\phi_k$ is used. Each BDD logic circuit requiring fast logic operation uses a charge recycle generator having an increased frequency $f_k$ whereas each BDD logic circuit that does not require fast logic operation uses a charge recycle generator having a decreased frequency $f_k$. This allows the respective BDD logic circuits to efficiently perform concurrent processing.

In addition, BDD logic circuits that can use supply voltages having the same frequency and the same phase share a charge recycle generator through power lines to decrease the number of power supply circuits, thereby realizing low power consumption.

Figure 34:
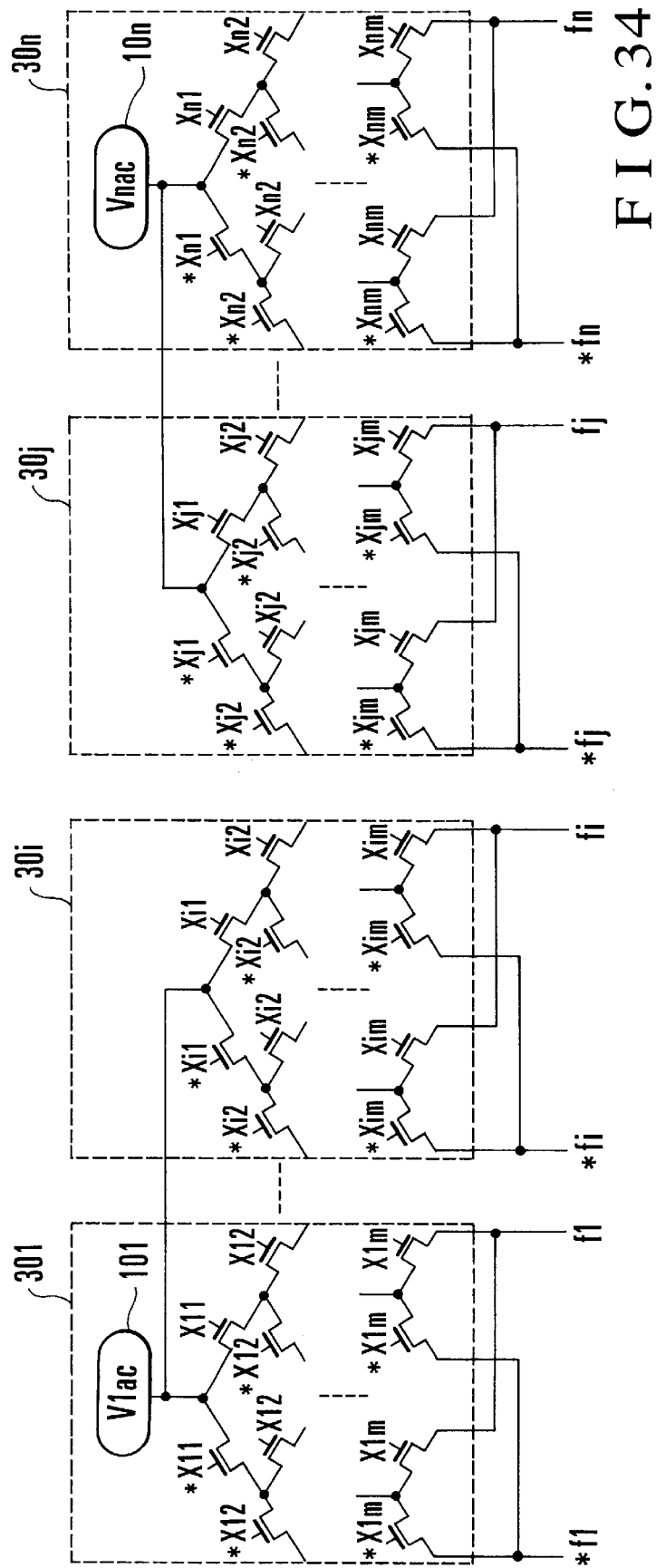
FIG. 34 is a circuit diagram showing a case wherein a plurality of BDD logic circuits are formed into two groups, and a common charge recycle generator is used for each group.

FIG. 34 shows an arrangement using common charge recycle generators. In this circuit arrangement, the 1st to ith supply voltages are applied from a common charge recycle generator $10_1$, and the jth to nth supply voltages are applied from a common charge recycle generator $10_n$.

[13th Embodiment]

Figure 35:
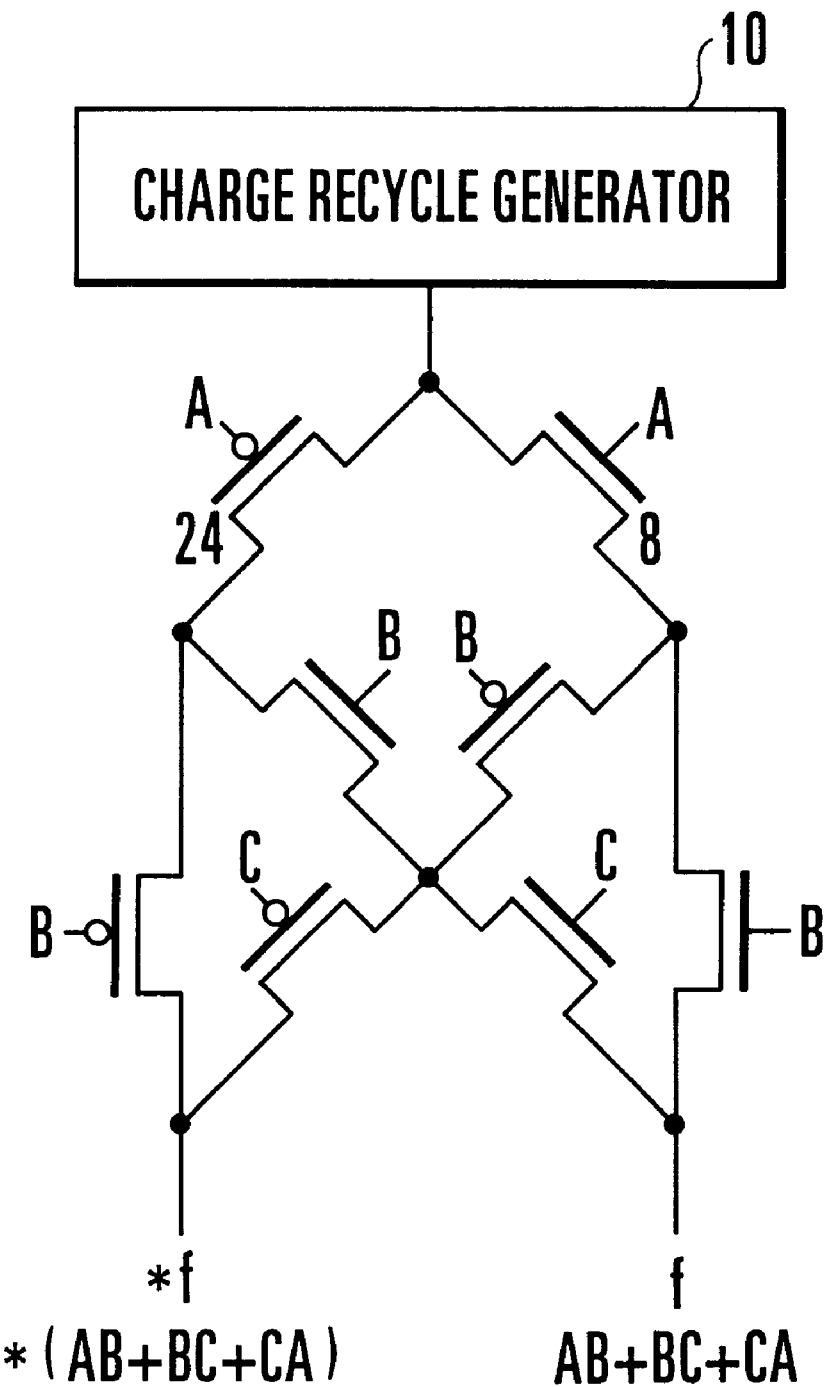
FIG. 35 is a circuit diagram showing a BDD logic circuit according to the 13th embodiment.

FIG. 35 shows a BDD logic circuit according to the 13th embodiment. According to this embodiment, in the BDD logic circuit shown in FIG. 28, of the n-channel MOSFETs 8 as logic elements, elements having gates to which the inverted signals *A, *B, and *C in FIG. 28 are input as input signals are replaced with logic elements complementary to these elements. More specifically, these elements are replaced with p-channel MOSFETs 24, and noninverted signals A, B, and C are input as input signals to their gates. With this arrangement, since only the noninverted signals A, B, and C can be used as input signals, one inverter for generating an inverted signal from a noninverted signal can be omitted from each circuit. Therefore, a circuit smaller in size and lower in power consumption than the circuit shown in FIG. 28 can be realized. The same applies to the BDD logic circuits shown in FIGS. 29B, 30B, 31, 32, 33, and 34.

[14th Embodiment]

Figure 36:
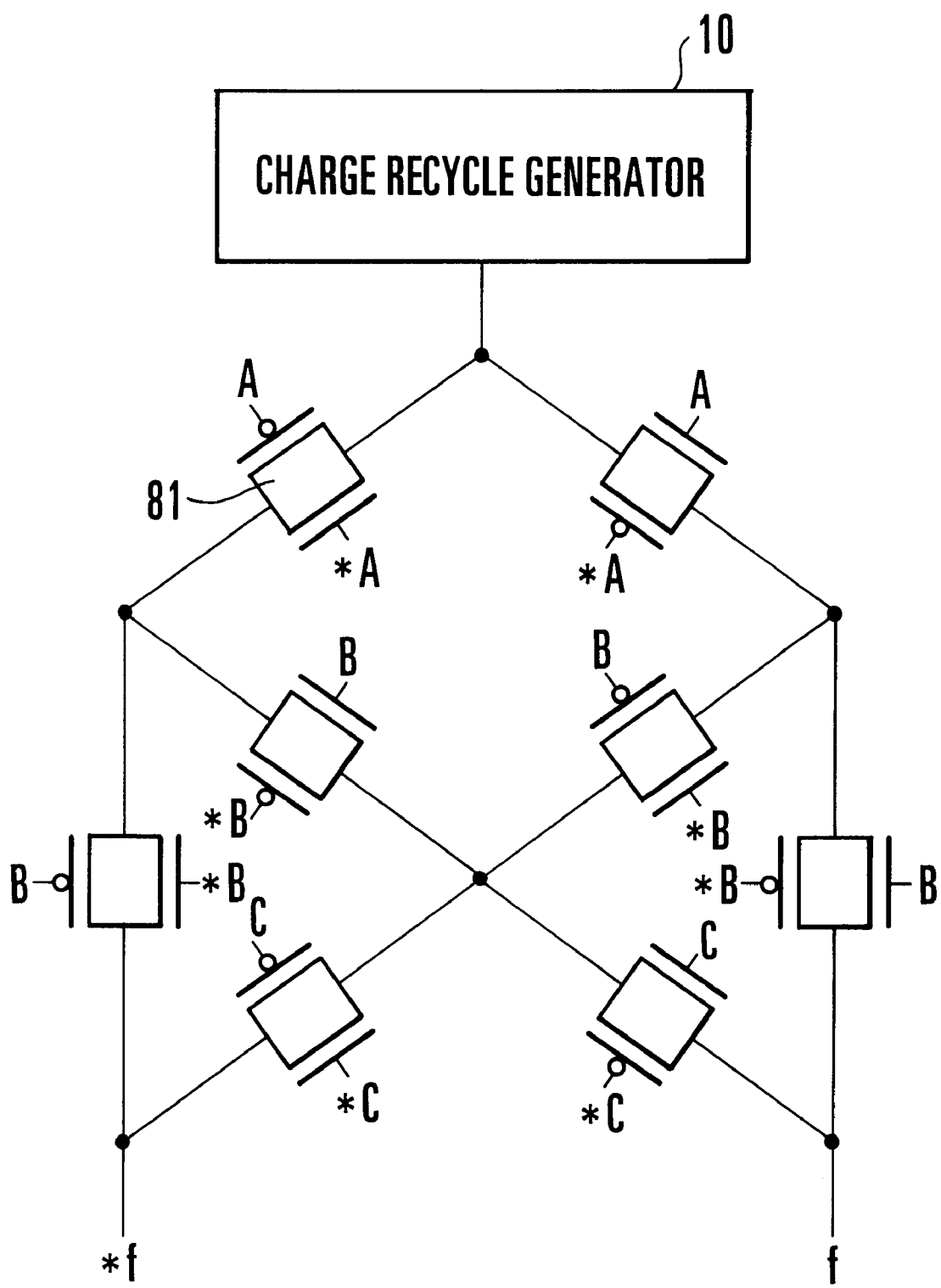
FIG. 36 is a circuit diagram showing a BDD logic circuit according to the 14th embodiment.

FIG. 36 shows a BDD logic circuit using a charge recycle generator according to the 14th embodiment of the present invention. In this case, the n-channel MOSFETs 8 serving as logic elements in the BDD logic circuit shown in FIG. 28 are replaced with transmission gates 81 each formed by connecting an n-channel MOSFET and p-channel MOSFET in parallel with each other. An input signal to each p-channel MOSFET is the inverted signal of an input signal to a corresponding n-channel MOSFET. With this arrangement, since a High-level signal obtained as an output signal rises from VDD-Vth (Vth is the threshold voltage of an n-channel MOSFET) to a supply voltage VDD, the voltage amplitude of the logic signal can be set to be large as compared with the circuit shown in FIG. 28. In an n-channel MOSFET, the propagation characteristic of a Low-level signal is good, but a High-level signal undergoes a voltage drop corresponding to the threshold voltage during propagation. This arrangement can prevent this. In a p-channel MOSFET, the propagation characteristic of a High-level signal is good, but that of a Low-level signal is poor. The transmission gates can solve these problems.

[15th Embodiment]

Figure 37:
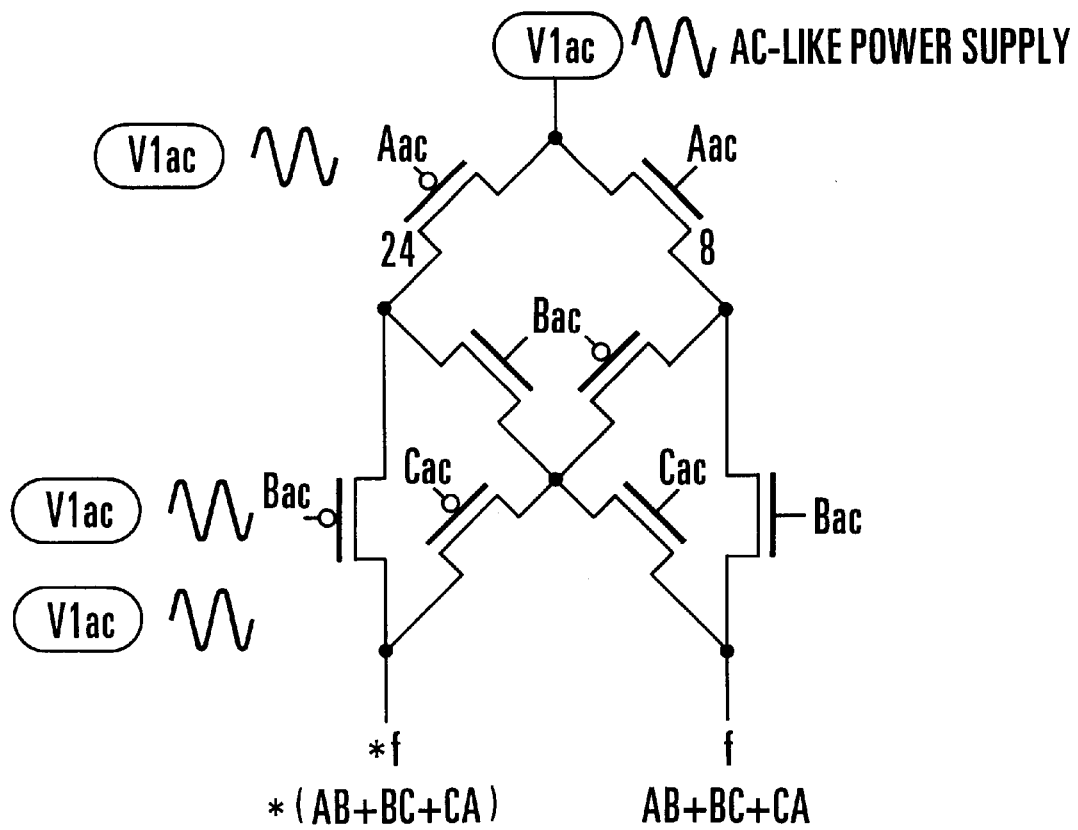
FIG. 37 is a circuit diagram showing a BDD logic circuit according to the 15th embodiment.
Figure 38A:
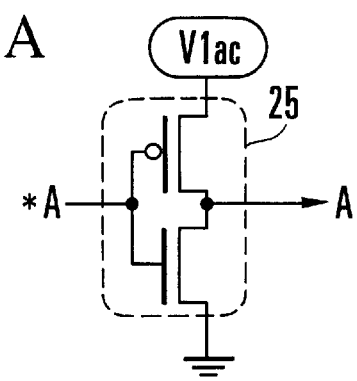
FIGS. 38A to 38D are circuit diagrams showing detailed arrangement of the circuit in FIG. 37.
Figure 38B:
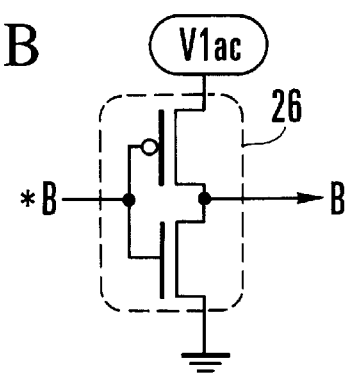
Figure 38C:
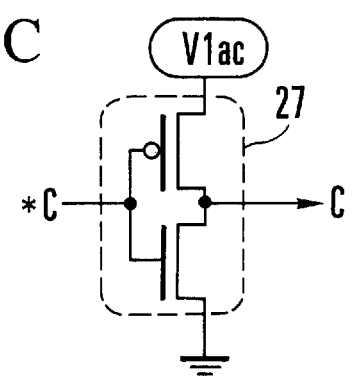
Figure 38D:
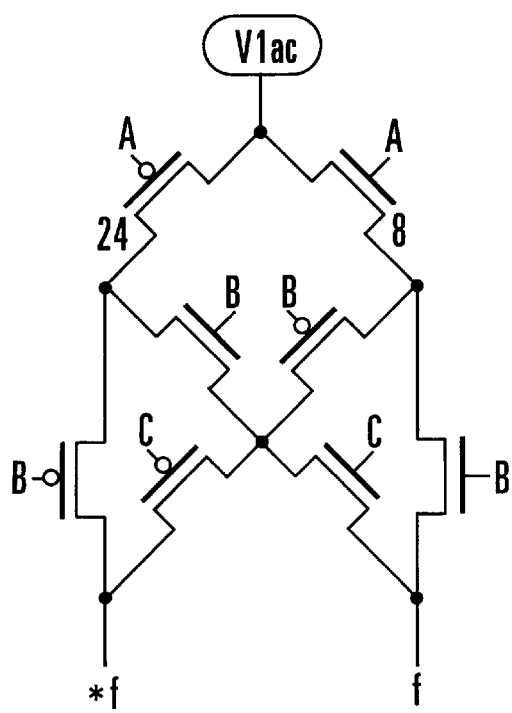

FIG. 37 shows a BDD logic circuit using a charge recycle generator according to the 15th embodiment. As this charge recycle generator, an AC-like power supply is used. To recycle the charge stored in the input gates, AC-like voltages Aac, Bac, and Cac, each having the same frequency and phase as those of an AC-like supply voltage V1ac, are applied to the input gates of the logic elements.

FIGS. 38A to 38D show a detailed circuit arrangement obtained by combining the circuit in FIG. 37 with inverters 25 to 27. In this case, the AC-like supply voltage V1ac is used as a supply voltage applied to the BDD logic circuit. The supply voltage applied to the inverter 25 for receiving an inverted signal *A and outputting a noninverted signal A is also the AC-like supply voltage V1ac, so is the supply voltage applied to each of the remaining inverters 26 and 27. In this case, as V1ac, a sine-wave voltage having an offset of 1 V (center voltage of 1 V) and an amplitude of 1 V is used. In addition, as each of inverted signals *A, *B, and *C, a signal whose Low and High levels are respectively set to 0 V and 2 V is used.

Although the sine-wave voltage is used as an AC-like voltage, the AC-like voltage is not limited to this. For example, as the voltage V1ac, a voltage having a triangular wave, a trapezoidal wave, or one of the voltage waveforms generated from a sine wave, which are shown in FIGS. 4A to 4E, can be used. As is obvious, a staircase voltage waveform (Vout in FIG. 9C) obtained by the power supply circuit 10B shown in FIG. 8 can also be used.

[16th Embodiment]

Figure 39A:
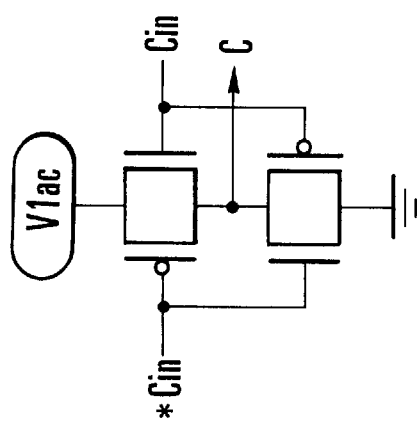
FIGS. 39A to 39G are circuit diagrams showing a BDD logic circuit according to the 16th embodiment.
Figure 39E:
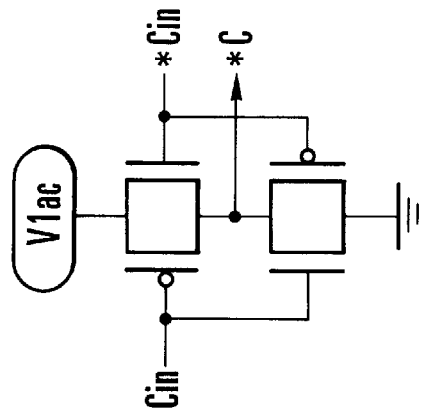
Figure 39C:
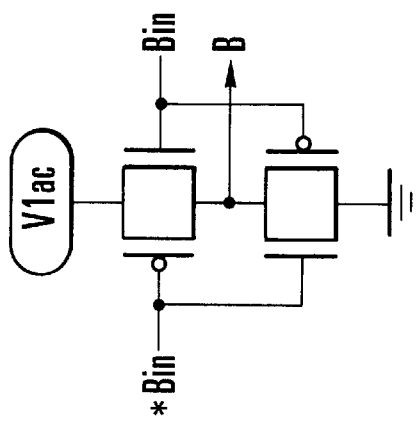
Figure 39D:
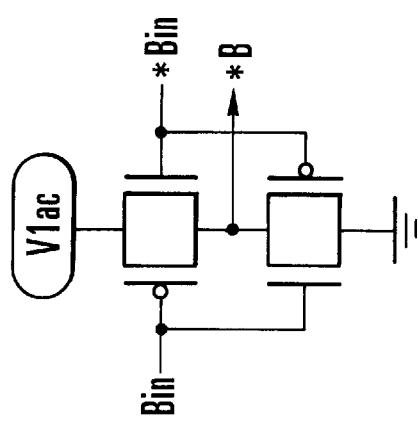
Figure 39B:
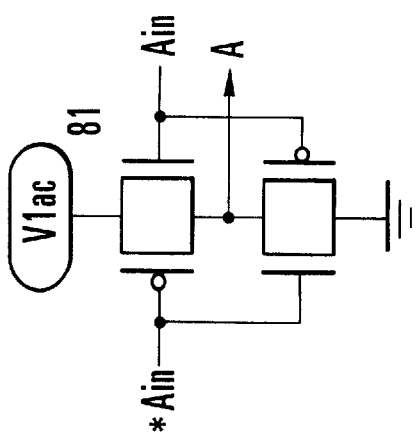
Figure 39F:
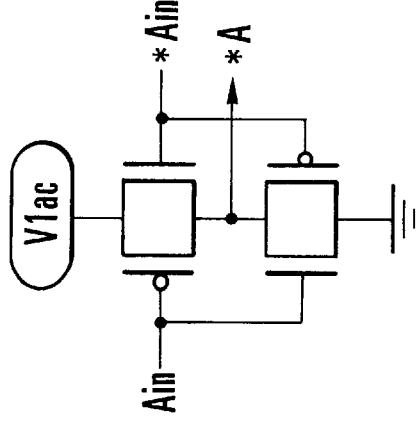

FIGS. 39A to 39G show a BDD logic circuit using a charge recycle generator according to the 16th embodiment. In this case, when an AC-like power supply V1ac is used as a charge recycle generator for the BDD logic circuit shown in FIG. 36, a circuit obtained by connecting transmission gates 81 in series with each other is used instead of each of the inverters 25 to 27 in FIGS. 38A to 38C. As shown in FIGS. 39A and 39B, the circuit receives logic signals Ain and *Ain and generates AC voltage signals A and *A. As shown in FIGS. 39C and 39D, the circuit receives logic signal Bin and *Bin and generates AC voltage signals B and *B. In addition, as shown in FIGS. 39E and 39F, the circuit receives logic signals Cin and *Cin and generates AC voltage signals C and *C. These AC-like voltages A, *A, B, *B, C, and *C are input to the BDD logic circuit to perform logic processing.

[17th Embodiment]

Figure 40A:
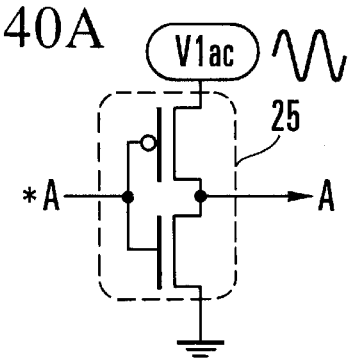
FIGS. 40A to 40D are circuit diagrams showing a BDD logic circuit according to the 17th embodiment.
Figure 40B:
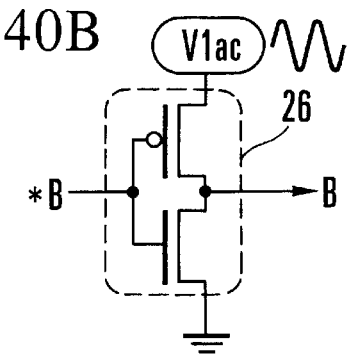
Figure 40C:
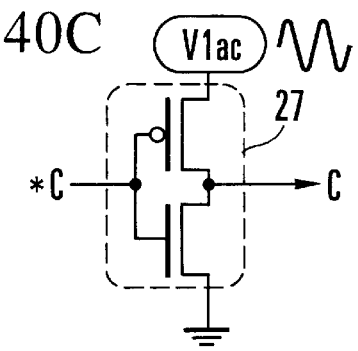
Figure 40D:
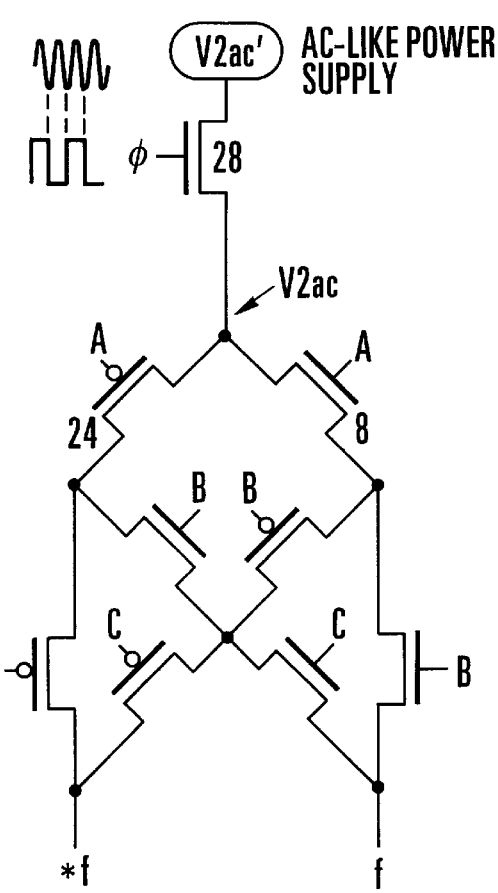
Figure 41A:
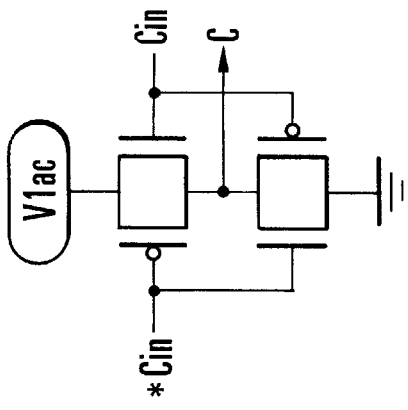
Figure 41B:
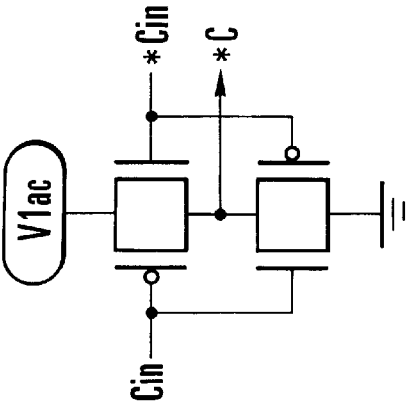
Figure 41C:
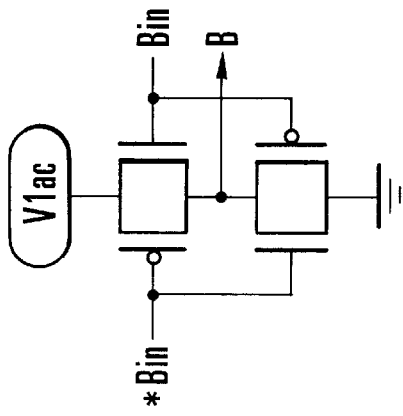
Figure 41E:
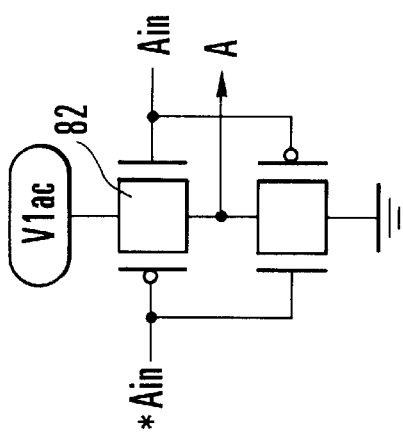
Figure 41F:
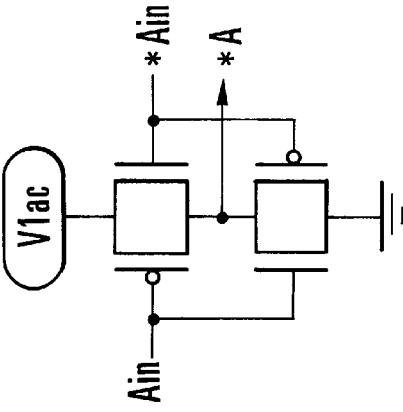
Figure 41G:
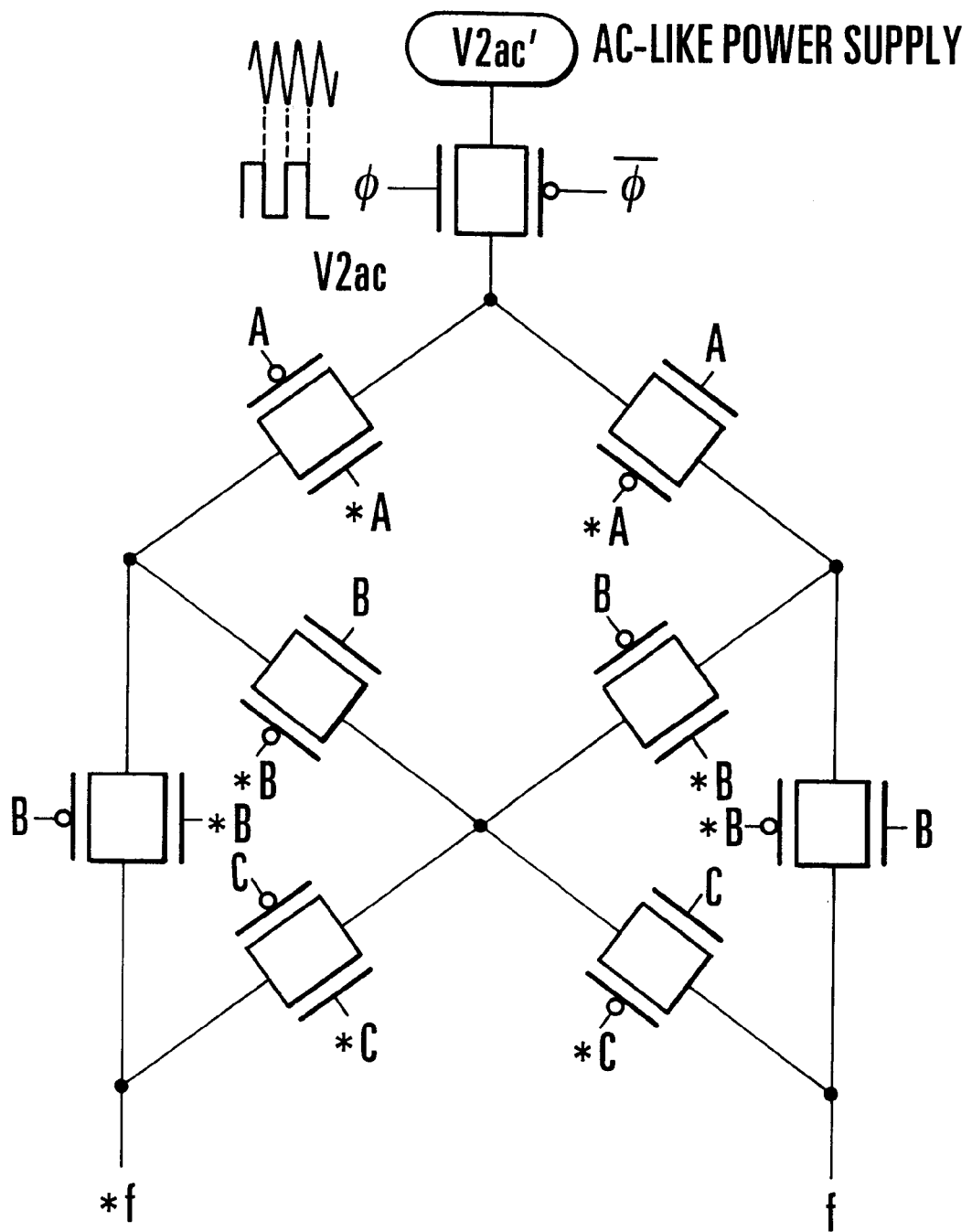

FIGS. 40A to 40D show a BDD logic circuit using a charge recycle generator according to the 17th embodiment, in which an AC-like voltage V1ac is used as an input voltage, and an AC-like voltage V2ac' is used as a power supply for the BDD logic circuit. This AC-like voltage V2ac' has a frequency twice that of the AC-like voltage V1ac. In addition, an n-channel MOSFET 28 having a switching function is connected between the BDD logic circuit and the AC-like voltage V2ac'. By supplying a clock signal φ (having the same frequency as that of the AC signal V1ac) to the gate of this n-channel MOSFET 28, as shown in FIG. 40D, the peaks of the AC-like voltage V2ac' are alternately extracted, thereby obtaining an AC-like voltage V2ac as a supply voltage.

[18th Embodiment]

Figure 39G:
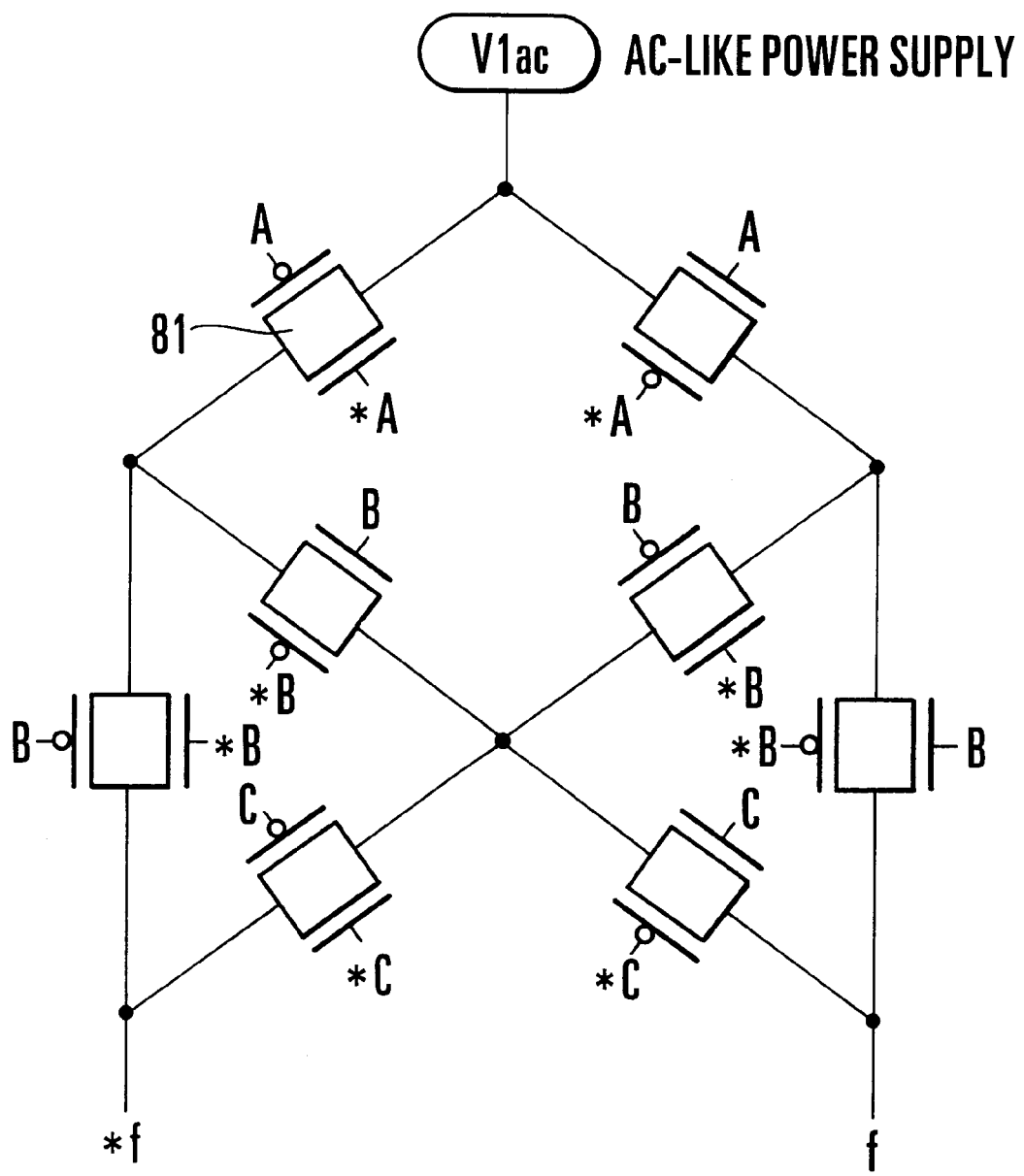

FIGS. 41A to 41G show a BDD logic circuit using a charge recycle generator according to the 18th embodiment, in which an AC-like voltage V1ac is used as an input voltage, and an AC-like voltage V2ac' is used for a charge recycle generator for the BDD logic circuit in FIG. 39G. Similar to the BDD logic circuit in FIG. 40D, this circuit uses an AC-like voltage V2ac as a supply voltage, which is obtained by alternately extracting the peaks of the AC-like voltage V2ac.

In the 18th embodiment and the 16th and 17th embodiments, as described above, the AC-like voltage need not be a sine-wave voltage. For example, a voltage having a trapezoidal or triangular waveform, an AC-like voltage based on a sine wave, or a voltage having a staircase waveform generated by the charge recycle generator 10B may be used. In addition, the relationship in timing between the AC-like voltages V1ac and V2ac can be arbitrarily set as long as the voltage V1ac rises earlier and falls later than the voltage V2ac.

[19th Embodiment]

Figure 42A:
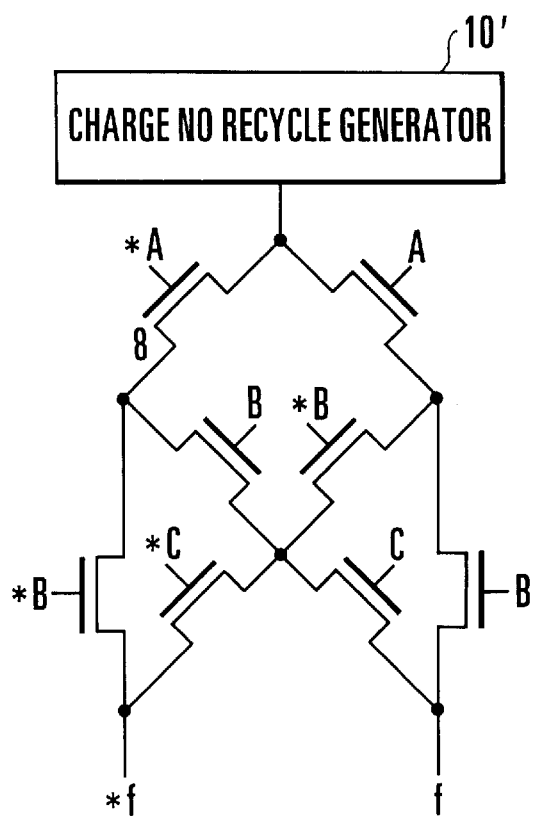
FIGS. 42A and 42B are views for explaining a BDD logic circuit according to the 19th embodiment.
Figure 42B:
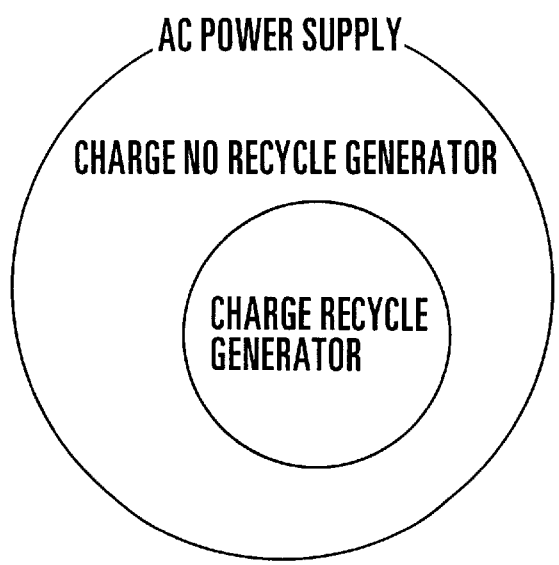

FIG. 42A shows a BDD logic circuit according to the 19th embodiment. In this case, the charge recycle generator 10 of the BDD logic circuit shown in FIG. 28 is replaced with a charge no recycle generator 10'. The charge no recycle generator 10' is an AC-like power supply that does not recycle power. FIG. 42B shows the relationship between an AC-like power supply, the charge recycle generator 10, and the charge no recycle generator 10'.

FIG. 43 shows a circuit including the charge no recycle generator 10'. In this case, the rectangular wave output from an inverter 35 is integrated by a resistor 36 and a capacitor 37 to generate an AC-like voltage that moderately rises and falls. Even with such an AC-like power supply that does not recycle power, since adiabatic charging can be performed, unlike a power supply using a rectangular wave, the power consumption can be reduced to ½.

Note that as the elements of the logic circuits of the 12th to 19th embodiments described above, TFTs that are very suitable for adiabatic charging can be used, as described above. In addition, as shown in FIG. 25, these elements can be three-dimensionally integrated.

Furthermore, the logic circuits of the 12th to 19th embodiments described above can be equally applied to the IC card 60 according to the ninth embodiment in FIG. 24.

[20th Embodiment]

FIG. 44A shows a D latch logic circuit 90 as a logic circuit according to the 20th embodiment of the present invention. This circuit 90 is made up of two transmission gates 91 and 92 and cross-connected transmission gates 93 and 94 and inverters 95 and 96 which constitute a storage circuit.

In this case, as a supply voltage for each of the inverters 95 and 96, a voltage V3ac whose waveform moderately rises and falls as shown in FIG. 44B is used. As clock signals, a voltage V4ac, which rises after the voltage V3ac falls, falls before the voltage V3ac rises, moderately rises and falls, and has a small duty, and an inverted voltage *V4ac are used, as shown in FIG. 44C. These voltages V3ac and V4ac are generated by using the oscillation type power supply circuit 10A in FIG. 2, which is a combination of an inductor and a capacitor, the staircase power supply circuit 10B in FIGS. 3 and 8, which uses a plurality of capacitors to generate a staircase voltage by switching and charging/discharging the capacitors, a charge recycle generator such as a power supply circuit for generating a voltage by using one or a plurality of sine waves as shown in FIGS. 4A to 4E, or an AC voltage obtained by an inductor for inducing the electromagnetic wave as described with reference to FIG. 24. In addition, waveforms (obtained by shifting the phase of V2ac from that of V1ac by 180°) similar to those shown in FIGS. 21A to 21H can be used. Furthermore, a charge no recycle generator 10' (FIGS. 22A and 23) can be used to generate the voltage V3ac and V4ac.

In this D latch logic circuit 90, while the voltage V4ac changes like Low→High→Low, the transmission gates 91 and 92 are temporarily turned on. At this time, the signals input to nodes 97 and 98 are transferred to nodes 99 and 100. When the voltage V4ac changes from High to Low, the transmission gates 91 and 92 are turned off, and the transmission gates 93 and 94 are turned on. As a result, the circuit is set in the storage mode. In the storage mode, since V3ac=0 at first, even if the output signals from nodes 102 and 103 should be set at High, the potentials of the nodes have decreased to the voltage Vth (the threshold voltage of p-channel MOSFETs constituting the inverters 95 and 96). When the output signals are to be set at Low, the potentials of the nodes remain at 0 V.

When the voltage V3ac rises from 0 V to a supply voltage VDD, the potentials of the nodes 102 and 103 set at the threshold Vth slowly rise to the supply voltage VDD. When the voltage V3ac rises from VDD to 0 V afterward, the potentials of the nodes 102 and 103, which have been set at the supply voltage VDD, decrease to the threshold voltage Vth.

With this process, adiabatic charging is performed while the voltage V3ac rises from the threshold voltage Vth to the supply voltage VDD. If a charge recycle generator is used to generate the voltage V3ac, the charge is adiabatically recycled to the V3ac power supply side while the voltage V3ac drops from the supply voltage VDD to the threshold Vth. Such adiabatic charging and charge recycling are also executed at the transmission gate portion driven by the voltages V4ac and *V4ac in the same manner as described above.

Figure 45A:
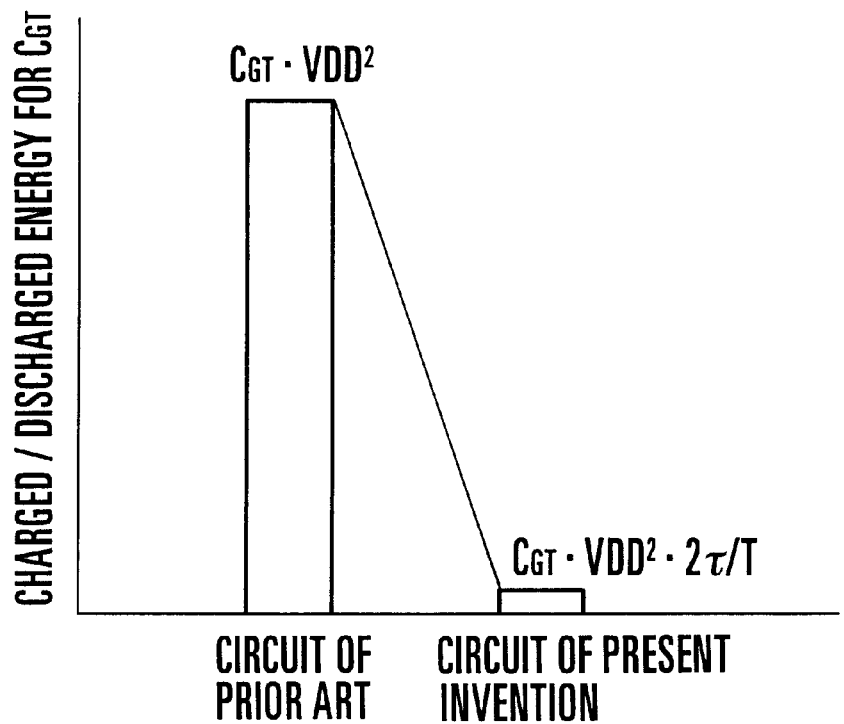
FIGS. 45A and 45B are graphs for comparing/explaining charged/discharged energy at clock portions and storage circuit portions in the present invention and the prior art.
Figure 66:
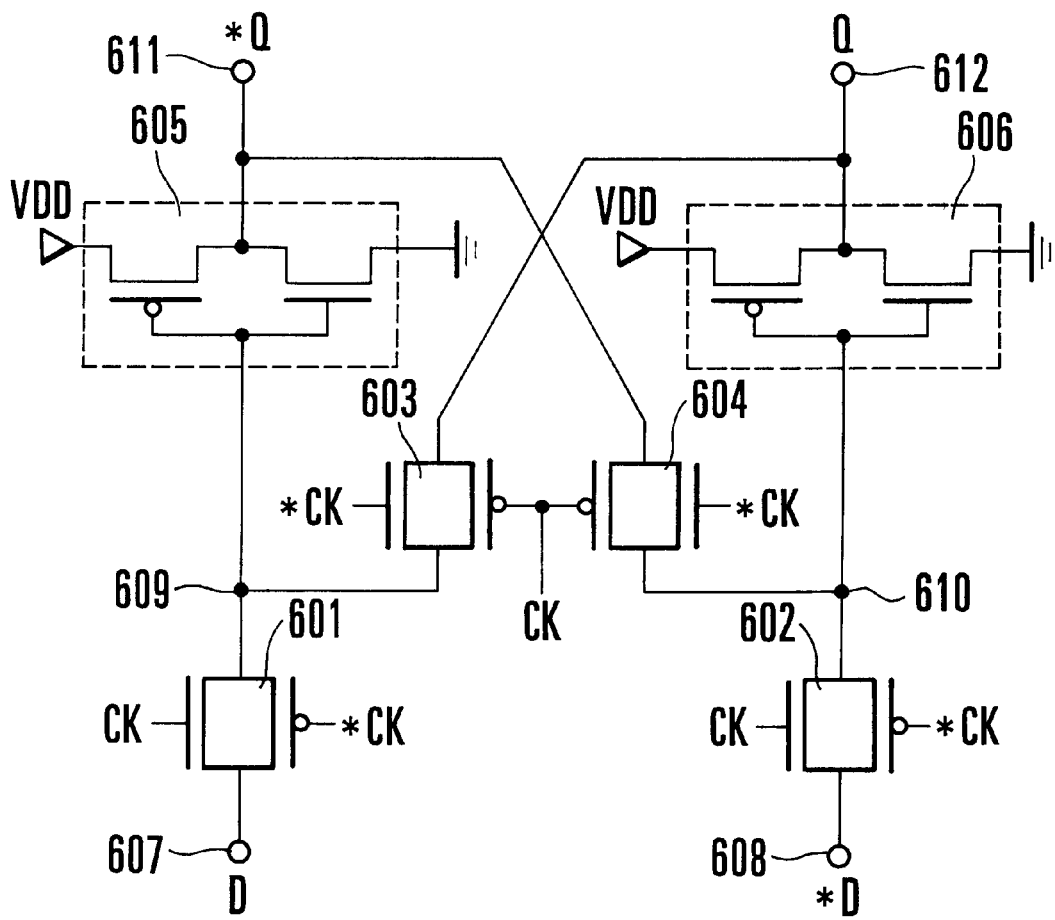
FIG. 66 is a circuit diagram showing a conventional D latch logic circuit.

As described above, in the conventional circuit (FIG. 66), the energy required for charging at the portion (transmission gates 91 to 94) driven by clock signals is $C_{TG}VDD^2$, whereas the energy required for charging in the circuit of the present invention is $C_{TG}VDD^2 \cdot 2\tau/T$, i.e., $2\tau/T$ times the energy in the conventional circuit. In this case, $\tau$ is the CR time constant of the circuit that is charged by the voltage V4ac, and T is the rise time (fall time) of the voltage V4ac. If, therefore, $\tau < T$ is set to perform charging/discharging sufficiently slowly, the energy can be sufficiently reduced, as shown in FIG. 45A. This allows a reduction in power consumption.

Figure 45B:
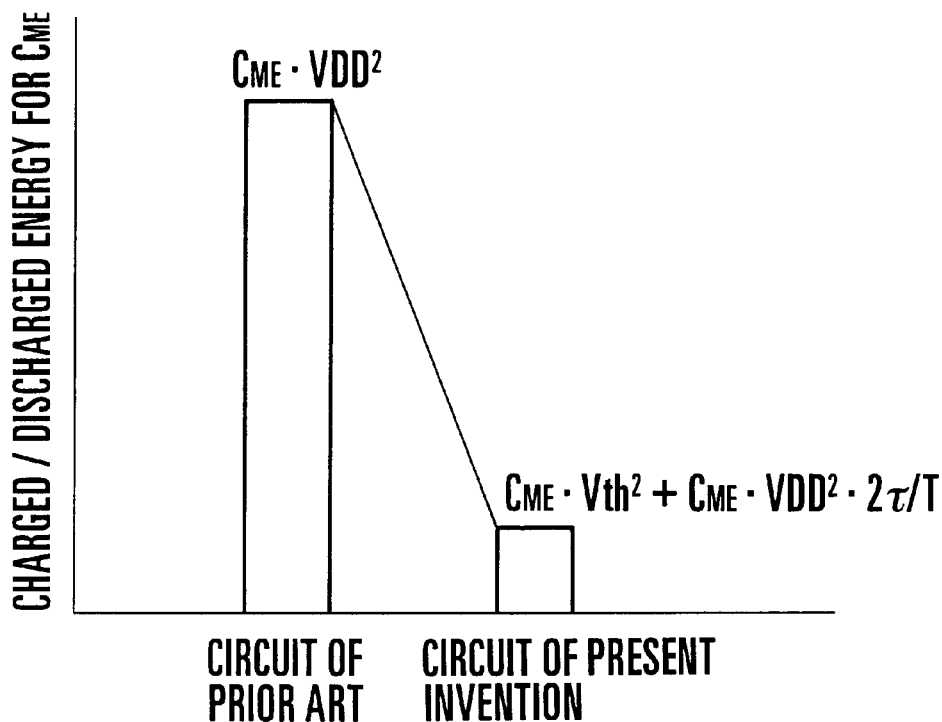

On the other hand, the charge energy in the portion associated with a storage circuit in the circuit of the present invention can be reduced from $\frac{1}{2} \cdot C_{ME}VDD^2$ in the conventional circuit to $\frac{1}{2} \cdot C_{ME}Vth^2$ because information is stored at Vth instead of VDD. Therefore, the energy required to charge/discharge this portion, which is $C_{ME}VDD^2$ in the conventional circuit as described above, becomes $C_{ME}Vth^2 + C_{ME}VDD^2 \cdot 2\tau/T$ (FIG. 45B). Note that T and $\tau$ are equal to those in the portion driven by clock signals.

As is obvious from the above description, the D latch logic circuit 90 allows a reduction in power consumption at both the transmission gate portion and the storage circuit portion.

[21st Embodiment]

FIG. 46 shows a D latch logic circuit according to the 21st embodiment of the present invention. In this circuit, the outputs of charge recycle type BDD logic circuits 110 and 120 are connected to the nodes 97 and 98 on the input side of the D latch logic circuit 90 in FIG. 44A.

Figure 47A:
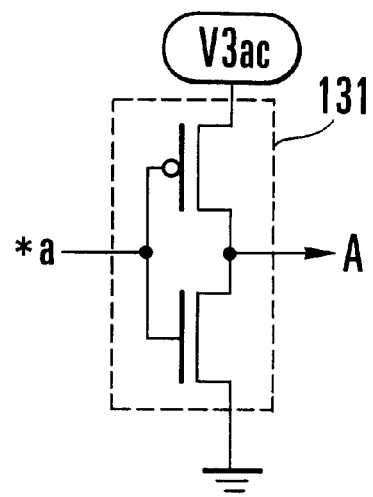
FIGS. 47A to 47C are circuit diagrams showing circuits for generating signals A, B, and C in the circuit in FIG. 46.
Figure 47B:
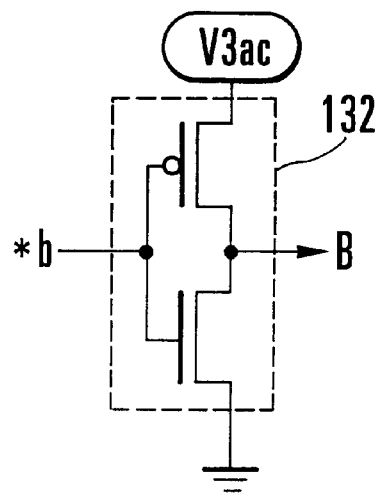
Figure 47C:
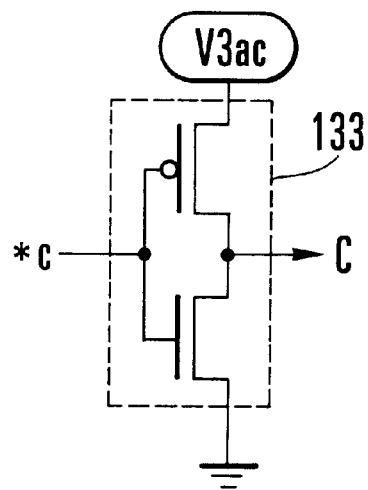
Figure 51A:
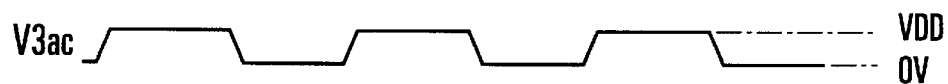
FIGS. 51A to 51D are timing charts showing voltage waveforms in the circuit in FIG. 50.
Figure 51B:
Figure 51C:
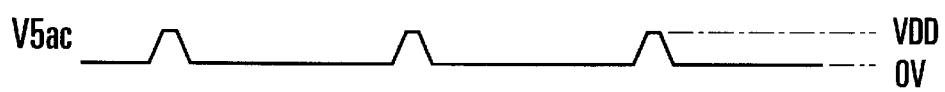
Figure 51D:

The BDD logic circuits 110 and 120 are formed by combining n-channel MOSFETs 8 and p-channel MOSFETs 24. Signals A, B, and C to be applied to the gates of these MOSFETs are obtained by waveform conversion of input signals *a, *b, and *c, each having a rectangular wave, (inverting each signal and making the rising and falling slopes correspond to the rising and falling slopes of a voltage V3ac) by using inverters 131 to 133 to which the voltage V3ac is applied as a supply voltage, as shown in FIGS. 47A to 47C.

In this case, the p-channel MOSFETs 24 are connected between the outputs of the BDD logic circuits 110 and 120 and nodes 97 and 98 of the D latch logic circuit 90 in FIG. 46, and an inverted voltage *V5ac of a voltage V5ac having a waveform like the one shown in FIG. 48B is applied to the gate of each p-channel MOSFET 24. This voltage V5ac is also generated by the charge recycle generator or the charge no recycle generator described above. This voltage has a waveform that rises later and falls earlier than the voltage V3ac in FIG. 48A, and is also applied to one of the ending points of the BDD logic circuit 110 and the other ending point of the BDD logic circuit 120.

The operation of the BDD logic circuit shown in FIG. 46 will be described next.

First of all, the input signals A, B, and C are input to the BDD logic circuits 110 and 120 while changing to High and Low in synchronism with the voltage V3ac. When the voltage V5ac rises, supply voltages are applied to the BDD logic circuits 110 and 120. In these circuits, logic processing is performed (Exclusive OR (XOR) of the signals A, B, and C is performed in the BDD logic circuit 110, and Exclusive NOR (XNOR) of the signals A, B, and C is performed in the BDD logic circuit 120), and the logic processing results (Low-level or High-level signals) are transferred to the nodes 97 and 98 in synchronism with the leading edge of the voltage V5ac. Thereafter, the voltage V5ac falls. At this time, the signals are stored in the nodes 97 and 98. After the voltage V5ac falls, the voltage V3ac also falls. As a result, the input signals A, B, and C at the BDD logic circuits 110 and 120 fall.

When a voltage V4ac rises, transmission gates 91 and 92 are turned on, and the signals at the nodes 97 and 98 are transferred to nodes 99 and 100. Subsequently, the same operation as that of the circuit in FIG. 44A is performed in the D latch logic circuit 90 to output the inverted signals of the signals input to the nodes 97 and 98 to nodes 102 and 103 in synchronism with the voltage V3ac. A signal Q or an inverted signal *Q output from each of the nodes 102 and 103 can be used as an input signal to a D latch logic circuit on the next stage, which has the same arrangement as that described above, or as one of the input signals A, B, and C to the BDD logic circuits 110 and 120.

FIGS. 48D to 48H explain a case wherein the outputs from the D latch logic circuit 90 are input to the BDD logic circuits 110 and 120.

As described above, in the logic circuit according to the 21st embodiment, logic processing is performed in the BDD logic circuits 110 and 120 by adiabatic charging and charge recycling, and the processing results are input to the D latch logic circuit 90 to be subjected to logic processing by adiabatic charging and charge recycling in the same manner as described above. Since the output signals can be sent to another circuit on the next stage or the input sides of the BDD logic circuits 110 and 120, low power consumption can be realized.

[22nd Embodiment]

FIG. 49A shows a D latch logic circuit according to the 22nd embodiment of the present invention, in which an inverter circuit 130 constituted by inverters 104 and 105 is connected to the nodes 102 and 103 of the D latch logic circuit 90 shown in FIG. 44A. Referring to FIG. 44A, reference numerals 106 and 107 denote output nodes.

As shown in FIG. 49C, a supply voltage V6ac applied to each of the inverters 104 and 105 moderately rises and falls, and rises later and falls earlier than a voltage V3ac in FIG. 49B. This supply voltage V6ac is also generated by the charge recycle generator or charge no recycle generator described above.

Assume that a load having a very large capacitance is connected to the output nodes 102 and 103 of the D latch logic circuit 90 without the inverter circuit 130. In this case, even when the node 102 or 103 should be set at High by a signal transferred through a transmission gate 93 or 94 (since V3ac=0 V in this case, the node is set at a threshold Vth as described above), the node instantaneously becomes 0 V. This potential is transferred to the load side. This may cause a data retention error.

In contrast to this, in this embodiment, the inverter circuit 130 is connected to the nodes 102 and 103, and a load having a large capacitance is connected to the nodes 106 and 107 of the inverter circuit 130. With this arrangement, since the nodes 106 and 107 do not directly receive the signals transferred through the transmission gates 93 and 94, data can be properly retained.

[23rd Embodiment]

FIG. 50 shows a D latch logic circuit according to the 23rd embodiment of the present invention, in which the BDD logic circuits 110 and 120 shown in FIG. 46 are connected to the nodes 97 and 98 on the input side of the D latch logic circuit 90 shown in FIG. 49A.

In this embodiment, voltages V3ac, V4ac, V5ac, and V6ac having timings and waveforms like those shown in FIGS. 51A to 51D are used. Of these voltages, the voltage V5ac has a waveform that rises later and falls earlier than that of the voltage V6ac, and the voltage V6ac has a waveform that rises later and falls earlier than that of the voltage V3ac.

As a result, processing contents (XOR and XNOR) of signals A, B, and C input to the respective MOSFETs of the BDD logic circuits 110 and 120 are output to nodes 97 and 98 in synchronism with the voltage V5ac, and then transferred to nodes 99 and 100 in synchronism with the voltage V4ac, the nodes 102 and 103 in synchronism with the voltage V3ac, and nodes 106 and 107 in synchronism with the voltage V6ac. The signals obtained at the nodes 106 and 107 can be used as input signals to the BDD logic circuits 110 and 120.

[24th Embodiment]

Figure 52A:
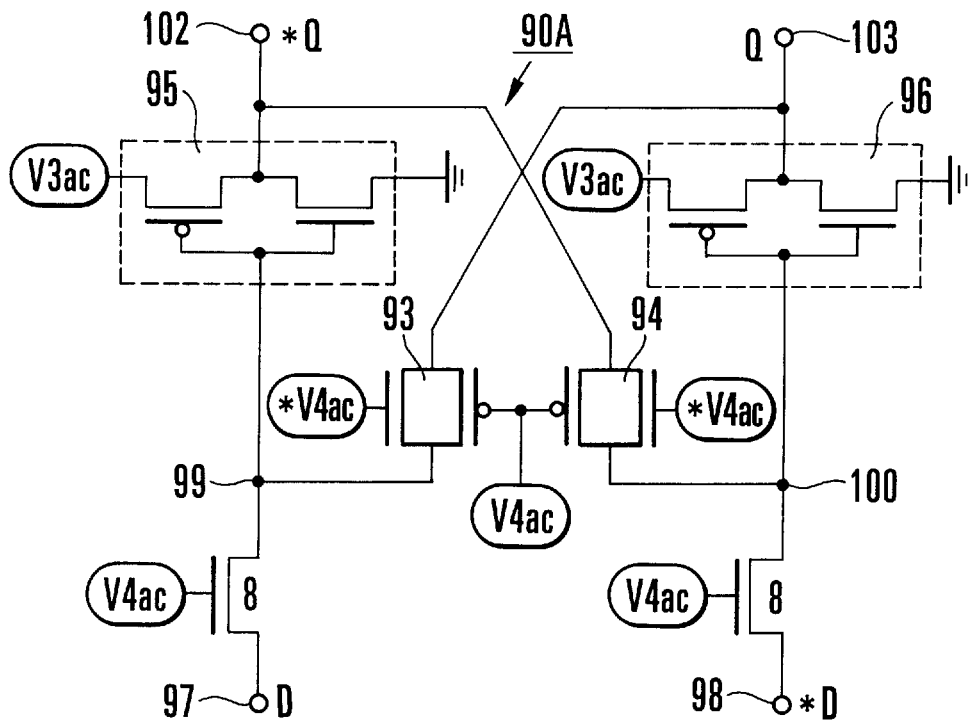
FIGS. 52A and 52B are circuit diagrams each showing a D latch logic circuit according to the 24th embodiment.
Figure 52B:
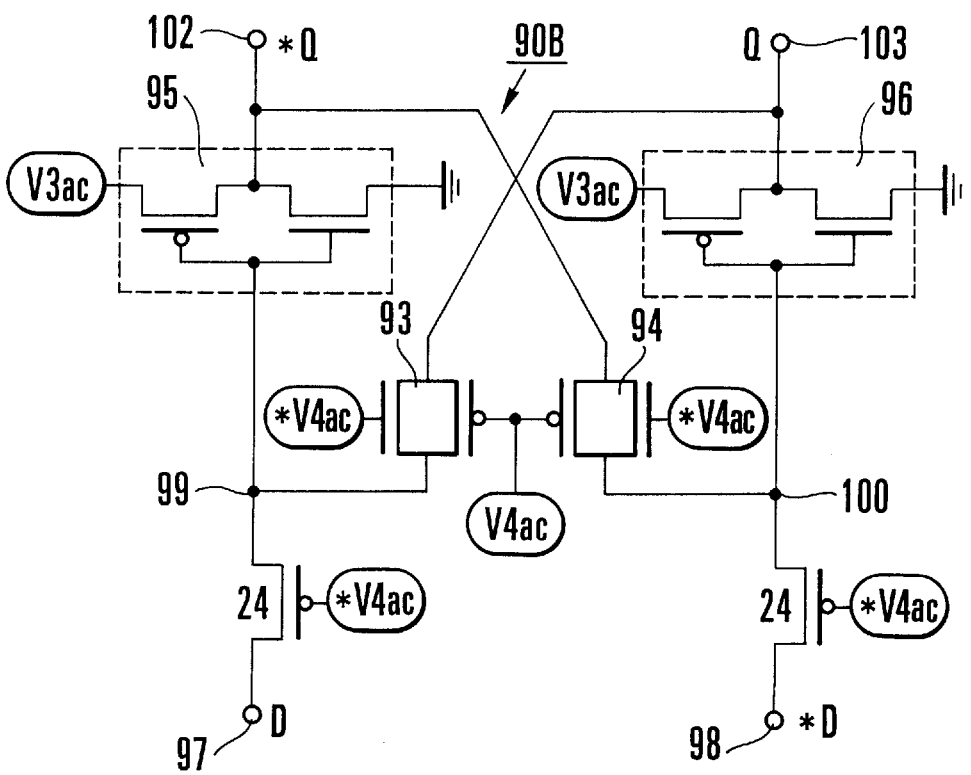

FIG. 52A shows a D latch logic circuit 90A according to the 24th embodiment of the present invention, in which the transmission gates 91 and 92 of the D latch logic circuit 90 in FIG. 44A are replaced with n-channel MOSFETs 8. In this case, a noninverted voltage V4ac is applied to the gate of each n-channel MOSFET 8. Note that the transmission gates 91 and 92 may be replaced with p-channel MOSFETs 24 as in a D latch logic circuit 90B in FIG. 52B. In this case, an inverted voltage *V4ac of the voltage V4ac is applied to the gate of each p-channel MOSFET 24.

By using a single MOSFET as a transmission gate in this manner, the number of transistors can be decreased.

[25th Embodiment]

FIGS. 53A to 53C show a logic circuit according to the 25th embodiment. In a 2-bit adder 140 in FIG. 53C, a circuit portion for outputting a sum S1 and its inverted signal *S1 upon reception of two data bits A1 and A0, two data bits B1 and B0, and one carry bit C0 is constituted by a PMOS latch logic circuit 140A and a BDD logic circuit 140B, as shown in FIG. 53B.

Two p-channel MOSFETs 24 are used for the PMOS latch logic circuit 140A, but no transmission gate and inverter are used. A voltage V3ac is connected to the source of the PMOS latch logic circuit 140A. The BDD logic circuit 140B is obtained by implementing the BDD graph shown in FIG. 53A using a plurality of n-channel MOSFETs 8. The output signal S7 and the inverted signal *S1 thereof output from the BDD logic circuit 140B and appearing at nodes 141 and 142 are held in the PMOS latch logic circuit 140A and transferred to the next stage (not shown). The beginning point of the BDD logic circuit 140B is grounded.

In this embodiment, after the input signals A1, A0, B1, B0, and C0 are input, the voltage V3ac of the power supply rises, thereby performing logic processing. Thereafter, the voltage V3ac falls, and the input signals A1, A0, B1, B0, and C0 fall. When voltage V3ac=0, the High-side potentials of the output nodes 141 and 142 of the PMOS latch logic circuit 140A have dropped to a threshold voltage Vth of each p-channel MOSFET. When the voltage V3ac rises to a supply voltage VDD, adiabatic charging is performed. When the voltage V3ac drops to 0 V afterward, charge recycling is performed. This allows a reduction in power consumption.

By combining the PMOS latch logic circuit and the BDD logic circuit, therefore, "High" of the output signal S1 and the inverted signal *S1 can be set to the peak value of V3ac, and "Low" of these signals can be set to 0 V, thus setting the voltage values of the signals to the proper values. In addition, the use of a BDD logic circuit allows a decrease in the number of transistors and efficient circuit integration. Furthermore, even a large-scale BDD logic circuit can be easily designed and formed by computer-aided designing.

Obviously, in addition to the above gate input/supply voltage control method, control based on a four-phase clock scheme can be performed (reference 3: Y. Moon and D. K. Jeong "An Efficient Change Recovery Logic Circuit" IEEE Journal of Solid-state circuits, Vol. 31, NO. 4 April 1996).

[26th Embodiment]

Figure 54A:
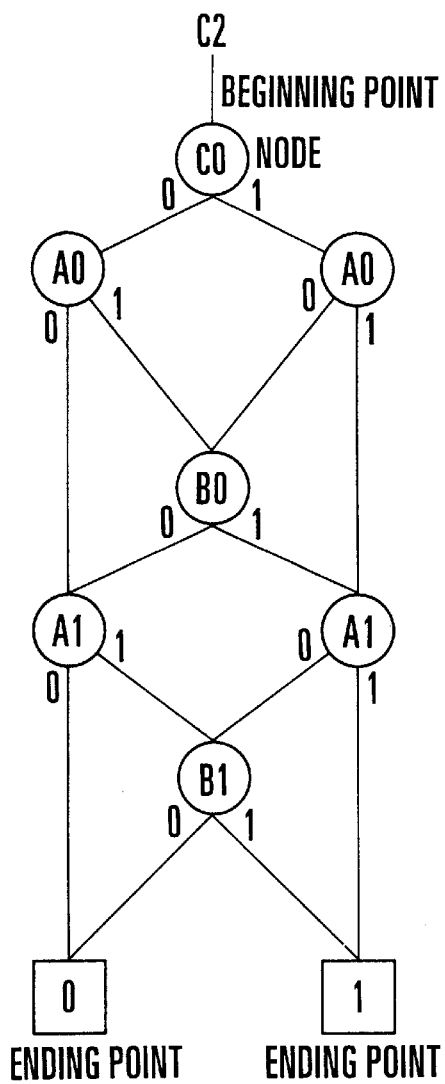
FIGS. 54A to 54C are circuit diagrams showing a PMOS latch logic circuit according to the 26th embodiment.
Figure 54C:
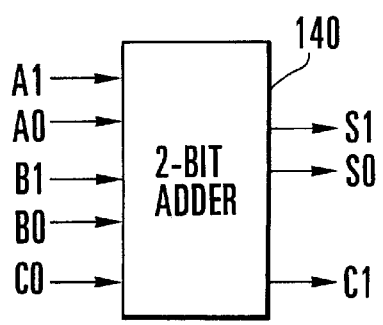
Figure 54B:
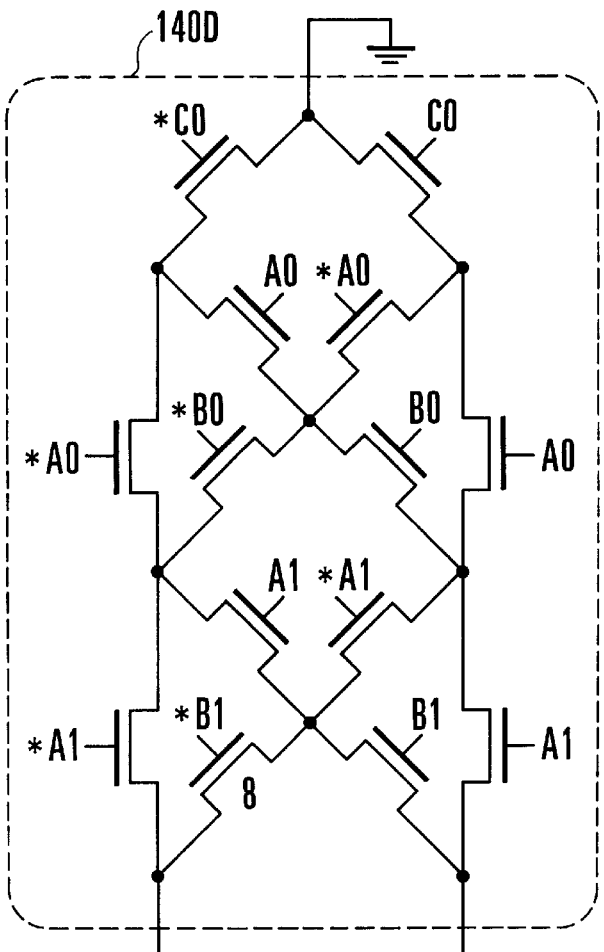

FIGS. 54A to 54C show a logic circuit according to the 26th embodiment. In a 2-bit adder 140 (identical to the circuit in FIG. 53C) in FIG. 54C, a circuit portion for outputting a carry C2 and its inverted signal upon reception of two data bits A1 and A0, two data bits B1 and B0, and one carry bit C0 is constituted by a PMOS latch logic circuit 140C and a BDD logic circuit 140D, as shown in FIG. 54B.

Similar to the PMOS latch logic circuit 140A, the PMOS latch logic circuit 140C uses two p-channel MOSFETs 24. A voltage V3ac is connected to the source of the PMOS latch logic circuit 140C. The BDD logic circuit 140D is obtained by implementing the BDD graph shown in FIG. 54A using a plurality of n-channel MOSFETs 8. The output signal C2 and an inverted signal *C2 thereof output from the BDD logic circuit 140D and appearing at nodes 143 and 144 are latched by the PMOS latch logic circuit 140C and transferred to the next stage (not shown).

The operation of this embodiment is almost the same as that of the circuit shown in FIG. 53B. When voltage V3ac=0, the High-side potentials of the output nodes 143 and 144 have dropped to a threshold voltage Vth of each p-channel MOSFET. When the voltage V3ac rises to VDD, adiabatic charging is performed. When the voltage V3ac drops to 0 V afterward, charge recycling is performed. This allows a reduction in power consumption.

[27th Embodiment]

FIG. 55 shows a logic circuit according to the 27th embodiment. This logic circuit is a flip-flop circuit constituted by an NMOS BDD logic circuit 140B or 140D and inverters 140G1 and 140G2.

Figure 56A:
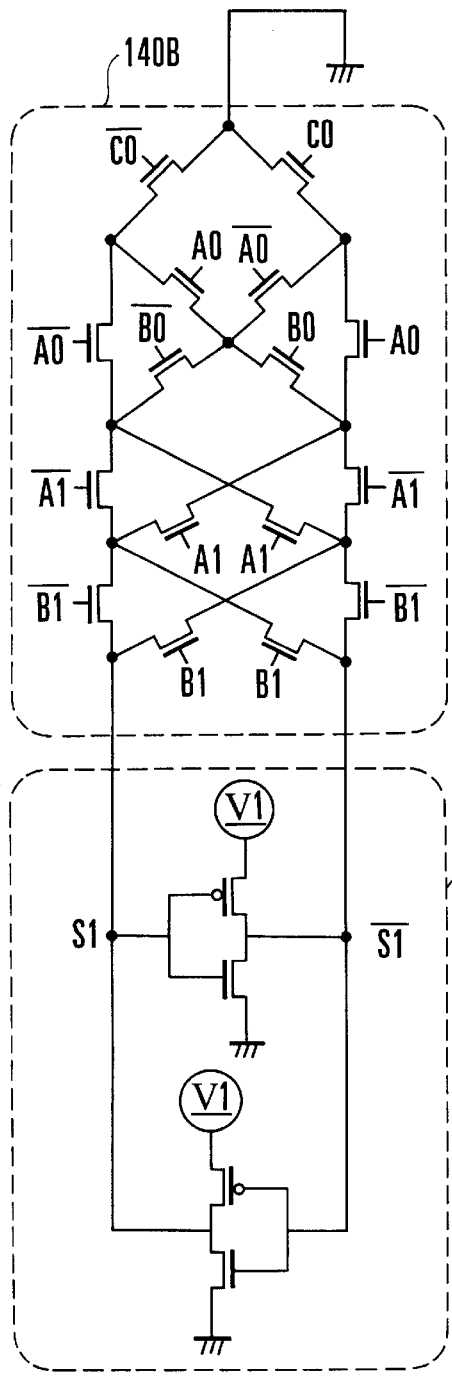
FIGS. 56A an 56B are circuit diagrams each showing a logic circuit according to the 27th embodiment.
Figure 56B:
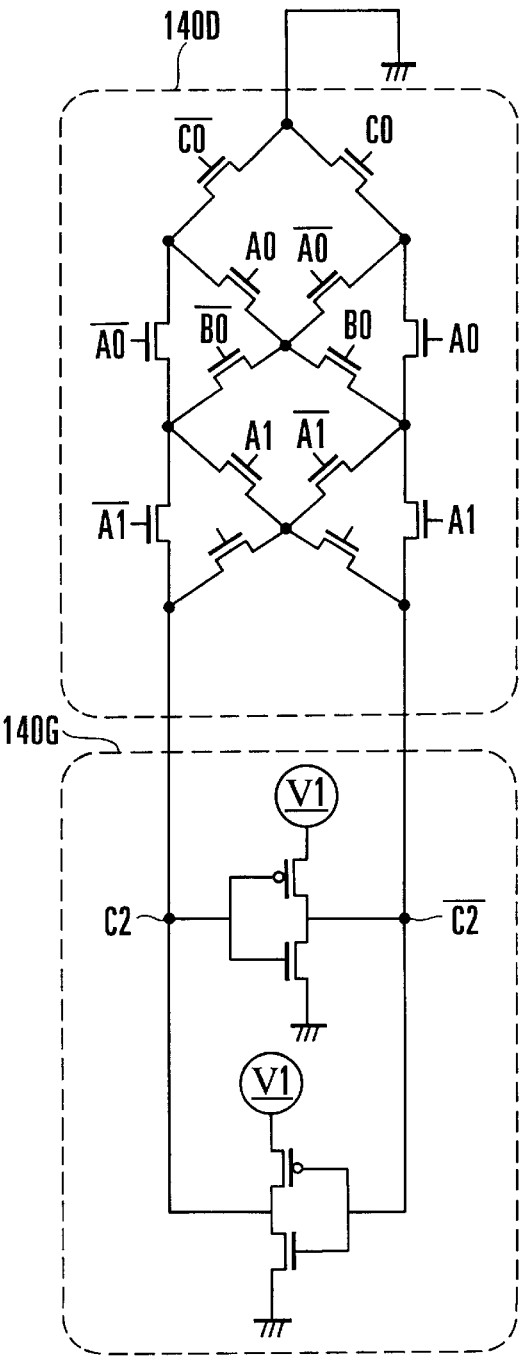

FIGS. 56A and 56B show examples of how a flip-flop circuit 140G constituted by the inverters 140G1 and 140G2 and the NMOS BDD logic circuit 140B or 140D are connected to each other.

[28th Embodiment]

Figure 57A:
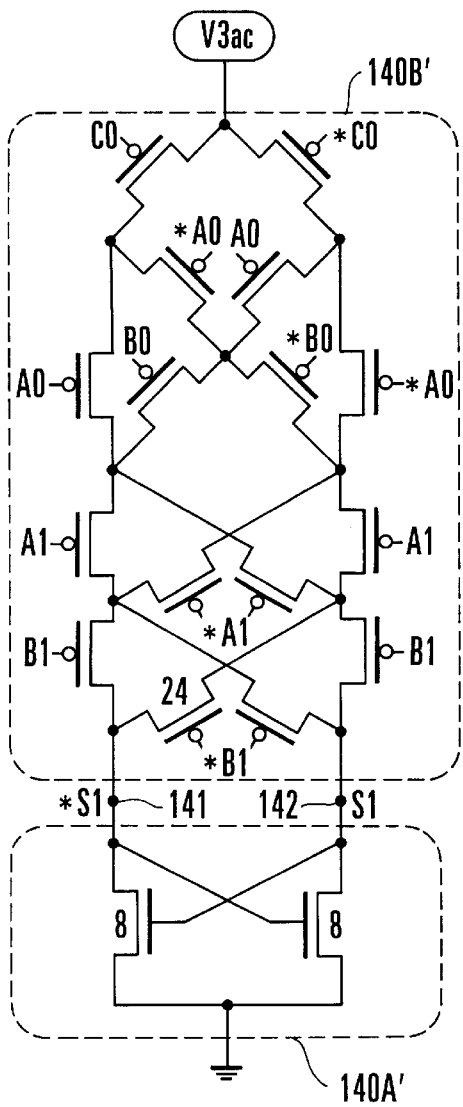
FIGS. 57A and 57B are circuit diagrams NMOS latch logic circuits according to the 28th and 29th embodiments.

FIG. 57A shows a logic circuit according to the 28th embodiment, which is a modification of the logic circuit in FIG. 53B. In this modification, an NMOS latch logic circuit 140A' is constituted by n-channel MOSFETs 8 with their sources being grounded, and a BDD logic circuit 140B' is constituted by p-channel MOSFETs 24 alone with a voltage V3ac being connected to the beginning point of the BDD logic circuit 140B'.

In this case, the logic processing results obtained by the BDD logic circuit 140B' appear at nodes 141 and 142 when the voltage V3ac rises. The results are then latched by the NMOS latch logic circuit 140A'. That is, adiabatic charging and charge recycling are also performed in this logic circuit.

[29th Embodiment]

Figure 57B:
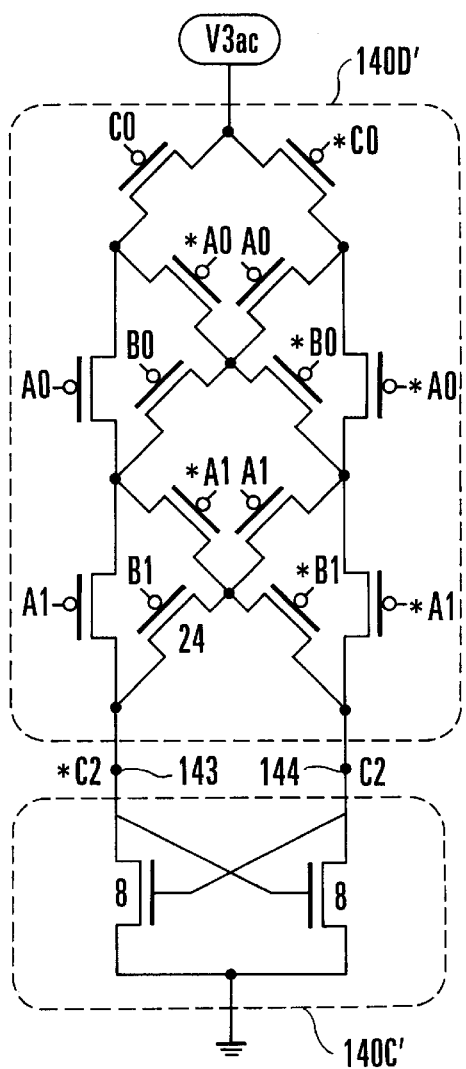

FIG. 57B shows a logic circuit according to the 29th embodiment, which is a modification of the circuit in FIG. 54B. In this modification, an NMOS latch logic circuit 140C' is constituted by n-channel MOSFETs 8 with their sources being grounded, and a BDD logic circuit 140D' is constituted by p-channel MOSFETs 24 alone with a voltage V3ac being connected to the beginning point of the BDD logic circuit 140D'.

In this case as well, when the voltage V3ac rises, the logic processing results obtained by the BDD logic circuit 140D' appear at nodes 143 and 144, thus performing adiabatic charging and charge recycling.

[30th Embodiment]

Figure 58A:
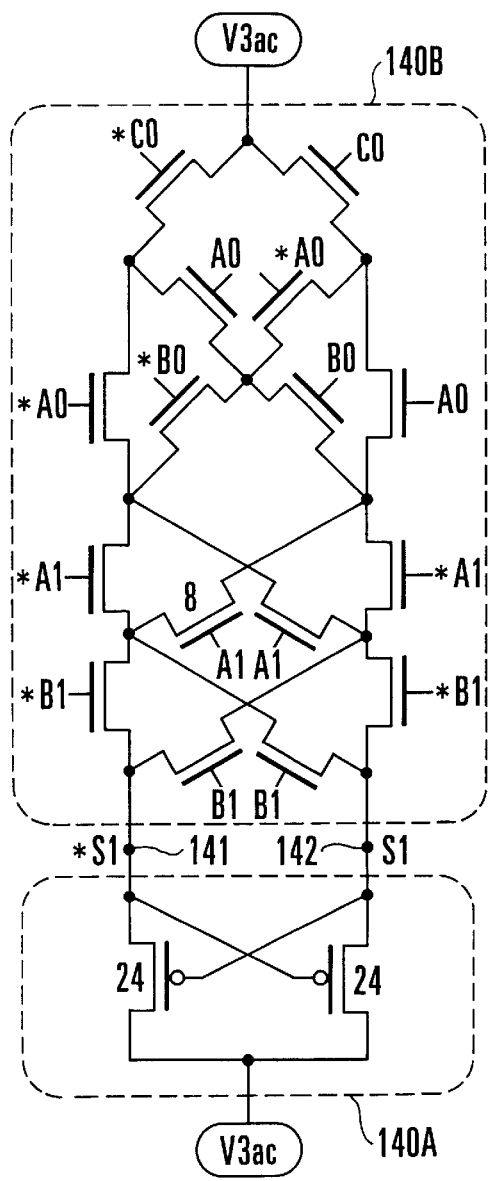
FIGS. 58A and 58B are circuit diagrams PMOS latch logic circuits according to the 30th and 31st embodiments.

FIG. 58A shows a logic circuit according to the 30th embodiment, which is a modification of the circuit in FIG. 53B. In this modification, a voltage V3ac is connected to the source of each p-channel MOSFET 24 of a PMOS latch logic circuit 140A, and the same voltage V3ac is also connected to the beginning point of a BDD logic circuit 140B.

In this case, one of nodes 141 and 142 at which a Low-level signal appears is set in a floating state, but has a potential close to the ground potential instead of a high impedance. This was confirmed by a simulation. On the side where a High-level signal appears, adiabatic charging and charge recycling are performed.

[31st Embodiment]

Figure 58B:
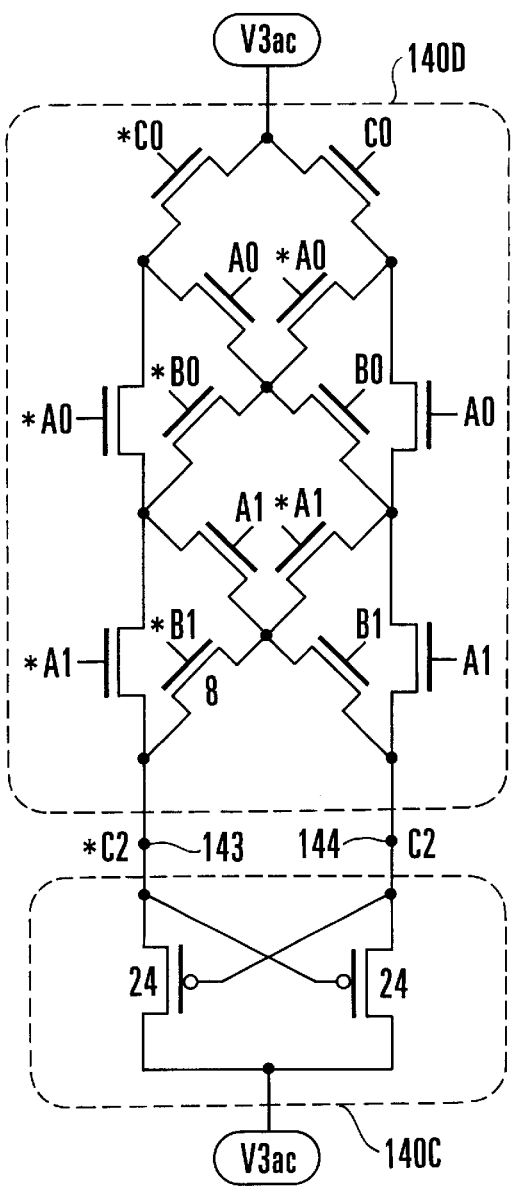

FIG. 58B shows a logic circuit according to the 31st embodiment, which is a modification of the circuit in FIG. 54B. In this modification, a voltage V3ac is connected to the source of each p-channel MOSFET 24 of a PMOS latch logic circuit 140C, and the same voltage V3ac is also connected to the beginning point of a BDD logic circuit 140D.

In this case as well, one of nodes 143 and 144 at which a Low-level signal appears is set in a floating state, but has a potential close to the ground potential instead of a high impedance. This was confirmed by a simulation. On the side where a High-level signal appears, adiabatic charging and charge recycling are performed.

[32nd Embodiment]

Figures 59A, 59B:
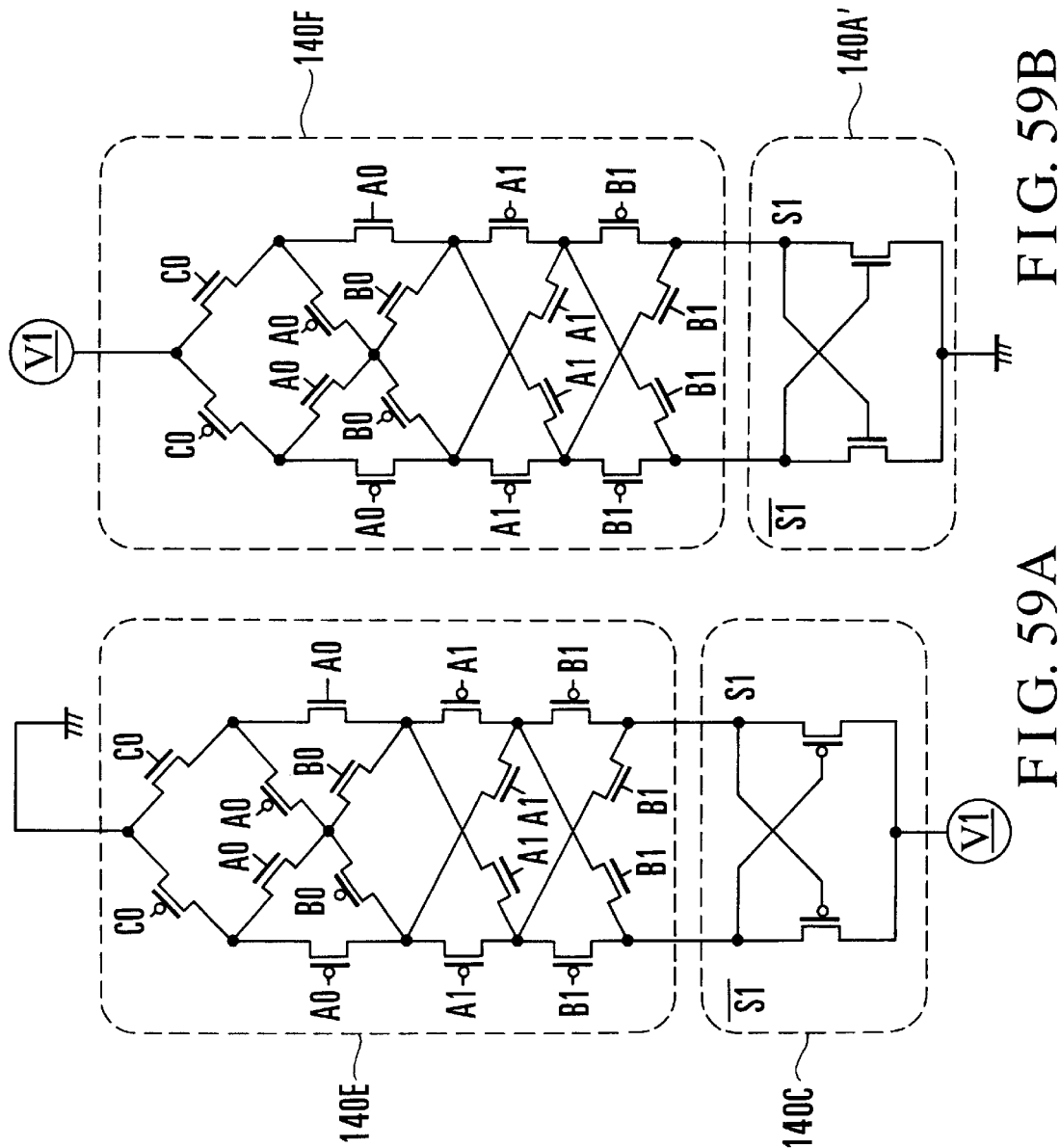
FIGS. 59A and 59B are circuit diagrams each showing a circuit according to the 32nd embodiment.

FIGS. 59A and 59B show logic circuits according to the 32nd embodiment, in which each of BDD logic circuits 140E and 140F connected to a PMOS latch logic circuit 140C and an NMOS latch logic circuit 140A' is made up of a mixture of n-channel MOSFETs and p-channel MOSFETs. With this arrangement, an inverter connected to each input gate can be omitted.

Note that TFTs that are very suitable for adiabatic charging as described with reference to FIG. 25 can be used as the elements of the logic circuits of the 20th to 32nd embodiments.

[33rd Embodiment]

In a conventional CMOS logic circuit, to prevent disconnection of wires due to electromigration, the current density is set to a given upper limit value $J_0$ or less. In general, a life $\tau$ of a wire influenced by electromigration can be represented as:

$$\tau = KST/\{J^2 D \exp(-\Delta E/kT)\} \quad (1)$$

where K is the proportional constant, S is the cross-sectional area of the wire, T is the absolute temperature, J is the current density, D is the diffusion coefficient of an aluminum atom, and k is the Boltzmann's constant (reference 4: "CMOS ULSI Design", supervised by Sadao Sugano, edited by Tetsuya Iizuka, published by Baihuukan, 1996, pp. 87–88).

Obviously, as the wire width decreases and the current density J increases, the time $\tau$ that elapses before disconnection shortens. In a CMOS logic circuit, therefore, the cross-sectional area of a wire has its lower limit value. In other words, the current density has its upper limit value.

In an actual CMOS logic LSI, for example, when the supply voltage is set to 2 V, a current of about 8 mA flows in a signal line, and the current density is about $2.7 \times 10^6$ A/cm². In this case, the cross-sectional area of the signal line is about $(0.55\ \mu m)^2 = 0.30\ \mu m^2$ (see FIGS. 60B and 67).

In a BDD logic circuit, a D latch logic circuit, or the like using the above adiabatic charging logic, since charging/discharging is performed adiabatically, the density of current flowing in a metal wire or transistor is very low. The electromigration effect on each wire is therefore small. This allows the cross-sectional area of a wire to be smaller than the above value, $(0.55\ \mu m)^2 = 0.30\ \mu m^2$, in the conventional CMOS logic LSI.

According to the 33rd embodiment, therefore, in a logic circuit based on adiabatic charging logic, reductions in wire cross-sectional area and power consumption are achieved while the life of each wire influenced by electromigration is set to be substantially equal to that in the conventional CMOS logic circuit.

Since the current I is represented as I=SJ in equation (1) above, $$\tau = KTS^3/\{I^2 D \exp(-\Delta E/kT)\} \quad (2)$$

As is obvious from this equation, the life of each wire influenced by electromigration is proportional to $S^3/I^2$.

Letting $\tau_0$, $S_0$, and $I_0$ be the average life of wires, the wire cross-sectional area, and the current flowing in each wire, respectively, in a CMOS logic circuit, the relationship between these values is represented by $$\tau_0 = aS_0^3/I_0^2 \quad (3)$$

where a is a proportional constant.

Letting $\tau$, S, and I be the average life of wires, the wire cross-sectional area, and the current flowing in each wire, respectively, in a logic circuit that performs adiabatic charging, the relationship between these values is represented by T $\tau = aS^3/I^2 + tm$ (4)

Therefore, $$\tau/\tau_0 = (S/S_0)^3 (I_0/I) \quad (5)$$

If the lives of wires in the two circuits are equal, i.e., $\tau_0 = \tau$, $$S = S_0 (I/I_0)^{2/3} \quad (6)$$

In the case of adiabatic charging, since the circuit operates slowly, the current value can be decreased up to, for example, 1/1000 that in the CMOS logic circuit. If, therefore, the cross-sectional area is decreased to 1/100 when the current value becomes 1/1000 that in the CMOS logic circuit, the lives of wires in the two circuits are equal.

Figure 60A:
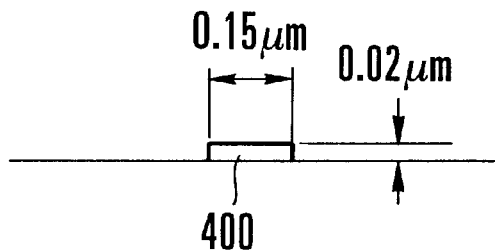
FIGS. 60A to 60C are views for explaining the 33rd embodiment.
Figure 60B:
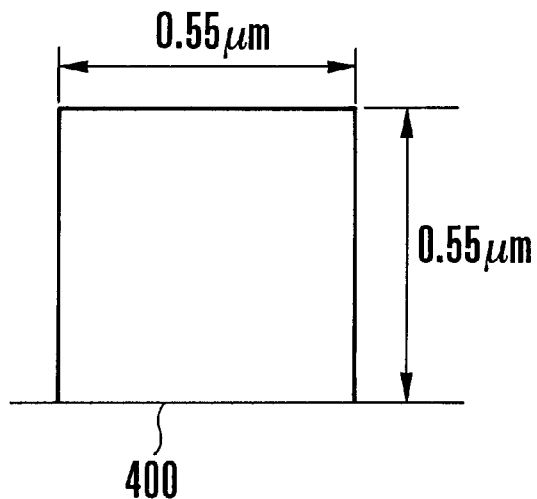

For example, as shown in FIG. 60A, therefore, an ultra-thin wire having a width of 0.15 $\mu$m and a thickness of 0.02 $\mu$m (cross-sectional area: 0.0030 $\mu m^2$) can be used. Even a wire with a thickness of 0.2 $\mu$m (cross-sectional area=0.030 $\mu m^2$) has a cross-sectional area 1/10 that (0.30 $\mu m^2$) of a general wire, and hence a sufficient effect can be expected.

Figure 60C:
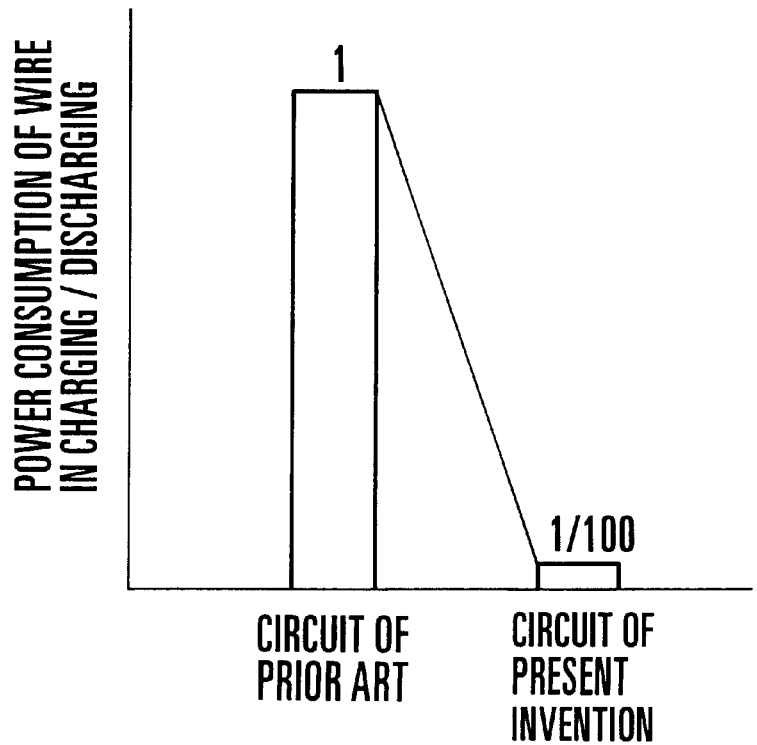

As is obvious from the above description, the wire capacitance can be reduced to 1/10 to 1/100. As shown in FIG. 60C, the power consumption in charging can be reduced to 1/10 to 1/100.

Furthermore, since no large current driving ability is required in each transistor as well as each wire, the transistor width (channel width) can be reduced to about 0.1 $\mu$m, which is about 1/100 the transistor width (about 10 $\mu$m) in the conventional circuit. This allows a reduction in the capacitance of each transistor.

[34th Embodiment]

When electrical signals are to be transferred on the basis of adiabatic charging logic, a reduction in wire cross-sectional area can be attained because the transfer operation can be performed moderately and slowly. This operation will be described next.

Assume that a cross-sectional area A of a wire is decreased to 1/k times. In this case, a resistance R increases k times. In general, the capacitance of the wire is sufficiently smaller than that of the load of a gate on the next stage. A capacitance C can therefore be regarded as constant. Consequently, the following equation can be approximately formulated:

$$A \times CR = \text{constant} \qquad (7)$$

Letting $S_0$ be the cross-sectional area of a wire in a CMOS logic circuit, and S be the cross-sectional area of a wire in an adiabatic charging logic circuit, the following equation is formulated:

$$S_0(CR)_{CMOS} = S(CR)_{adiabatic} \qquad (8)$$

In adiabatic charging, electrical signals can be transferred slowly, and hence $10 \times (CR)_{cmos} \leq (CR)_{adiabatic}$ can be set. Therefore, $$S = S_0(CR)_{CMOS}/(CR)adiabatic \leq 1/10 \times S_0 \qquad (9)$$

In addition, since a time T required to rise the power supply for the adiabatic charging circuit must be larger than the CR time constant of the adiabatic charging circuit, $$(CR)_{adiabatic} \leq T \qquad (10)$$

Therefore, $$S_0(CR)_{CMOS} = S(CR)_{adiabatic} \leq ST \qquad (11)$$

If $(CR)_{CMOS} = \tau$, then $$\tau/T \times S_0 \leq S \qquad (12)$$

From mathematical expressions (9) and (12), $$\tau/T \times S_0 \leq S \leq 1/10 \times S_0 \qquad (13)$$

Assume that the cross-sectional area of a wire 400 formed in the CMOS logic circuit shown in FIG. 67 and having a signal wire width $W_0$ of 550 nm (0.55 μm) and a signal wire thickness $H_o$ of 550 nm (0.55 μm) is to be decreased. In this case, if $\tau/T$ is set to 1/100, a cross-sectional S falls within the range of 0.003 μm² ≤ S ≤ 0.03 μm².

As is obvious from the above description, an ultra-thin wire like the one shown in FIG. 60A can be used.

[35th Embodiment]

Figure 61A:
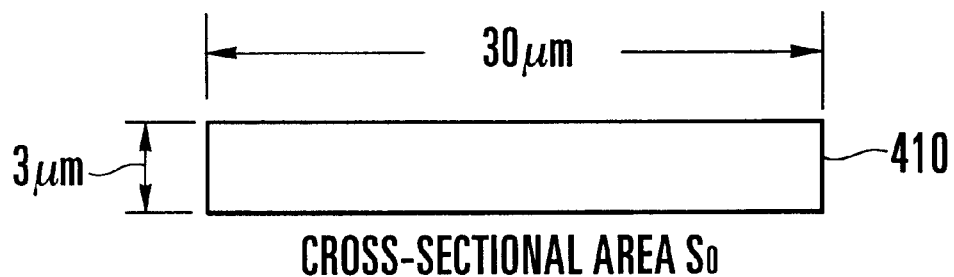
FIGS. 61A to 61C are views for explaining the 34th embodiment.
Figure 61B:
Figure 61C:

FIGS. 61A to 61C explain the 35th embodiment of the present invention. The cross-sectional area of each signal wire in the CMOS logic circuit shown in FIG. 67 can be reduced to 1/10 to 1/100, as described above. The cross-sectional areas of power and ground lines in this logic circuit can also be reduced.

More specifically, a cross-sectional area $S_0$ of a power or ground line 410 in FIG. 61A which is formed in a logic circuit and has a width of 30 μm and a thickness of 3 μm can be reduced to 1/10, i.e., (1/10×$S_0$), according to the adiabatic charging logic, as shown in FIG. 61B. In addition, as shown in FIG. 61C, the cross-sectional area $S_0$ can be reduced to 1/100, i.e., (1/100×$S_0$)

According to the adiabatic charging logic, therefore, the cross-sectional areas of the power and ground lines in the logic circuit, as well as the signal lines, can be reduced to 1/10 to 1/100.

Obviously, in the 33rd to 35th embodiments, the cross-sectional areas of the signal, power, and ground lines can be reduced up to 1/100 by performing adiabatic charging more slowly.

As described above, according to the adiabatic charging logic, the cross-sectional area of each wire can be reduced, and efficient logic processing can be realized by transfer of a small number of electrons. This can greatly reduce the energy per logic operation as compared with the conventional CMOS logic circuit.

As has been described above, according to the present invention, in a BDD logic circuit, a D latch logic circuit, or the like having several hundred or several thousand gates, adiabatic charging and charge recycling can be realized very easily. This can attain reductions in power consumption and circuit size as compared with the conventional CMOS logic circuit and D latch logic circuit.

In addition, according to the present invention, since charging/discharging is performed adiabatically, the density of a current flowing in each metal wire and each transistor is very low. For this reason, the electromigration effect on each wire is small, and the cross-sectional area of each wire can be greatly decreased as compared with the cross-sectional area of each wire in a CMOS logic circuit. This allows a reduction in wire capacitance.

As described above, according to the present invention, efficient logic processing can be realized by transfer of a smaller number of electrons, and hence the energy per logic operation can be greatly reduced as compared with the conventional CMOS logic circuit.

What is claimed is:

1. An adiabatic charging logic circuit comprising:
 a logic circuit constituted by a plurality of logical elements; and
 a power supply section for supplying power to said logic circuit to cause said logic circuit to perform logic processing after an input signal is supplied to a gate of each of the logic elements, and stopping supply of the power before a new input signal is supplied to the gate of each of the logic elements after completion of the logic processing,
 wherein said power supply section supplies AC power obtained from an inductor for inducing a radio electromagnetic wave as power to said logic circuit.

2. An adiabatic charging logic circuit comprising:
 a logic circuit constituted by a plurality of logical elements; and
 a power supply section for supplying power to said logic circuit to cause said logic circuit to perform logic processing after an input signal is supplied to a gate of each of the logic elements, and stopping supply of the power before a new input signal is supplied to the gate of each of the logic elements after completion of the logic processing,
 wherein said logic circuit is a BDD logic circuit formed on the basis of a binary decision diagram having beginning points, ending points, nodes arranged between the beginning points and the ending points, and branches arranged at the nodes and connecting the nodes, the plurality of logic elements are arranged in correspondence with the branches of the binary decision diagram, and said power supply section is connected to a portion corresponding to one of the beginning and ending points of the binary decision diagram.

3. A circuit according to claim 2, wherein said BDD logic circuit is a BDD logic circuit in which a portion corresponding to one ending point of the binary decision diagram is grounded, said power supply section is connected to a portion corresponding to the other ending point of the binary decision diagram, and output signals are extracted from portions corresponding to the beginning points of the binary decision diagram when a supply voltage is applied from said power supply section after an input signal is supplied to the gate of each of the logic elements.

4. A circuit according to claim 3, wherein the binary decision diagram has not single but plural beginning points by combining a plurality of different binary decision diagrams.

5. A circuit according to claim 2, wherein said BDD logic circuit is a BDD logic circuit in which said power supply section is connected to the beginning point of the binary decision diagram, and an output signal and an inverted output signal are respectively extracted from portions corresponding to one ending point and the other ending point of the binary decision diagram when a supply voltage is applied from said power supply section after an input signal is supplied to the gate of each of the logic elements.

6. A circuit according to claim 2, wherein said circuit further comprises a plurality of BDD logic circuits, and said power supply section applies a first voltage having a high frequency to a BDD logic circuit, of said plurality of BDD logic circuits, which performs logic processing at a high speed, a second voltage having a low frequency to a BDD logic circuit which performs logic processing at a low speed, and third voltages having the same frequency and the same phase to BDD logic circuits which perform logic processing in phase at the same speed.

7. A circuit according to claim 2, wherein the plurality of logic elements comprise complementary logic elements, and one of noninverted and inverted signals of the input signal is supplied to a gate of each of the logic elements.

8. A circuit according to claim 2, wherein the logic element comprises two complementary logic elements connected in parallel with each other, and eliminates a change in output voltage based on a threshold voltage.

9. A circuit according to claim 2, wherein one of a power supply of said power supply section and a power supply that rises earlier and falls later than the power supply of said power supply section is used as a power supply for an input signal to be applied to the gate of the logic element, thereby adiabatically charging the gate.

10. An adiabatic charging logic circuit comprising:
 a logic circuit constituted by a plurality of logical elements; and
 a power supply section for supplying power to said logic circuit to cause said logic circuit to perform logic processing after an input signal is supplied to a gate of each of the logic elements, and stopping supply of the power before a new input signal is supplied to the gate of each of the logic elements after completion of the logic processing,
 wherein said logic circuit is a D latch logic circuit including a signal receiving circuit constituted by a first transmission gate pair, and a storage circuit having a first inverter pair for inverting output signals from the first transmission gate pair and a second transmission gate pair which are turned on to input the output signals from the first inverter pair to the inverters on opposite sides when the first transmission gate pair are turned off, uses a first voltage that moderately rises and falls as a supply voltage from said power supply section to the first inverter pair, and uses a second voltage, which rises after the first voltage falls and falls before the first voltage rises, and an inverted voltage thereof as gate voltages to be applied to the first and second transmission gate pairs.

11. A circuit according to claim 10, wherein a second inverter pair are connected to output sides of the first inverter pair, and a supply voltage to the second inverter pair is a third voltage that rises later and falls earlier than the first voltage.

12. A circuit according to claim 10, wherein the first transmission gate pair are a transmission gate pair comprising one of a p-channel MOSFET and an n-channel MOSFET.

13. A circuit according to claim 10, wherein said logic circuit is a BDD logic circuit formed on the basis of a binary decision diagram having beginning points, ending points, nodes arranged between the beginning points and the ending points, and branches arranged at the nodes and connecting the nodes, the plurality of logic elements are arranged in correspondence with the branches of the binary decision diagram, and said power supply section is connected to a portion corresponding to one of the beginning and ending points of the binary decision diagram, and
 input sides of the first transmission gate pair are connected to output sides of said two BDD logic circuits, and a supply voltage applied to each BDD logic circuit is a fourth voltage whose waveform rises later and falls earlier than a waveform of the first voltage.

14. A circuit according to claim 13, wherein output signals from said D latch logic circuit are used as input signals to said two BDD logic circuits.

15. An adiabatic charging logic circuit comprising:
 a logic circuit constituted by a plurality of logical elements; and
 a power supply section for supplying power to said logic circuit to cause said logic circuit to perform logic processing after an input signal is supplied to a gate of each of the logic elements, and stopping supply of the power before a new input signal is supplied to the gate of each of the logic elements after completion of the logic processing,
 wherein said logic circuit comprises: a BDD logic circuit formed on the basis of a binary decision diagram having beginning points, ending points, nodes arranged between the beginning points and the ending points, and branches arranged at the nodes and connecting the nodes, the plurality of logic elements being arranged in correspondence with the branches of the binary decision diagram, and said BDD logic circuit having a portion corresponding to the beginning point of the binary decision diagram and grounded; and one of a flip-flop circuit and a PMOS latch logic circuit, each having an output and a gate connected to each other, the gate being connected to an output of said BDD logic circuit, and said power supply section having a power supply connected thereto.

16. An adiabatic charging logic circuit comprising:
 a logic circuit constituted by a plurality of logical elements; and
 a power supply section for supplying power to said logic circuit to cause said logic circuit to perform logic processing after an input signal is supplied to a gate of each of the logic elements, and stopping supply of the power before a new input signal is supplied to the gate of each of the logic elements after completion of the logic processing, wherein said logic circuit comprises: a BDD logic circuit formed on the basis of a binary decision diagram having beginning points, ending points, nodes arranged between the beginning points and the ending points, and branches arranged at the nodes and connecting the nodes, the plurality of logic elements being arranged in correspondence with the branches of the binary decision diagram, and said BDD logic circuit having a portion corresponding to the beginning point of the binary decision diagram and connected to said power supply section; and an NMOS latch circuit having an output and a gate connected to each other, the gate being connected to an output of said BDD logic circuit, and said NMOS latch circuit having a source grounded.

17. An adiabatic charging logic circuit comprising:

a logic circuit constituted by a plurality of logical elements; and a power supply section for supplying power to said logic circuit to cause said logic circuit to perform logic processing after an input signal is supplied to a gate of each of the logic elements, and stopping supply of the power before a new input signal is supplied to the gate of each of the logic elements after completion of the logic processing, wherein said logic circuit comprises: a BDD logic circuit formed on the basis of a binary decision diagram having beginning points, ending points, nodes arranged between the beginning points and the ending points, and branches arranged at the nodes and connecting the nodes, the plurality of logic elements being arranged in correspondence with the branches of the binary decision diagram, and said BDD logic circuit having a portion corresponding to the beginning point of the binary decision diagram and connected to said power supply section; and a PMOS latch logic circuit having an output and a gate connected to each other, the gate being connected to an output of said BDD logic circuit, and said power supply section having a power supply connected thereto.

18. An adiabatic charging logic circuit comprising:

a logic circuit constituted by a plurality of logical elements; and a power supply section for supplying power to said logic circuit to cause said logic circuit to perform logic processing after an input signal is supplied to a gate of each of the logic elements, and stopping supply of the power before a new input signal is supplied to the gate of each of the logic elements after completion of the logic processing, wherein said power supply section is a charge no recycle generator.

19. An adiabatic charging logic circuit comprising:

a logic circuit constituted by a plurality of logical elements, wherein a cross-sectional area S of a signal wire of said logic circuit, which is equal to a cross-sectional area $S_0$ of a wire in a CMOS logic circuit, is represented by $$(I/I_0)^{2/3} \times S_0 \leq S \leq 1/10 \times S_0$$

where $I_0$ is an upper limit value of a wire current which is obtained from the cross-sectional area of the wire in said logic circuit on the basis of a life influenced by electromigration, and I is a value of a current flowing in said logic circuit during adiabatic charging logic operation.

20. A circuit according to claim 19, further comprising:

a power supply section for supplying power to said logic circuit to cause said logic circuit to perform logic processing after an input signal is supplied to a gate of each of the logic elements, and stopping supply of the power before a new input signal is supplied to the gate of each of the logic elements after completion of the logic processing.

21. A circuit according to claim 19, wherein when the cross-sectional area $S_0$ of the signal wire is 0.3 $\mu m^2$, the cross-sectional area S falls within a range of 0.003 $\mu m^2$ to 0.03 $\mu m^2$.

22. A circuit according to claim 19, wherein cross-sectional areas of power and ground lines of said logic circuit are decreased.

23. An adiabatic charging logic circuit comprising:

a logic circuit constituted by a plurality of logical elements, wherein a cross-sectional area S of a signal wire of said logic circuit, which is equal to a cross-sectional area $S_0$ of a wire in a CMOS logic circuit, is represented by $$\tau/T \times S_0 \leq S \leq 1/10 \times S_0$$

where $\tau$ is a CR time constant of the signal wire in said logic circuit, and T is a time required for a supply voltage to reach a peak value after power is supplied to said logic circuit by adiabatic charging logic.

24. A circuit according to claim 23, wherein when the cross-sectional area $S_0$ of the signal wire is 0.3 $\mu m^2$, the cross-sectional area S falls within a range of 0.003 $\mu m^2$ to 0.03 $\mu m^2$.

25. A circuit according to claim 23, wherein cross-sectional areas of power and ground lines of said logic circuit are decreased.

26. A circuit according to claim 25, wherein the cross-sectional areas of the power and ground lines of said logic circuit are decreased to fall within a rage of 1/10 to 1/100.

27. A circuit according to claim 23, further comprising:

a power supply section for supplying power to said logic circuit to cause said logic circuit to perform logic processing after an input signal is supplied to a gate of each of the logic elements, and stopping supply of the power before a new input signal is supplied to the gate of each of the logic elements after completion of the logic processing.

\* \* \* \* \*

UNITED STATES PATENT AND TRADEMARK OFFICE
CERTIFICATE OF CORRECTION

PATENT NO. : 6,242,951 B1
APPLICATION NO. : 09/146079
DATED : June 5, 2001
INVENTOR(S) : Nakata et al.

It is certified that error appears in the above-identified patent and that said Letters Patent is hereby corrected as shown below:

On the Cover page, please insert Item -- (74) *Attorney, Agent or Firm* – Blakely Sokoloff Taylor and Zafman --.

In Column 3, line 59 please delete "form ed" and insert -- formed --.

Signed and Sealed this

Thirty-first Day of March, 2009

JOHN DOLL
*Acting Director of the United States Patent and Trademark Office*